(12) United States Patent
Mizutani et al.

(10) Patent No.: US 7,807,329 B2
(45) Date of Patent: Oct. 5, 2010

(54) PHOTOSENSITIVE COMPOSITION AND PATTERN-FORMING METHOD USING THE SAME

(75) Inventors: Kazuyoshi Mizutani, Shizuoka (JP); Yasutomo Kawanishi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 259 days.

(21) Appl. No.: 11/373,188

(22) Filed: Mar. 13, 2006

(65) Prior Publication Data
US 2006/0210919 A1 Sep. 21, 2006

(30) Foreign Application Priority Data
Mar. 16, 2005 (JP) ............. P. 2005-075494

(51) Int. Cl.
*G03F 7/029* (2006.01)
(52) U.S. Cl. ............ 430/270.1; 430/326; 430/922
(58) Field of Classification Search ........... 430/270.1, 430/913, 914, 922, 326, 325; 522/9, 15, 522/25, 31, 904; 526/256, 257; 540/491; 544/5; 548/100; 549/12, 26, 27, 3
See application file for complete search history.

(56) References Cited

U.S. PATENT DOCUMENTS

| | | | |
|---|---|---|---|
| 5,106,885 A * | 4/1992 | Liu et al. ............... 522/31 |
| 6,348,297 B1 * | 2/2002 | Uetani et al. ............ 430/270.1 |
| 6,479,211 B1 | 11/2002 | Sato et al. |
| 6,548,221 B2 | 4/2003 | Uetani et al. |
| 6,673,512 B1 | 1/2004 | Uenishi et al. |
| 7,541,131 B2 * | 6/2009 | Kawanishi ............... 430/270.1 |
| 2002/0061462 A1 * | 5/2002 | Uenishi .................... 430/270.1 |
| 2002/0147259 A1 * | 10/2002 | Namba et al. ............... 524/377 |
| 2003/0194641 A1 * | 10/2003 | Mizutani et al. .......... 430/270.1 |
| 2003/0198894 A1 | 10/2003 | Mizutani et al. |
| 2004/0197708 A1 * | 10/2004 | Kodama ..................... 430/311 |
| 2004/0242901 A1 * | 12/2004 | Norcini et al. ............... 549/3 |
| 2004/0265733 A1 | 12/2004 | Houlihan et al. |
| 2005/0053861 A1 | 3/2005 | Yoneda et al. |
| 2005/0070621 A1 * | 3/2005 | Kalgutkar ..................... 522/1 |
| 2005/0176969 A1 * | 8/2005 | Herlihy et al. ................ 549/3 |
| 2006/0194147 A1 * | 8/2006 | Kawanishi ............... 430/270.1 |

FOREIGN PATENT DOCUMENTS

| | | |
|---|---|---|
| JP | 2002-049151 A | 2/2002 |
| JP | 2002-049154 A | 2/2002 |
| JP | 2003-149800 A | 5/2003 |
| JP | 2004-004557 A | 1/2004 |
| JP | 2004-250427 A | 9/2004 |

OTHER PUBLICATIONS

European Search Report for EP 06 00 5324 dated Oct. 9, 2007.
Japanese Office Action issued in corresponding Japanese application No. 2005/075,494, issued Dec. 2, 2009.

* cited by examiner

*Primary Examiner*—Cynthia H Kelly
*Assistant Examiner*—Anca Eoff
(74) *Attorney, Agent, or Firm*—Sughrue Mion, PLLC

(57) ABSTRACT

A photosensitive composition comprises (A) a specific compound, which is excellent in sensitivity, resolution, and defocus latitude (DOF), and a pattern-forming method using the photosensitive composition is provided.

15 Claims, No Drawings

PHOTOSENSITIVE COMPOSITION AND PATTERN-FORMING METHOD USING THE SAME

BACKGROUND OF THE INVENTION

1. Field of the Invention

The present invention relates to a photosensitive composition capable of reacting to change the property thereof upon irradiation with an actinic ray or a radiation, and a pattern-forming method using the photosensitive composition. More specifically, the invention relates to a photosensitive composition for use in a manufacturing process of semiconductors, such as IC, manufacture of circuit substrates for liquid crystals, thermal heads and the like, other photo-fabrication processes, lithographic printing, acid-curable compositions, and also relates to a pattern-forming method using the photosensitive composition.

2. Background Art

Chemical amplification resist compositions are pattern-forming materials capable of generating an acid at an exposed area irradiated with radiation such as far ultraviolet rays, changing the solubility in a developing solution between the irradiated area with the actinic radiation and the non-irradiated area by reaction with the acid as a catalyst, and forming a pattern on a substrate.

In a case where a KrF excimer laser is used as an exposure light source, since resins having poly(hydroxystyrene) small in absorption in the region of 248 nm as a fundamental skeleton are mainly used, a good pattern having high sensitivity and high resolution can be formed as compared with the conventional naphthoquinonediazide/novolak resins.

On the other hand, when a light source of a shorter wavelength, e.g., an ArF excimer laser (193 nm), is used as an exposure light source, even the chemical amplification series resists are not sufficient, since compounds containing an aromatic group substantially show large absorption in the region of 193 nm.

Therefore, resists containing a resin having an alicyclic hydrocarbon structure have been developed for an ArF excimer laser.

As acid generator that is the principal constituent of chemical amplification resist, triphenulsulfonium salts are generally known (e.g., refer to patent literature 1: U.S. Pat. No. 6,548,221).

However, the acid generator is still insufficient in various points, so that photosensitive compositions improved in sensitivity, resolution and defocus latitude (DOF) are desired. Defocus latitude is the latitude of deviation of focus at the time of exposure.

SUMMARY OF THE INVENTION

A first object of the invention is to provide a photosensitive composition excellent in sensitivity, resolution, and defocus latitude (DOF), and a second object is to provide a pattern-forming method using the photosensitive composition.

The invention comprises the following constitution, by which the above objects of the invention are achieved.

1. A photosensitive composition comprising (A) a compound represented by the following formula (I):

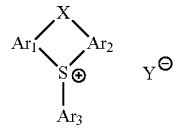

wherein $Ar_1$, $Ar_2$ and $Ar_3$ each independently represents an aromatic ring having from 6 to 20 carbon atoms, and at least one of $Ar_1$ to $Ar_3$ has a -Q-SO$_2$Ra group or a -Q-CORb group as a substituent; Ra and Rb each independently represents an alkyl group or an aryl group; Q represents an oxygen atom or —N(Ry)-; Ry represents a hydrogen atom, an alkyl group, or a cycloalkyl group; X represents a single bond or a divalent linking group; and Y represents a sulfonate anion, a carboxylate anion, a bis(alkylsulfonyl)-amide anion, or a tris(alkylsulfonyl) methide anion.

2. The photosensitive composition as described in the item 1, wherein $Ar_3$ in formula (I) represents an aromatic ring having from 6 to 20 carbon atom and at least one of a -Q-SO$_2$Ra group and a -Q-CORb group as a substituent.

3. The photosensitive composition as described in the item 1 or 2, which further comprises (B) a resin capable of decomposing by the action of an acid to increase the solubility in an alkali developer.

4. The photosensitive composition as described in the item 1 or 2, which further comprises (D) a resin soluble in an alkali developer, and (E) an acid crosslinking agent capable of crosslinking with the resin soluble in an alkali developer by the action of an acid.

5. The photosensitive composition as described in the item 3, wherein the resin (B) has a hydroxystyrene structural unit.

6. The photosensitive composition as described in the item 3, wherein the resin (B) contains a repeating unit having a monocyclic or polycyclic hydrocarbon structure.

7. The photosensitive composition as described in the item 3, wherein the resin (B) contains a repeating unit having an alcoholic hydroxyl group.

8. The photosensitive composition as described in the item 7, wherein the repeating unit having an alcoholic hydroxyl group is a repeating unit having at least one structure selected from the group consisting of a monohydroxy-adamantane structure, a dihydroxyadamantane structure, and a trihydroxyadamantane structure.

9. The photosensitive composition as described in the item 3, wherein the resin (B) contains a repeating unit having a lactone structure.

10. The photosensitive composition as described in the item 3, wherein the resin (B) contains at least one methacrylate repeating unit and at least one acrylate repeating unit.

11. The photosensitive composition as described in any one of the items 1 to 10, which further comprises at least one of (F) a basic compound, (G) a fluorine surfactant and silicon surfactant.

12. The photosensitive composition as described in the item 3, wherein the resin (B) contains: at least one repeating unit selected from 2-alkyl-2-adamantyl(meth)acrylate and dialkyl(1-adamantyl)methyl(meth)acrylate; at least one repeating unit having a lactone structure; and at least one repeating unit having two or more hydroxyl groups.

13. The photosensitive composition as described in the item 12, wherein the resin (B) further contains a repeating unit having a carboxyl group.

14. The photosensitive composition as described in the item 3, wherein the resin (B) contains: at least one repeating unit selected from 2-alkyl-2-adamantyl(meth)acrylate and dialkyl(1-adamantyl)methyl(meth)acrylate; and at least one repeating unit having a hydroxystyrene structure.

15. A pattern-forming method comprising: forming a photosensitive film with the photosensitive composition as described in any one of the items 1 to 14; and exposing and developing the photosensitive film.

The invention can provide a photosensitive composition excellent in sensitivity, resolution, and defocus latitude (DOF), and a pattern-forming method using the photosensitive composition.

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

A positive photosensitive composition according to the invention, preferably a positive resist composition, contains compound (A) represented by formula (I) and resin (B) capable of decomposing by the action of an acid to increase the solubility in an alkali developer, and if necessary, further contains dissolution-inhibiting compound (C) having a molecular weight of 3,000 or less and capable of decomposing by the action of an acid to increase the solubility in an alkali developer.

A negative photosensitive composition according to the invention, preferably a negative resist composition, contains compound (A) represented by formula (I), resin (D) soluble in an alkali developer, and acid crosslinking agent (E) capable of crosslinking with the resin soluble in an alkali developer by the action of an acid.

[1] Compound (A) Represented by Formula (I)

A photosensitive composition according to the invention contains a compound represented by formula (I) (hereinafter also referred to as merely "compound (A)") as a compound capable of generating an acid (acid generator) upon irradiation with an actinic ray or a radiation.

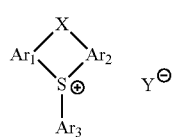

(I)

wherein $Ar_1$, $Ar_2$ and $Ar_3$ each represents an aromatic ring having from 6 to 20 carbon atoms, provided that at least one of $Ar_1$ to $Ar_3$ has a -Q-$SO_2$Ra group or a -Q-CORb group as a substituent; Ra and Rb each represents an alkyl group or an aryl group; Q represents an oxygen atom or —N(Ry)-; Ry represents a hydrogen atom, an alkyl group, or a cycloalkyl group; X represents a single bond or a divalent linking group; and Y represents a sulfonate anion, a carboxylate anion, a bis(alkylsulfonyl)-amide anion, or a tris(alkylsulfonyl)methide anion.

As the aromatic ring represented by $Ar_1$ to $Ar_3$ in formula (I), a benzene ring and a naphthalene ring are preferably exemplified. These aromatic rings may have a substituent, and as the examples of the substituents that they may have, a straight chain, branched or cyclic alkyl group having from 1 to 6 carbon atoms, an alkoxyl group having from 1 to 6 carbon atoms, an acyl group having from 1 to 6 carbon atoms, an aryl group having from 6 to 10 carbon atoms, a cyano group, a nitro group, arid a halogen atom are preferably exemplified.

The alkyl group represented by Ra, Rb and Ry is preferably a straight chain or branched alkyl group having from 1 to 20 carbon atoms, and more preferably a straight chain or branched alkyl group having from 1 to 12 carbon atoms, e.g., a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group can be exemplified.

The cycloalkyl group represented by Ry is preferably a cycloalkyl group having from 3 to 20 carbon atoms, and more preferably a cycloalkyl group having from 5 to 15 carbon atoms, e.g., a cyclopentyl group, a cyclohexyl group, a norbonyl group and an adamantyl group can be exemplified.

The alkyl group and the cycloalkyl group represented by Ra, Rb and Ry may further have a substituent, and a hetero atom, e.g., an oxygen atom, a sulfur atom, and a nitrogen atom may be contained in the alkyl chain of the alkyl group and the aralkyl group. As preferred substituents, a halogen atom, a hydroxyl group, an alkoxyl group (preferably having from 1 to 20 carbon atoms), a nitro group, a cyano group, an alkoxycarbonyl group (preferably having from 1 to 20 carbon atoms), and an acyl group (preferably having from 1 to 20 carbon atoms) are exemplified. Concerning the cyclic structures of the cyclic ring and the aromatic ring, an alkyl group (preferably having from 1 to 20 carbon atoms) can further be exemplified as the substituent.

As the divalent linking group represented by X, an oxygen atom, a sulfur atom, a single bond, and an alkylene group are exemplified. The alkylene group may have a substituent, e.g., a hydroxyl group, an alkoxyl group, an acyl group, a halogen atom, a cyano group and a nitro group are exemplified as the substituents.

X preferably represents a single bond, an oxygen atom or an alkylene group having from 1 to 3 carbon atoms.

The anion represented by Y in formula (I) may be univalent or divalent. When the anion is divalent or of higher valence, compound (A) may have two or more cations represented by formula (I).

Y in formula (I) is preferably an organic anion represented by any of the following formulae (Y1) to (Y4).

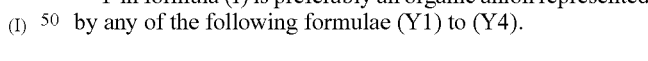

(Y1)

(Y2)

(Y3)

(Y4)

In formulae (Y1) to (Y4), $R_{c1}$ represents an organic group.

The organic group represented by $R_{c1}$ is preferably an organic group having from 1 to 30 carbon atoms, and more preferably an alkyl group, a cycloalkyl group, an aryl group, or a group obtained by linking a plurality of these groups with a single bond, or a linking group such as —O—, —CO$_2$—, —S—, —SO$_3$—, or —SO$_2$N($R_{d1}$)—. $R_{d1}$ represents a hydrogen atom or an alkyl group.

$R_{c3}$, $R_{c4}$ and $R_{c5}$ each represents an organic group.

As the preferred organic groups represented by $R_{c3}$, $R_{c4}$ and $R_{c5}$, the same organic groups represented by $R_{c1}$ as preferred organic groups are exemplified, and the most preferred organic group is a perfluoroalkyl group having from 1 to 4 carbon atoms.

$R_{c3}$ and $R_{c4}$ may be bonded to form a ring.

As the group formed by $R_{c3}$ and $R_{c4}$ by bonding, an alkylene group and an arylene group are exemplified, and preferably a perfluoroalkyl group having from 2 to 4 carbon atoms.

The most preferred organic group represented by $R_{c1}$, $R_{c3}$, $R_{c4}$ and $R_{c5}$ is an alkyl group in which the 1-position is substituted with a fluorine atom or a fluoroalkyl group, or a phenyl group substituted with a fluorine atom or a fluoroalkyl group. By substituting with a fluorine atom or a fluoroalkyl group, the acidity of the acid generated by irradiation increases and sensitivity is improved.

The specific examples of compound (A) represented by formula (I) are shown below, but the invention is not restricted thereto. In the following chemical formulae, "Ts" means a tosyl group (p-toluenesulfonyl group).

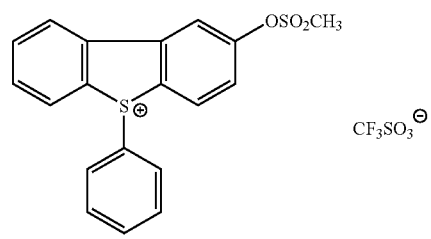

I-1

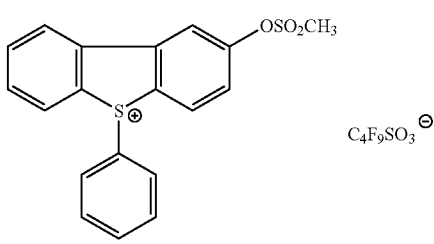

I-2

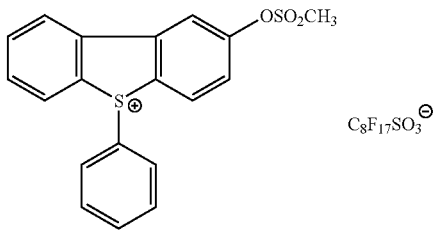

I-3

-continued

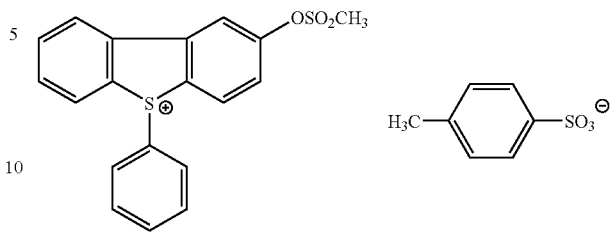

I-4

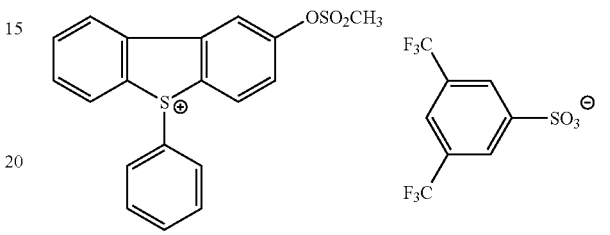

I-5

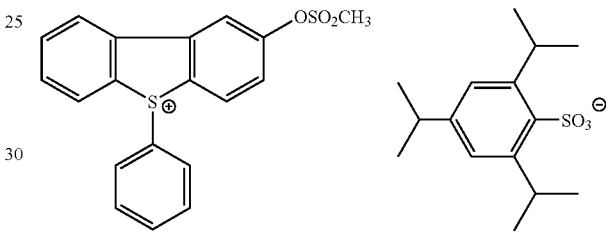

I-6

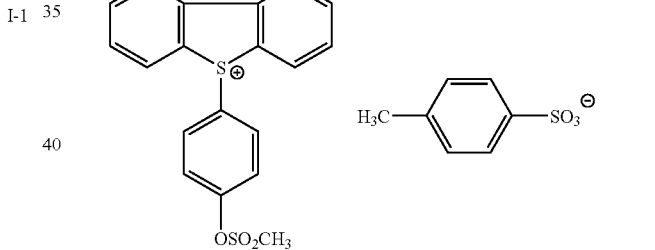

I-7

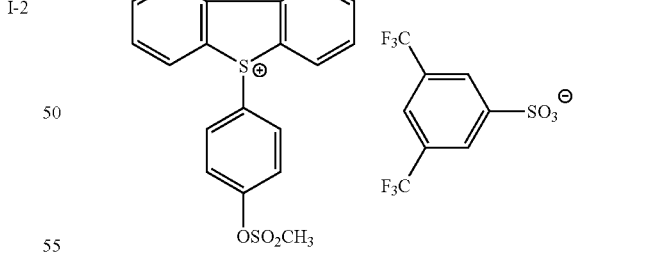

I-8

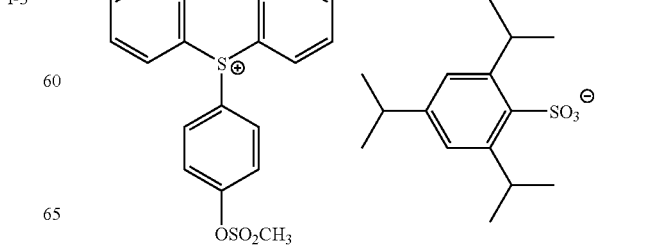

I-9

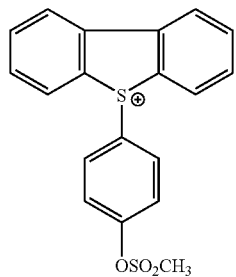 I-10 CF₃SO₃⁻
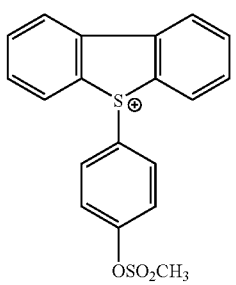 I-11 C₄F₉SO₃⁻
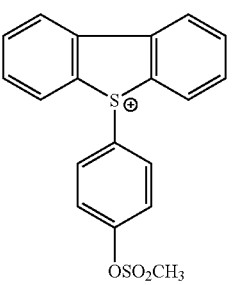 I-12 C₈F₁₇SO₃⁻
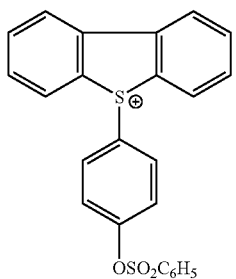 I-13 CF₃SO₃⁻
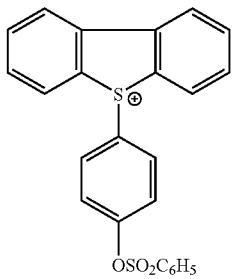 I-14 C₄F₉SO₃⁻
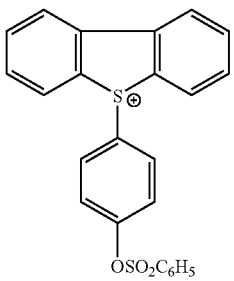 I-15 C₈F₁₇SO₃⁻
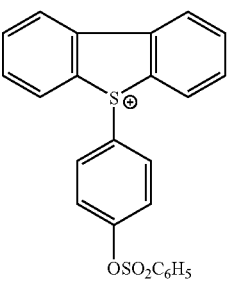 I-16 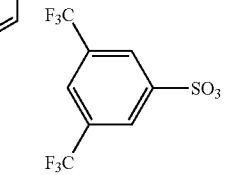
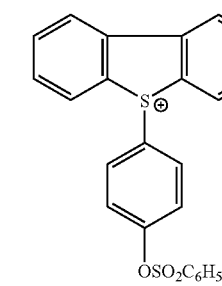 I-17 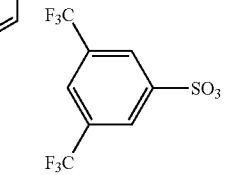
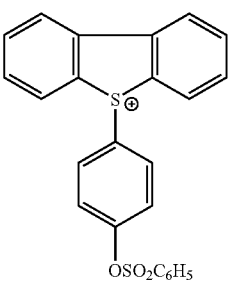 I-18 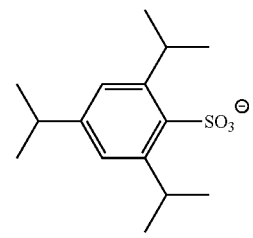
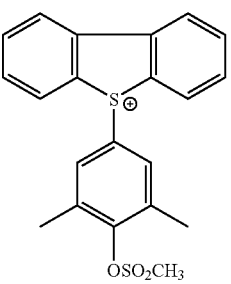 I-19 

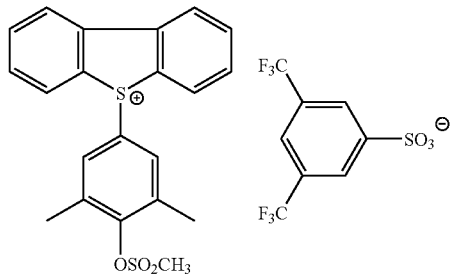
I-20
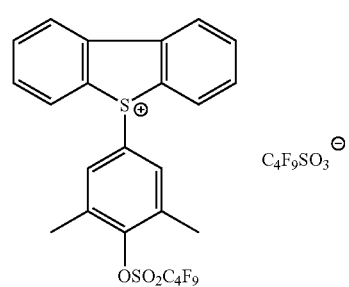
I-21
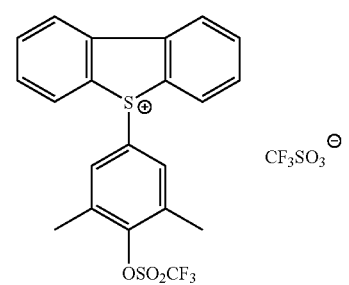
I-22
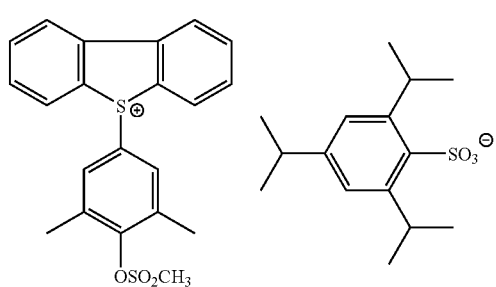
I-23
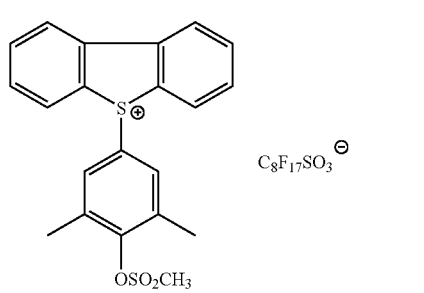
I-24
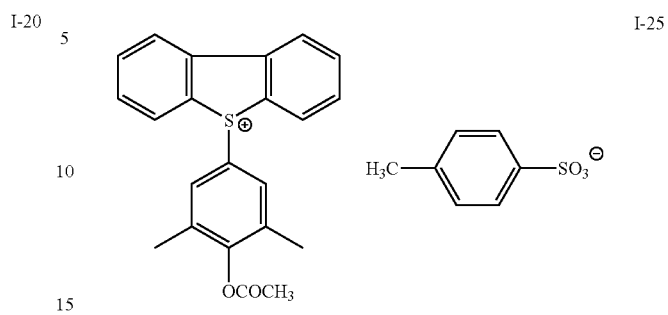
I-25
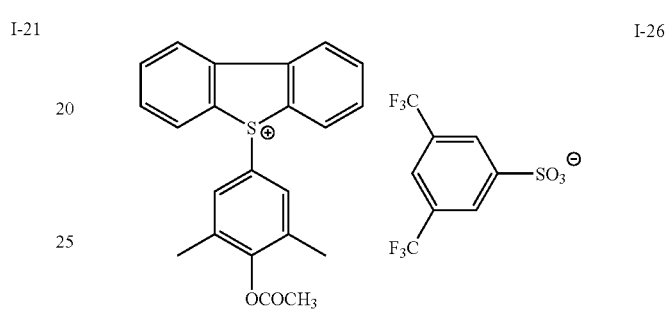
I-26
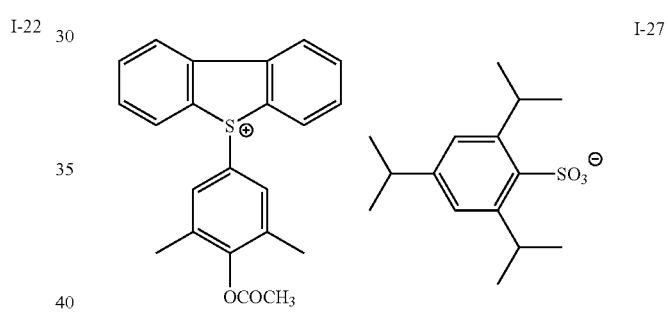
I-27
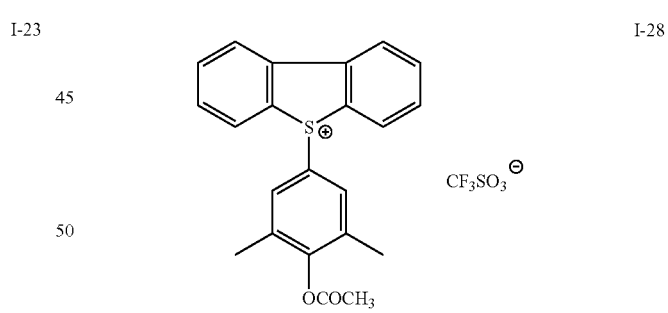
I-28
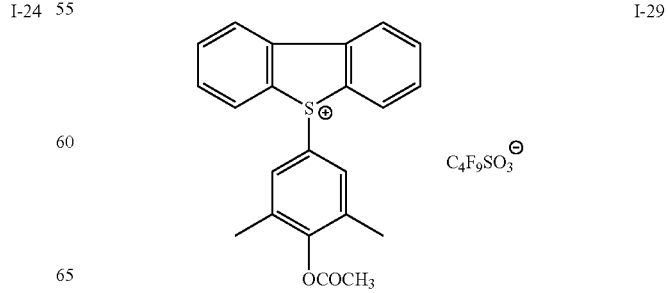
I-29

-continued
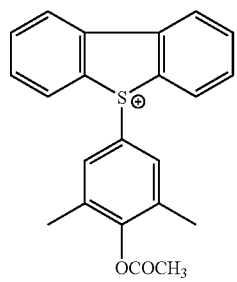 I-30 C₈F₁₇SO₃⁻
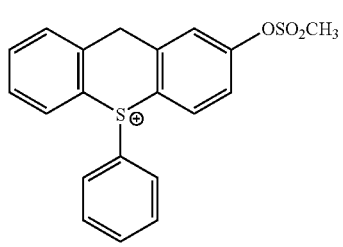 I-31 CF₃SO₃⁻
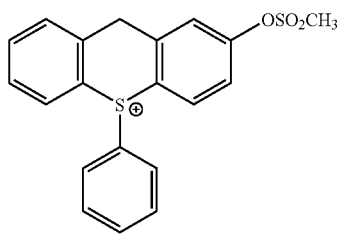 I-32 C₄F₉SO₃⁻
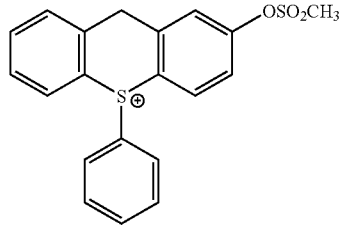 I-33 C₈F₁₇SO₃⁻
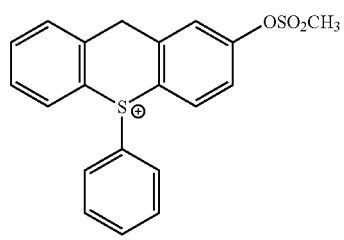 I-34
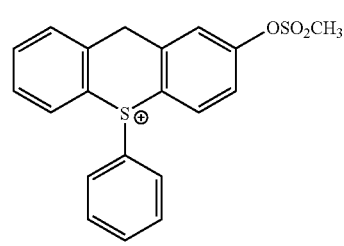 I-35
-continued
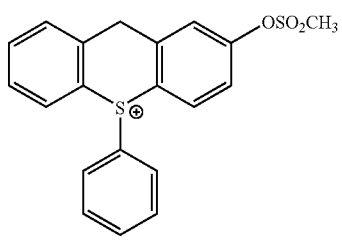 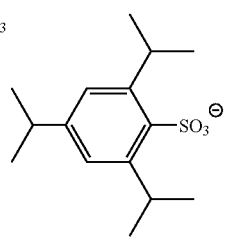 I-36
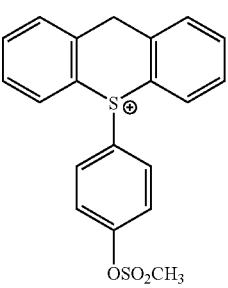  I-37
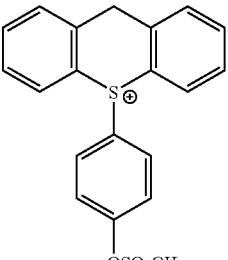 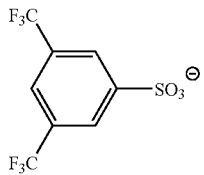 I-38
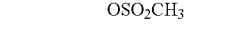
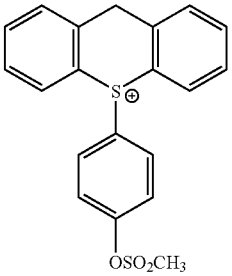 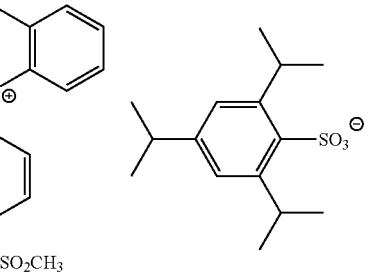 I-39
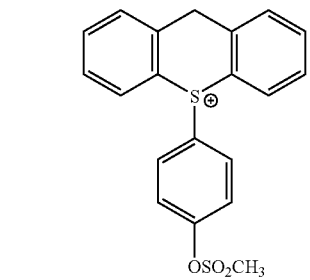 I-40 CF₃SO₃⁻

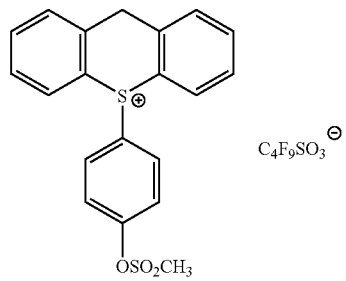 I-41
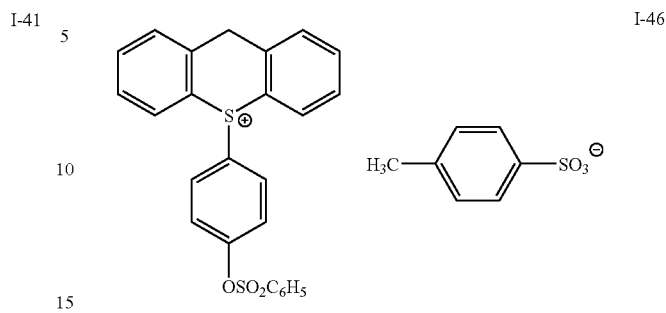 I-46
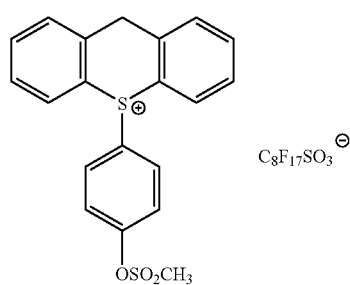 I-42
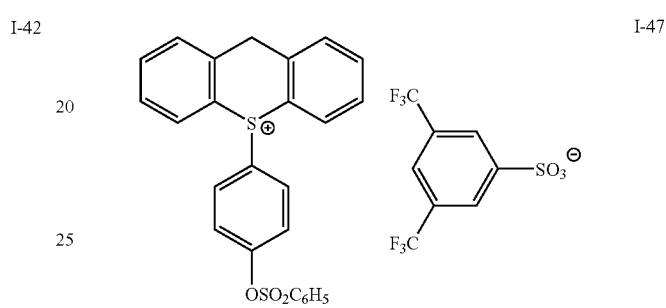 I-47
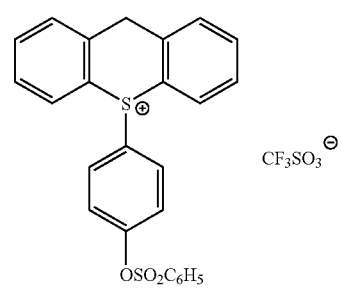 I-43
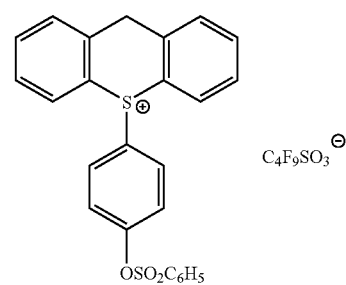 I-44
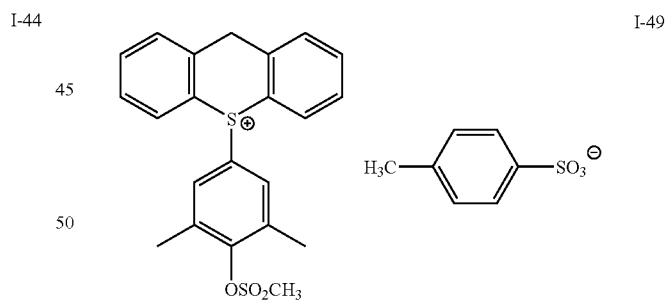 I-48
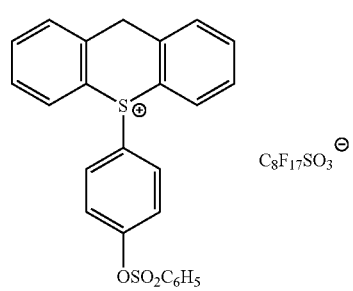 I-45
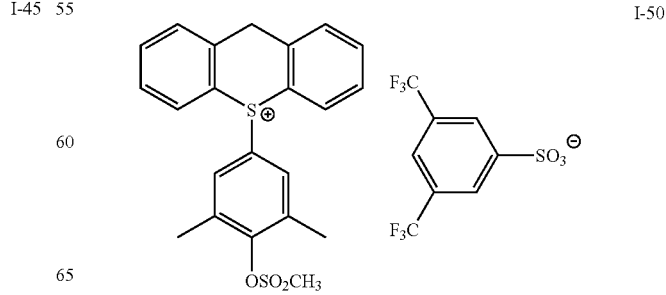 I-49
I-50

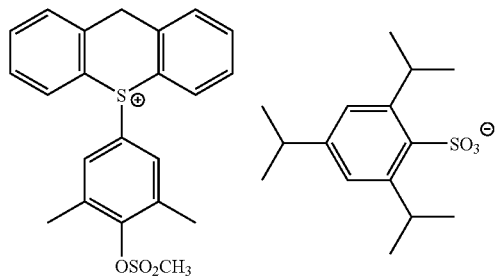
I-51
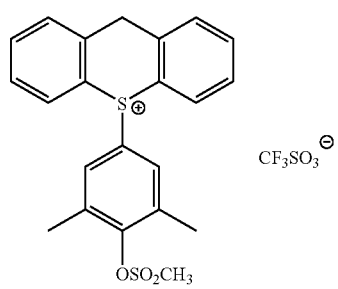
I-52
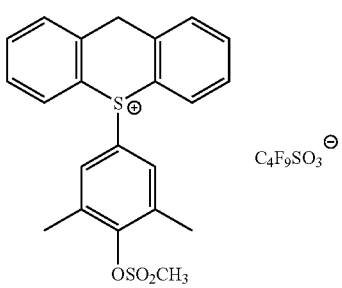
I-53
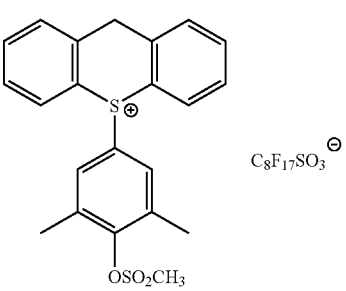
I-54
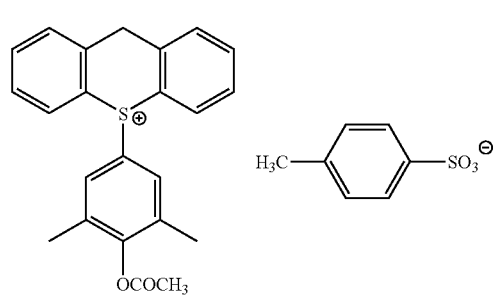
I-55
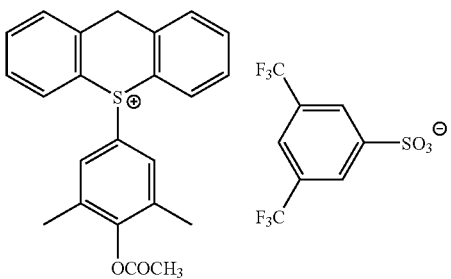
I-56
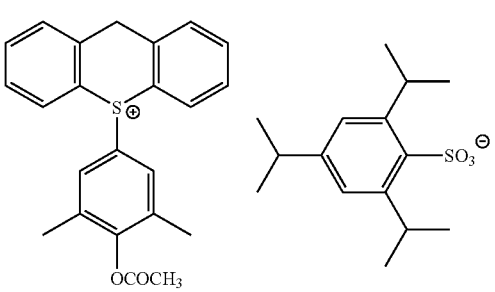
I-57
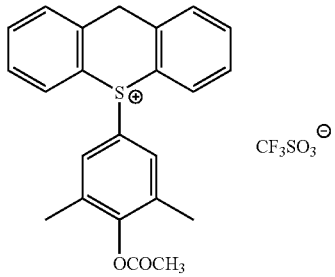
I-58
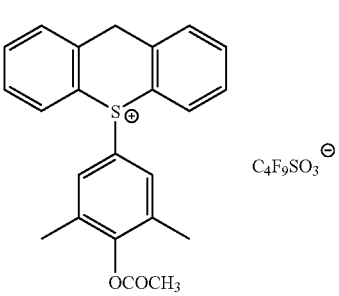
I-59
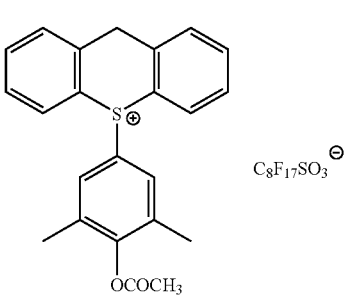
I-60

I-61 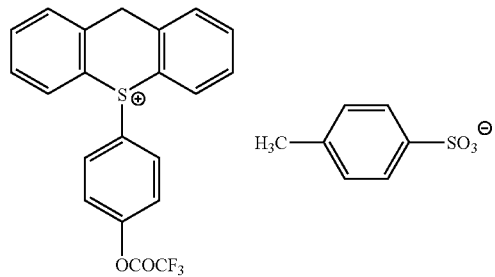
I-62 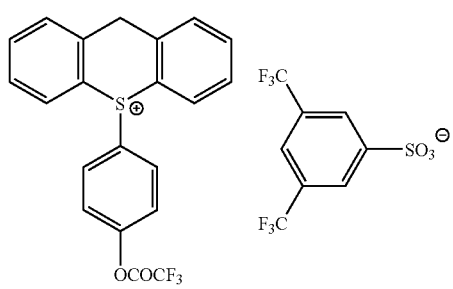
I-63 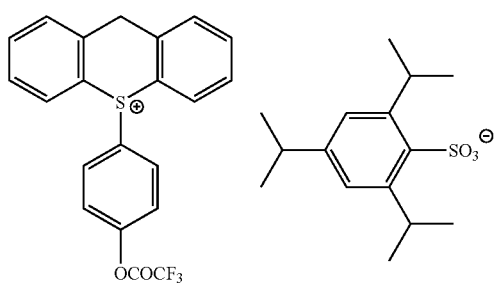
I-64 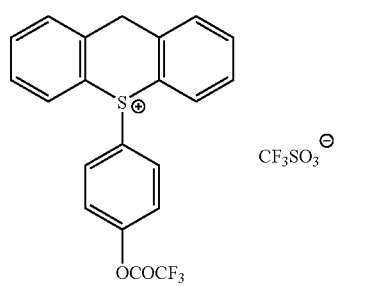
I-65 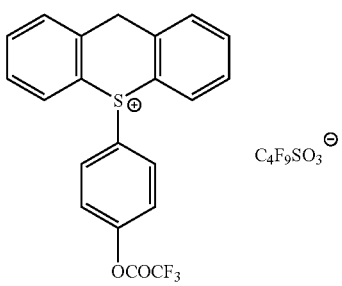
I-66 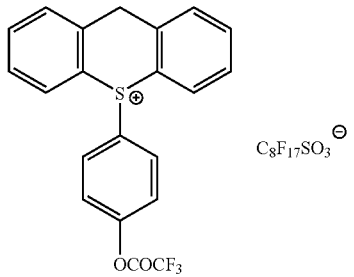
I-67 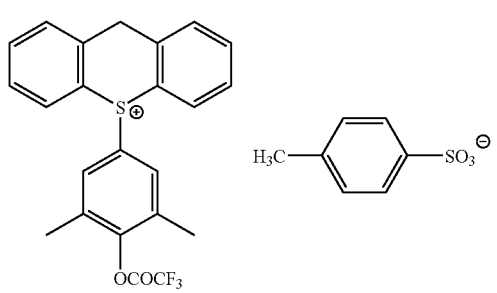
I-68 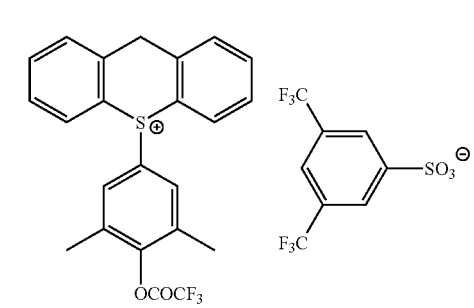
I-69 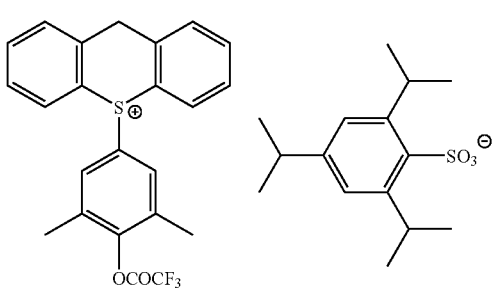
I-70 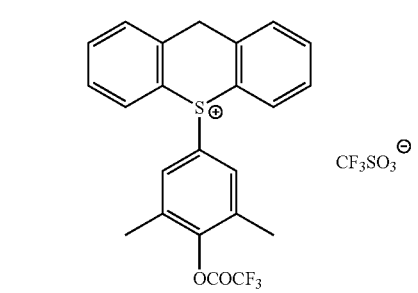

-continued
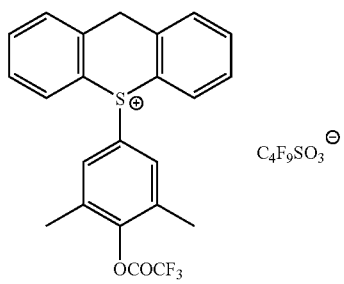
I-71
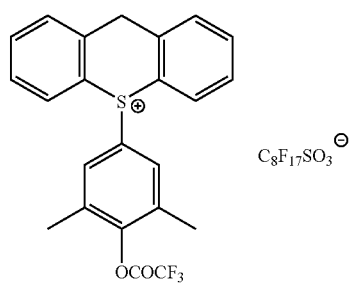
I-72
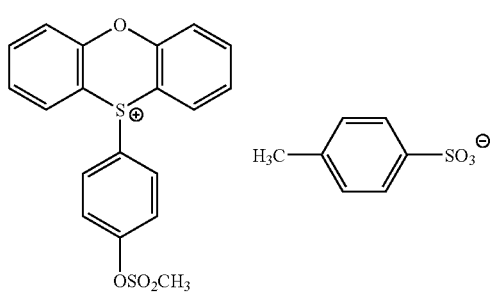
I-73
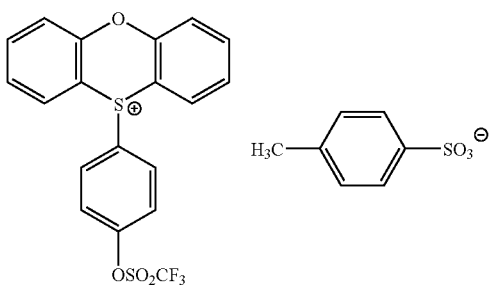
I-74
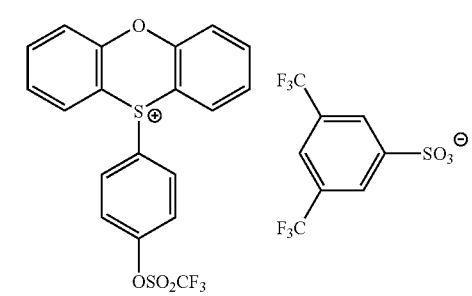
I-75
-continued
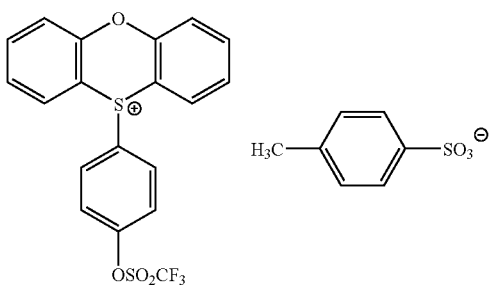
I-76
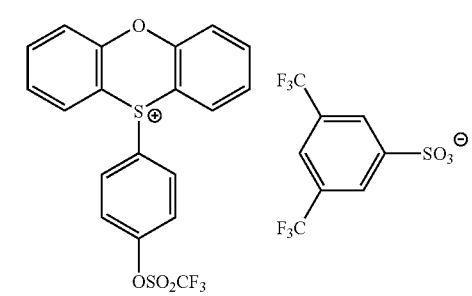
I-77
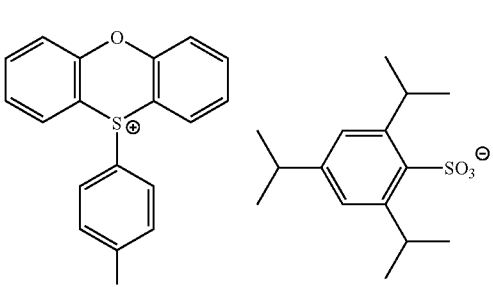
I-78
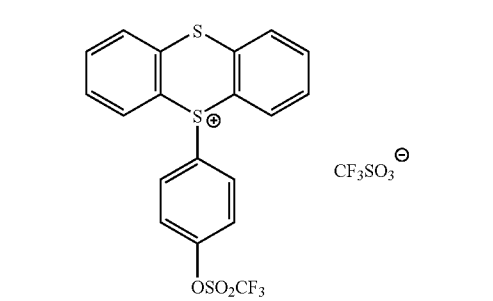
I-79
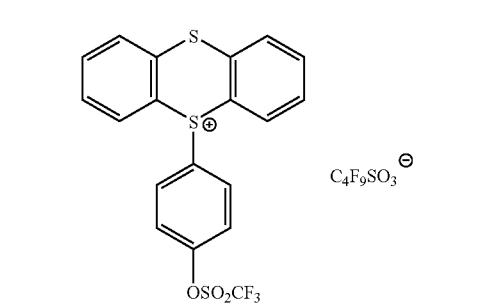
I-80

-continued
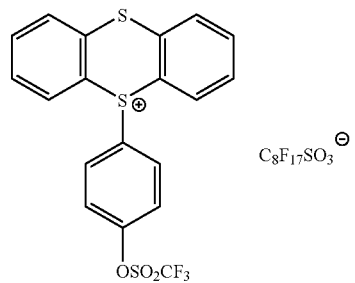
I-81
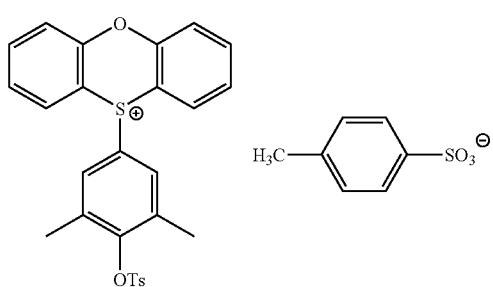
I-82
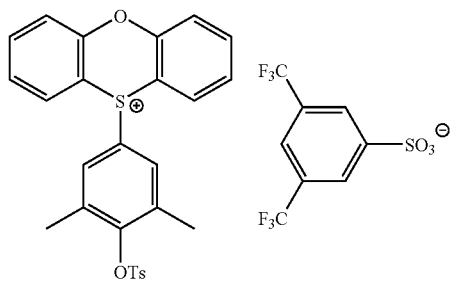
I-83
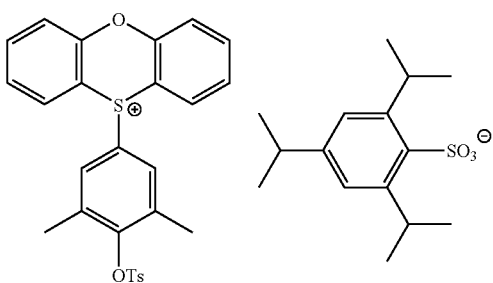
I-84
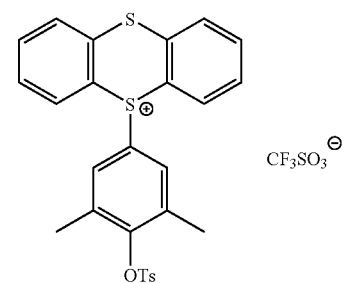
I-85
-continued
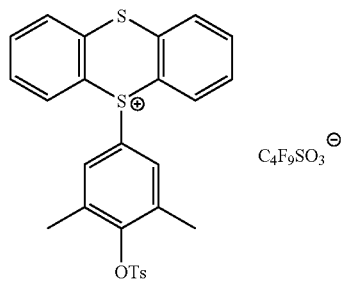
I-86
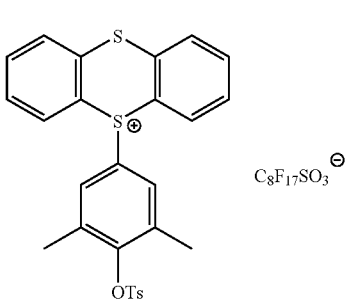
I-87
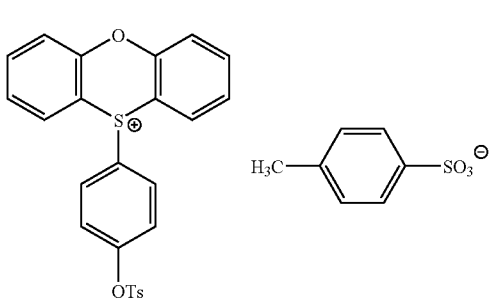
I-88
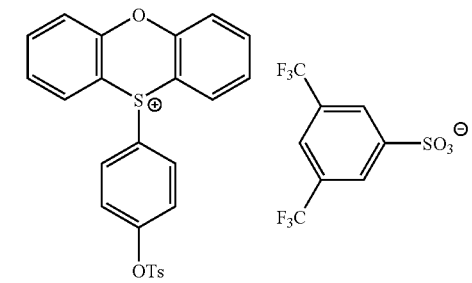
I-89
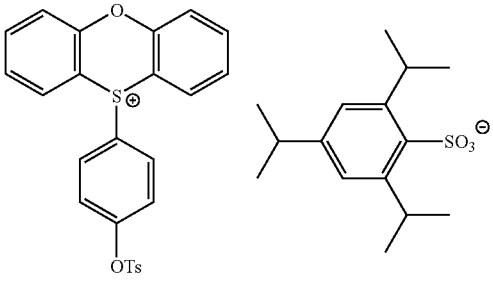
I-90

-continued
I-91
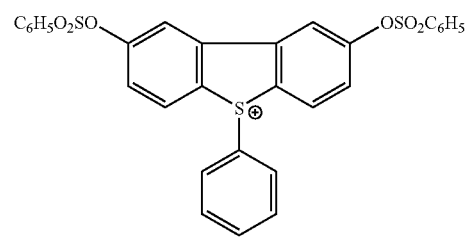
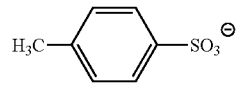
I-92
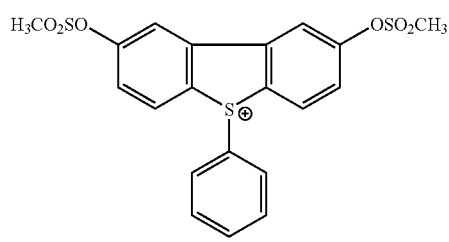
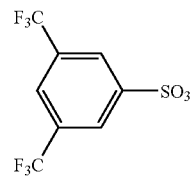
I-93
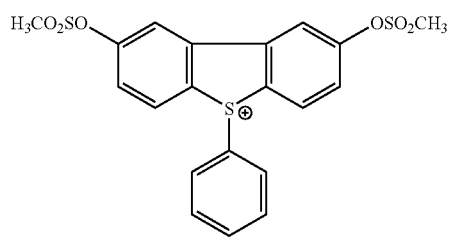
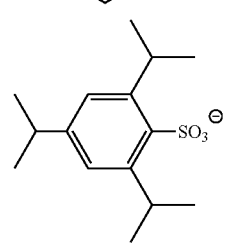
I-94
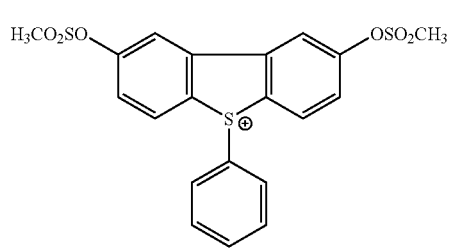 
-continued
I-95
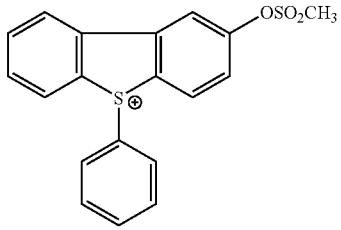 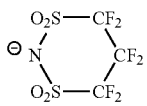
I-96
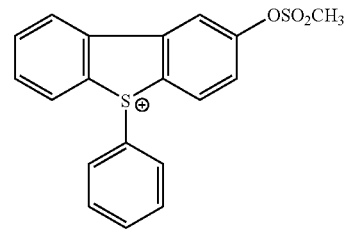 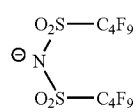
I-97
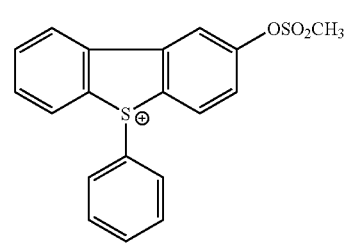 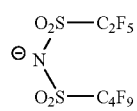
I-98
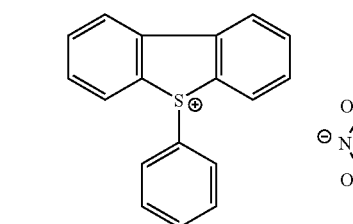 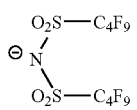
I-99
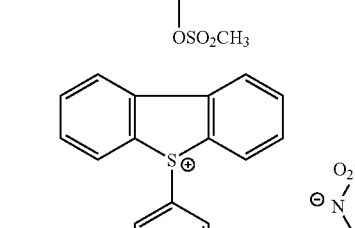 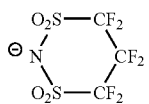
I-100
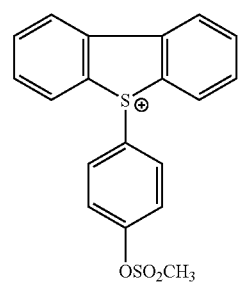 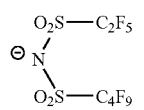
A compound represented by formula (I) can be synthesized by synthesizing a compound having a hydroxyl group or an amino group, and then by the reaction of the resulting compound with a commercially available sulfonic acid halide or a sulfonic acid anhydride. For example, after the reaction of a phenolic compound or aniline compound with a compound, e.g., dibenzothiophene sulfoxide, in the presence of an acid catalyst (preferably diphosphorus pentoxide/methanesulfonic acid), and the resulting compound is reacted with a sulfonic acid halide or a sulfonic acid anhydride under a basic condition, and then by the salt exchange with a desired anion.

The content of compound (A) is preferably from 0.1 to 20 mass % based on the total solids content of the composition, more preferably from 0.5 to 10 mass %, and still more preferably from 1 to 7 mass %.

Acid Generator for Use in Combination:

Besides compound (A), a compound capable of decomposing and generating an acid upon irradiation with an actinic ray or radiation (an acid generator) may further be used in combination in the present invention.

The addition amount of other acid generators used in combination is generally from 100/0 to 20/80 in the molar ratio of (compound (A)/other acid generator], preferably from 100/0 to 40/60, and still more preferably from 100/0 to 50/50.

As such acid generators usable in combination, photo-initiators of photo-cationic polymerization, photo-initiators of photo-radical polymerization, photo-decoloring agents of dyes, photo-discoloring agents, or well-known compounds capable of generating an acid upon irradiation with an actinic ray or radiation that are used in the process of micro-resist, and mixtures of these compounds can be used by arbitrary selection.

For example, diazonium salt, phosphonium salt, sulfonium salt, iodonium salt, imidosulfonate, oximesulfonate, diazodisulfone, disulfone, and o-nitrobenzyl sulfonate are exemplified as acid generators.

Further, compounds obtained by introducing a group or a compound capable of generating an acid upon irradiation with an actinic ray or a radiation to the main chain or the side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used as acid generators.

The compounds generating an acid by the action of lights as disclosed in U.S. Pat. No. 3,779,778, EP-126712 can also be used.

As preferred acid generators that can be used in the invention, the compounds represented by the following formula (ZI), (ZII) or (ZIII) can be exemplified.

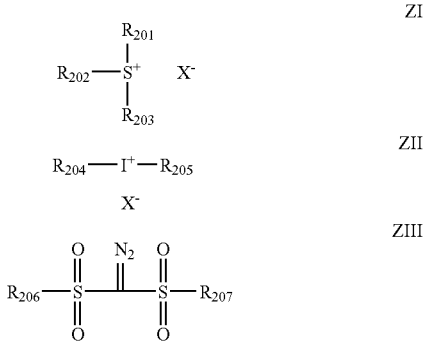

In formula (ZI), $R_{201}$, $R_{202}$ and $R_{203}$ each represents an organic group.

The number of carbon atoms of the organic groups represented by $R_{201}$, $R_{202}$ and $R_{203}$ is generally from 1 to 30, preferably from 1 to 20.

Two of $R_{201}$, $R_{202}$ and $R_{203}$ may be bonded to form a cyclic structure, and an oxygen atom, a sulfur atom, an ester bond, an amido bond or a carbonyl group may be contained in the ring.

As the group formed by bonding two of $R_{201}$, $R_{202}$ and $R_{203}$, an alkylene group (e.g., a butylene group, a pentylene group) can be exemplified.

$X^-$ represents a non-nucleophilic anion.

The examples of non-nucleophilic anions represented by $X^-$ include, e.g., a sulfonate anion, a carboxylate anion, a sulfonylimide anion, a bis(alkylsulfonyl)imide anion, and a tris(alkylsulfonyl)methyl anion.

A non-nucleophilic anion is an anion having extremely low ability of causing a nucleophilic reaction and capable of restraining the aging decomposition due to an intramolecular nucleophilic reaction, so that the aging stability of a resist can be improved with a non-nucleophilic anion.

As the sulfonate anion, e.g., an alkylsulfonate anion, an arylsulfonate anion, and a camphorsulfonate anion can be exemplified.

As the carboxylate anion, an alkylcarboxylate anion, an arylcarboxylate anion, and an aralkylcarboxylate anion can be exemplified.

The alkyl moiety in the alkylsulfonate anion may be an alkyl group or a cycloalkyl group, preferably an alkyl group having from 1 to 30 carbon atoms, and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group can be exemplified.

The aryl group in the arylsulfonate anion is preferably an aryl group having from 6 to 14 carbon atoms, e.g., a phenyl group, a tolyl group and a naphthyl group can be exemplified.

As the substituents of the alkyl group, the cycloalkyl group, and the aryl group in the alkylsulfonate anion and the arylsulfonate anion, e.g., a nitro group, a halogen atom (a fluorine atom, a chlorine atom, a bromine atom, an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) can be exemplified. Concerning the aryl group and the cyclic structure of each group, an alkyl group (preferably having from 1 to 15 carbon atoms) can further be exemplified as the substituent.

As the alkyl moiety in the alkylcarboxylate anion, the same alkyl group and the cycloalkyl group as in the alkylsulfonate anion can be exemplified.

As the aryl group in the arylcarboxylate anion, the same aryl group as in the arylsulfonate anion can be exemplified.

As the aralkyl group in the aralkylcarboxylate anion, preferably an aralkyl group having from 6 to 12 carbon atoms, e.g., a benzyl group, a phenethyl group, a naphthylmethyl group, and a naphthylethyl group can be exemplified.

As the substituents of the alkyl group, cycloalkyl group, aryl group and aralkyl group in the alkylcarboxylate anion, arylcarboxylate anion, and aralkylcarboxylate anion, e.g., the same halogen atom, alkyl group, cycloalkyl group, alkoxyl group and alkylthio group as described in the arylsulfonate anion can be exemplified.

As the sulfonylimide anion, e.g., a saccharin anion can be exemplified.

The alkyl group in the bis(alkylsulfonyl)imide anion and the tris(alkylsulfonyl)methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group can be exemplified. As the substituents of these alkyl groups, a halogen atom, an alkyl group substituted with a halogen atom, an alkoxyl group, and an alkylthio group can be exemplified, and an alkyl group substituted with a fluorine atom is preferred.

As other non-nucleophilic anions, e.g., fluorinated phosphorus, fluorinated boron, and fluorinated antimony can be exemplified.

As the non-nucleophilic anion represented by X$^-$, an alkanesulfonate anion in which the α-position of the sulfonic acid is substituted with a fluorine atom, an arylsulfonate anion substituted with a fluorine atom or a group having a fluorine atom, a bis(alkylsulfonyl)imide anion the alkyl group of which is substituted with a fluorine atom, and a tris(alkylsulfonyl)methide anion the alkyl group of which is substituted with a fluorine atom are preferred. The especially preferred non-nucleophilic anions are a perfluoroalkanesulfonate anion having from 4 to 8 carbon atoms, and a benzenesulfonate anion having a fluorine atom, and the most preferred non-nucleophilic anions are a nonafluorobutanesulfonate anion, a perfluoro-octanesulfonate anion, a pentafluorobenzenesulfonate anion, and a 3,5-bis(trifluoromethyl)benzenesulfonate anion.

As the organic group represented by $R_{201}$, $R_{202}$ and $R_{203}$, e.g., the corresponding groups in the compounds represented by the later-described formulae (ZI-1), (ZI-2) and (ZI-3) can be exemplified.

A compound represented by formula (ZI) may comprise a plurality of structures represented by formula (ZI). For instance, a compound represented by formula (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

Compound (ZI-1) is an arylsulfonium compound that at least one of $R_{201}$ to $R_{203}$ in formula (ZI) represents an aryl group, i.e., a compound having arylsulfonium as a cation.

All of $R_{201}$ to $R_{203}$ of the arylsulfonium compound may be aryl groups, or a part of $R_{201}$ to $R_{203}$ may represent an aryl group and the remainder may represent an alkyl group or a cycloalkyl group.

As the arylsulfonium compounds, e.g., a triarylsulfonium compound, a diarylalkylsulfonium compound, an aryldialkyl-sulfonium compound, a diarylcycloalkylsulfonium compound, and an aryldicycloalkylsulfonium compound are exemplified.

As the aryl groups of the arylsulfonium compound, a phenyl group and a naphthyl group are preferred, and the more preferred group is a phenyl group. When the arylsulfonium compound has two or more aryl groups, these two or more aryl groups may be the same or different.

As an alkyl group or a cycloalkyl group that the arylsulfonium compound has according to necessity, a straight chain or branched alkyl group having from 1 to 15 carbon atoms and a cycloalkyl group having from 3 to 15 carbon atoms are preferred, e.g., a methyl group, an ethyl group, a propyl group, an n-butyl group, a sec-butyl group, a t-butyl group, a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent and, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$ to $R_{203}$, or may be substituted on all of three. When $R_{201}$, $R_{202}$ and $R_{203}$ each represents an aryl group, it is preferred that the substituent be substituted on the p-position of the aryl group.

Compound (ZI-2) is described below.

Compound (ZI-2) is a compound in the case where $R_{201}$, $R_{202}$ and $R_{203}$ in formula (ZI) each represents an organic group not containing an aromatic ring. The aromatic ring also includes an aromatic ring containing a hetero atom.

The organic groups not containing an aromatic ring represented by $R_{201}$ to $R_{203}$ generally have from 1 to 30 carbon atoms, preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain or branched 2-oxoalkyl group, a 2-oxocycloalkyl group or an alkoxycarbonylmethyl group, and particularly preferably a straight or branched 2-oxoalkyl group.

The alkyl group and cycloalkyl group represented by $R_{201}$ to $R_{203}$ are preferably a straight chain or branched alkyl group having from 1 to 10 carbon atoms (e.g., a methyl group, an ethyl group, a propyl group, a butyl group, a pentyl group), and a cycloalkyl group having from 3 to 10 carbon atoms (e.g., a cyclopentyl group, a cyclohexyl group, a norbonyl group). The alkyl group is more preferably a 2-oxoalkyl group or an alkoxycarbonylmethyl group. The cycloalkyl group is more preferably a 2-oxocycloalkyl group.

The 2-oxoalkyl group may be either a straight chain or branched group, and a group having >C=O on the 2-position of the above alkyl group can be exemplified as a preferred group.

The 2-oxocycloalkyl group is preferably a group having >C=O on the 2-position of the above cycloalkyl group.

As the alkoxyl group in the alkoxycarbonylmethyl group, an alkoxyl group preferably having from 1 to 5 carbon atoms (e.g., a methoxy group, an ethoxy group, a propoxy group, a butoxy group, a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group or a nitro group.

Two of $R_{201}$, $R_{202}$ and $R_{203}$ may be bonded to form a cyclic structure, and an oxygen atom, a sulfur atom, an ester bond, an amido bond or a carbonyl group may be contained in the cyclic structure. As the group formed by the bonding of two of $R_{201}$, $R_{202}$ and $R_{203}$, an alkylene group (e.g., a butylene group, a pentylene group) can be exemplified.

Compound (ZI-3) is a compound represented by the following formula (ZI-3), which compound has a phenacyl-sulfonium salt structure.

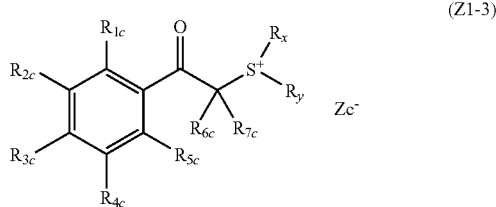

(ZI-3)

In formula (ZI-3), $R_{1c}$, $R_{2c}$, $R_{3c}$, $R_{c4}$, and $R_{5c}$ each represents a hydrogen atom, an alkyl group, a cycloalkyl group, an alkoxyl group or a halogen atom.

$R_{6c}$ and $R_{7c}$ each represents a hydrogen atom, an alkyl group or a cycloalkyl group.

$R_x$ and $R_y$ each represents an alkyl group, a cycloalkyl group, an allyl group or a vinyl group.

Any two or more of $R_{1c}$ to $R_{5c}$, and $R_x$ and $R_y$ may be respectively bonded to form a cyclic structure, and an oxygen atom, a sulfur atom, an ester bond, or an amido bond may be contained in these cyclic structures.

$Zc^-$ represents a non-nucleophilic anion, and the same non-nucleophilic anion as represented by $X^-$ in formula (ZI) can be exemplified.

The alkyl group represented by $R_{1c}$ to $R_{5c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group) can be exemplified, and as the cycloalkyl group, e.g., a cyclic alkyl group having from 3 to 8 carbon atoms (e.g., a cyclopentyl group and a cyclohexyl group) can be exemplified.

The alkoxyl group represented by $R_{1c}$ to $R_{5c}$ may be any of straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group and a cyclohexyloxy group) can be exemplified.

Preferably any of $R_{1c}$ to $R_{5c}$ represents a straight chain or branched alkyl group, a cycloalkyl group, or a straight chain, branched or cyclic alkoxyl group, and more preferably the sum total of the carbon atoms of $R_{1c}$ to $R_{5c}$ is from 2 to 15. By selecting such substituents, the solvent solubility is improved and the generation of particles during preservation can be restrained.

As the alkyl group and the cycloalkyl group represented by $R_x$ and $R_y$, the same alkyl groups and cycloalkyl groups as in $R_{1c}$ to $R_{5c}$ can be exemplified, and a 2-oxoalkyl group, a 2-oxocycloalkyl group, and an alkoxycarbonylmethyl group are more preferred.

As the 2-oxoalkyl group and the 2-oxocycloalkyl group, groups having >C=O at the 2-position of the alkyl group and the cycloalkyl group represented by $R_{1c}$ to $R_{5c}$ can be exemplified.

As the alkoxyl groups in the alkoxycarbonylmethyl group, the same alkoxyl groups as in $R_{1c}$ to $R_{5c}$ can be exemplified.

As the groups formed by $R_x$ and $R_y$ by bonding, a butylene group and a pentylene group can be exemplified.

$R_x$ and $R_y$ each preferably represents an alkyl group or a cycloalkyl group having 4 or more carbon atoms, more preferably an alkyl group or a cycloalkyl group having 6 or more, and still more preferably 8 or more, carbon atoms.

In formulae (ZII) and (ZIII), $R_{204}$ to $R_{207}$ each represents an aryl group, an alkyl group or a cycloalkyl group.

As the aryl group represented by $R_{204}$ to $R_{207}$, a phenyl group and a naphthyl group are preferred, and a phenyl group is more preferred.

As the alkyl group and the cycloalkyl group represented by $R_{204}$ to $R_{207}$, preferably a straight chain or branched alkyl group having from 1 to 10 carbon atoms (e.g., a methyl group, an ethyl group, a propyl group, a butyl group, and a pentyl group), and a cyclic alkyl group having from 3 to 10 carbon atoms (e.g., a cyclopentyl group, a cyclohexyl group, and a norbonyl group) can be exemplified.

As the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified. $X^-$ represents a non-nucleophilic anion, and the same non-nucleophilic anions as those represented by $X_-$ in formula (ZI) can be exemplified.

As the acid generators that can be used in combination, the compounds represented by the following formula (ZIV), (ZV) or (ZVI) can further be exemplified.

ZIV

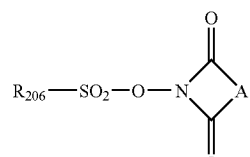

ZV

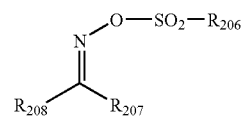

ZVI

In formulae (ZIV), (ZV) and (ZVI), $Ar_3$ and $Ar_4$ each represents an aryl group.

$R_{206}$, $R_{207}$ and $R_{208}$ each represents an alkyl group, a cycloalkyl group or an aryl group.

A represents an alkylene group, an alkenylene group or an arylene group.

Of the acid generators that can be used in combination, more preferred compounds are the compounds represented by formulae (ZI), (ZII) and (ZIII).

Further, as the acid generators usable in combination, a compound generating a sulfonic acid having one sulfonic acid group is preferred, and a compound generating a monovalent perfluoroalkanesulfonic acid, and a compound generating an aromatic sulfonic acid substituted with a fluorine atom or a group containing a fluorine atom are more preferred, and a sulfonium salt of a monovalent perfluoroalkanesulfonic acid is particularly preferred.

Of the acid generators that can be used in combination, particularly preferred examples are shown below.

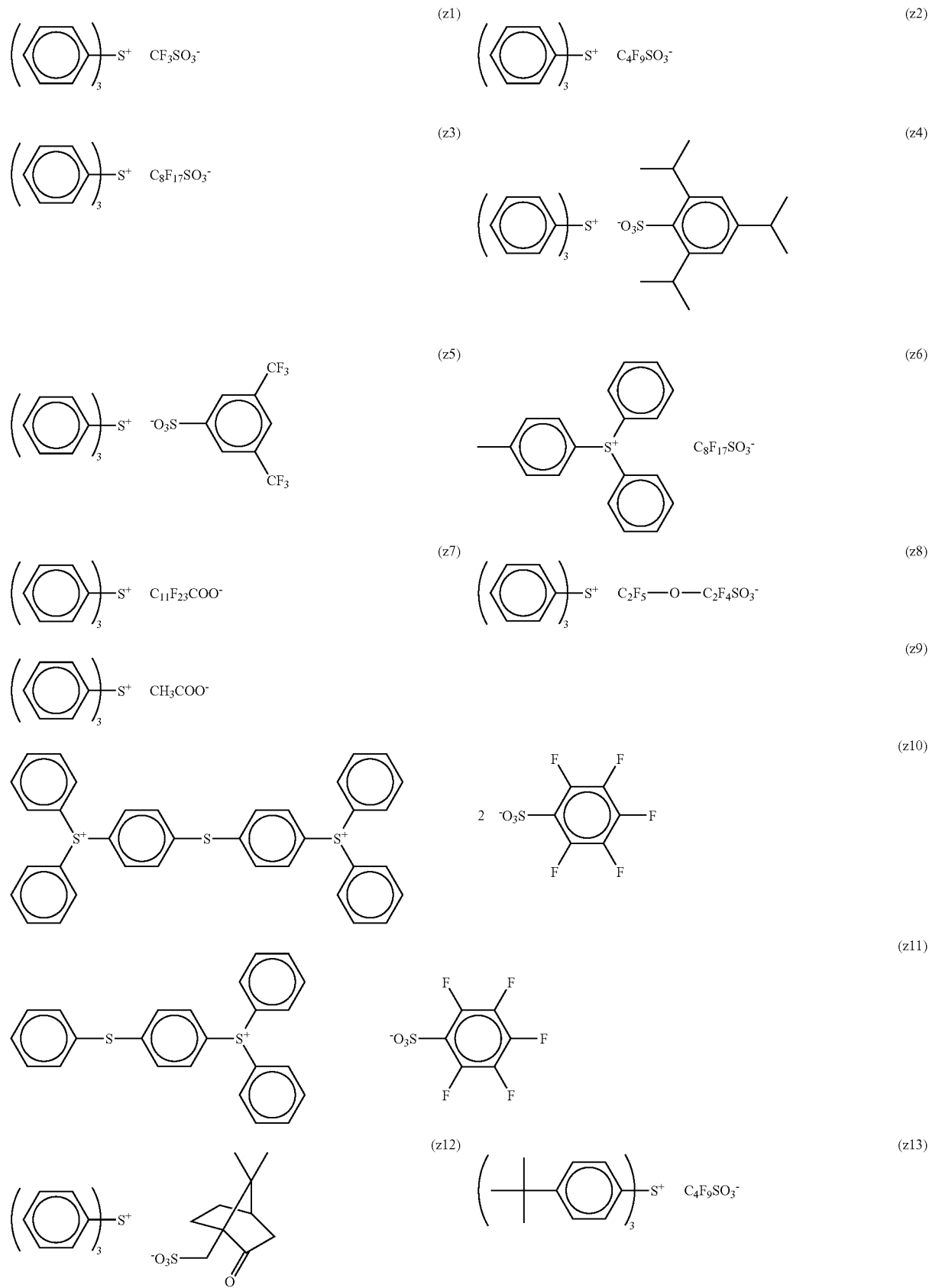

-continued
(z14)
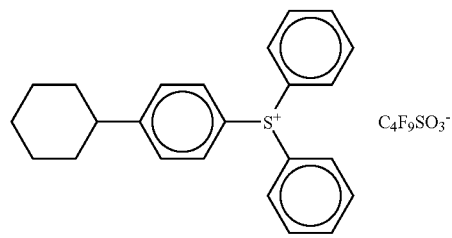
(z15)
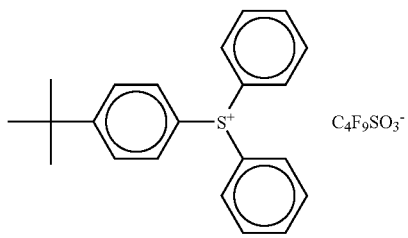
(z16)
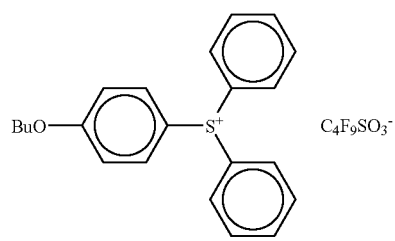
(z17)
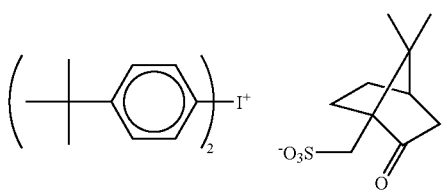
(z18)
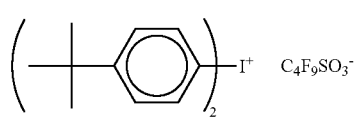
(z19)
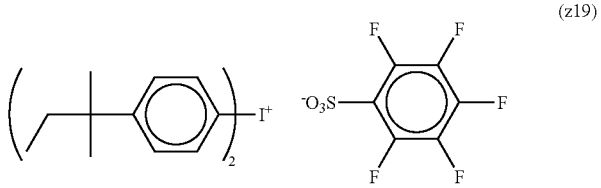
(z20)
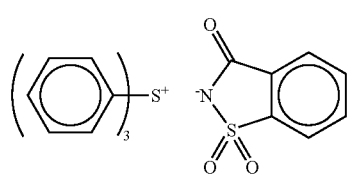
(z21)
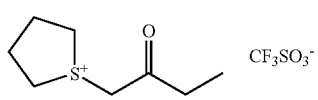
(z22)
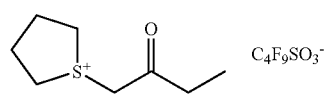
(z23)
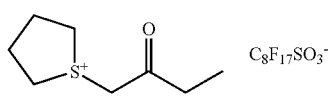
(z24)
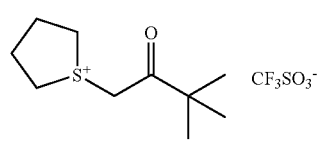
(z25)
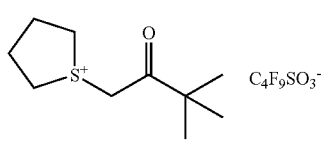
(z26)
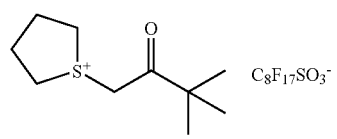
(z27)
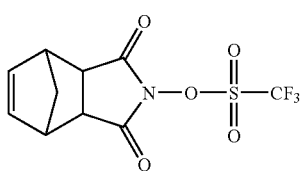
(z28)
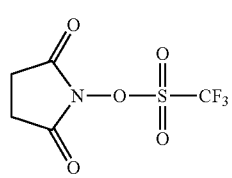
(z29)
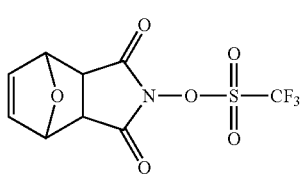
(z30)
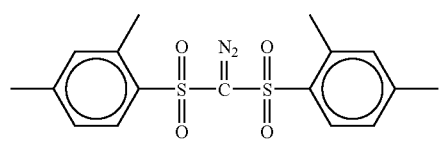
(z31)
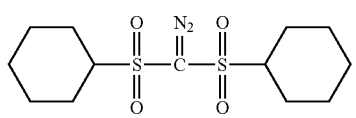

-continued
(z32)
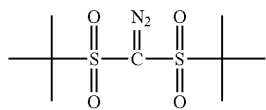
(z33)
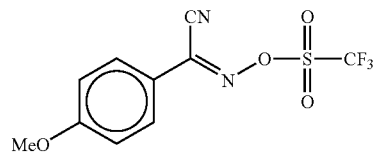
(z34)
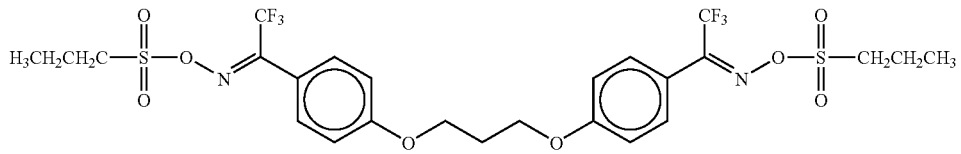
(z35)
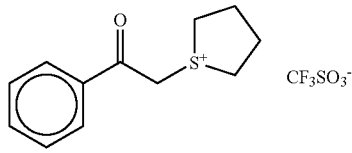
(z36)
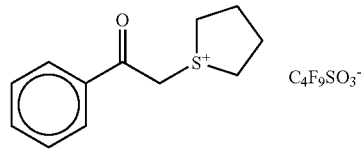
(z37)
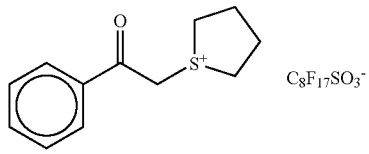
(z38)
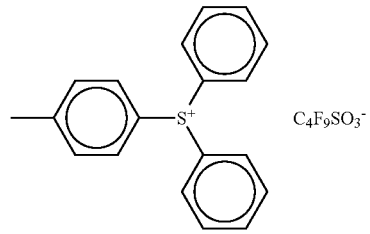
(z39)
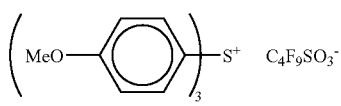
(z40)
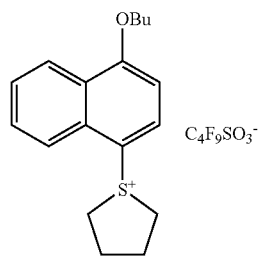
(z41)
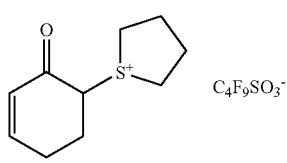
(z42)
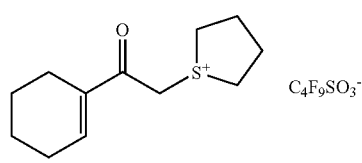
(z43)
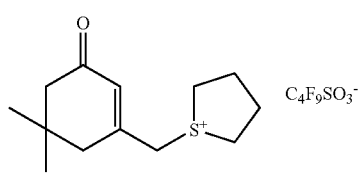
(z44)
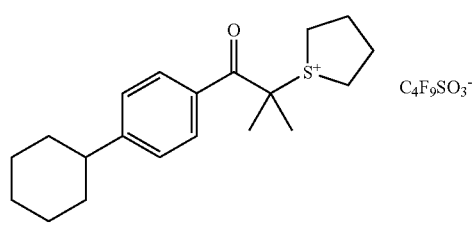
(45)
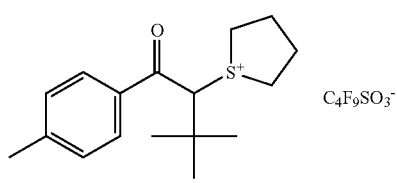
(z46)
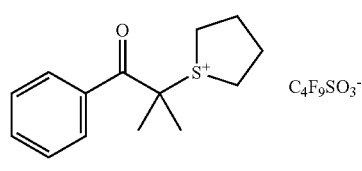

-continued

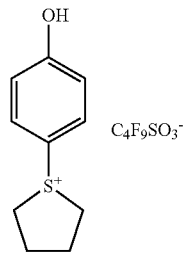
(z47)

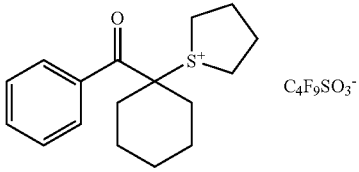
(z48)

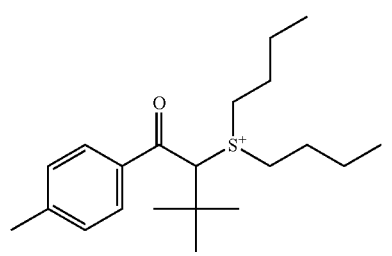
(z49)

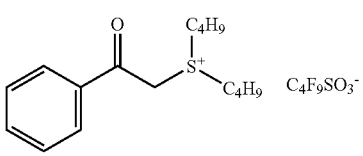
(z50)

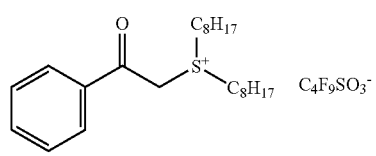
(z51)

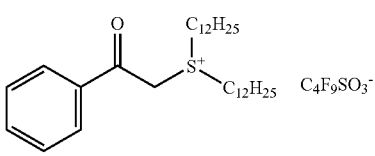
(z52)

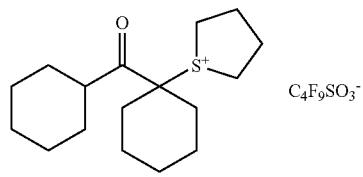
(z53)

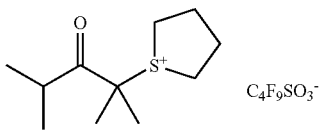
(z54)

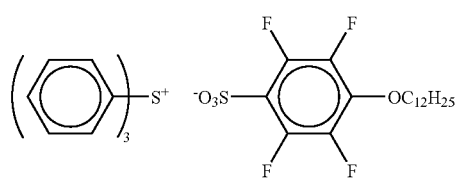
(z55)

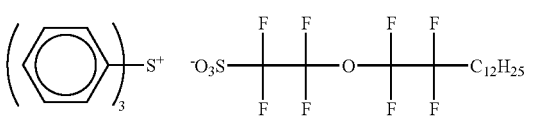
(z56)

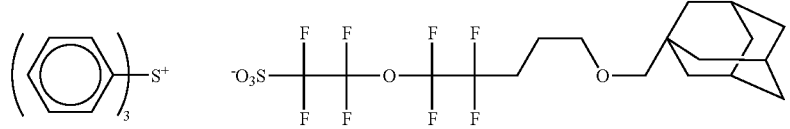
(z57)

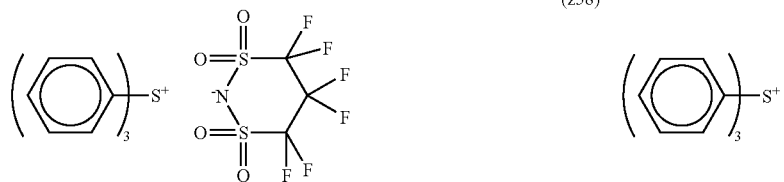
(z58)

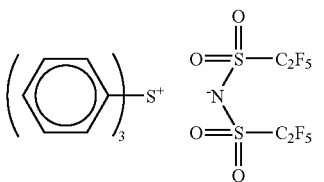
(z59)

[2] (B) A resin decomposable by the action of an acid and increasing the solubility in an alkali developer (hereinafter also referred to as component (B)):

A resin capable of decomposing by the action of an acid and increasing the solubility in an alkali developer for use in the positive photosensitive composition in the invention is a resin having a group decomposable by the action of an acid (hereinafter referred to as "an acid-decomposable group") on the main chain or side chain of the resin, or on both the main chain and side chain. A resin having a group decomposable by the action of an acid on the side chain is more preferred.

A preferred acid-decomposable group is a group obtained by substituting the hydrogen atom of a —COOH group or an —OH group with a group capable of being desorbed by an acid.

A particularly preferred acid-decomposable group in the invention is an acetal group or a tertiary ester group.

The parent resins in the case where the acid-decomposable group is bonded as the side chain are alkali-soluble resins having an —OH group or a —COOH group on the side chain. For example, the later-described alkali-soluble resins can be exemplified.

The alkali dissolution rate of these alkali-soluble resins is preferably 170 Å/sec or more when measured using 0.261N tetramethylammonium hydroxide (TMAH) at,23° C., particularly preferably 330 Å/sec or more.

From this point of view, particularly preferred alkali-soluble resins are o-, m-, p-poly(hydroxystyrene) and copolymers thereof, hydrogenated poly(hydroxystyrene), halogen- or alkyl-substituted poly(hydroxystyrene), a partially O-alkylated or O-acylated product of poly-(hydroxystyrene), styrene-hydroxystyrene copolymers, α-methylstyrene-hydroxystyrene copolymers, and alkali-soluble resins having a hydroxystyrene structural unit such as hydrogenated novolak resins.

As repeating units having a preferred acid-decomposable group, e.g., t-butoxycarbonyloxystyrene, 1-alkoxyethoxystyrene, and (meth)acrylic acid tertiary alkyl ester are exemplified, and 2-alkyl-2-adamantyl(meth)acrylate and dialkyl (1-adamantyl)methyl(meth)acrylate are more preferred.

Components (B) for use in the invention can be obtained, as disclosed in EP-254853, JP-A-2-25850, JP-A-3-223860 and JP-A-4-251259, by reacting an alkali-soluble resin with the precursor of an acid-decomposable group, or polymerizing an alkali-soluble resin monomer bonded with an acid-decomposable group with various monomers.

The specific examples of components (B) for use in the invention are shown below, but the invention is not limited thereto.

p-t-Butoxystyrene/p-hydroxystyrene copolymer,
p-(t-Butoxycarbonyloxy)styrene/p-hydroxystyrene copolymer,
p-(t-Butoxycarbonylmethyloxy)styrene/p-hydroxystyrene copolymer,
4-(t-Butoxycarbonylmethyloxy)-3-methylstyrene/4-hydroxy-3-methylstyrene copolymer,
p-(t-Butoxycarbonylmethyloxy)styrene/p-hydroxystyrene (10% hydrogenated product) copolymer,
m-(t-Butoxycarbonylmethyloxy)styrene/m-hydroxystyrene copolymer,
o-(t-Butoxycarbonylmethyloxy)styrene/o-hydroxystyrene copolymer,
p-(Cumyloxycarbonylmethyloxy)styrene/p-hydroxystyrene copolymer,
Cumyl methacrylate/methyl methacrylate copolymer,
4-t-Butoxycarbonylstyrene/dimethyl maleate copolymer,
Benzyl methacrylate/tetrahydropyranyl methacrylate copolymer,
p-(t-Butoxycarbonylmethyloxy)styrene/p-hydroxystyrene/styrene copolymer,
p-t-Butoxystyrene/p-hydroxystyrene/fumaronitrile copolymer,
t-Butoxystyrene/hydroxyethyl methacrylate copolymer,
Styrene/N-(4-hydroxyphenyl)maleimide/N-(4-t-butoxy-carbonyloxyphenyl)maleimide copolymer,
p-Hydroxystyrene/t-butyl methacrylate copolymer,
Styrene/p-hydroxystyrene/t-butyl methacrylate copolymer,
p-Hydroxystyrene/t-butyl acrylate copolymer,
Styrene/p-hydroxystyrene/t-butyl acrylate copolymer,
p-(t-Butoxycarbonylmethyloxy)styrene/p-hydroxystyrene/N-methylmaleimide copolymer,
t-Butyl methacrylate/1-adamantyl methyl methacrylate copolymer,
p-Hydroxystyrene/t-butyl acrylate/p-acetoxystyrene copolymer,
p-Hydroxystyrene/t-butyl acrylate/p-(t-butoxycarbonyl-oxy)styrene copolymer,
p-Hydroxystyrene/t-butyl acrylate/p-(t-butoxycarbonyl-methyloxy)styrene copolymer.

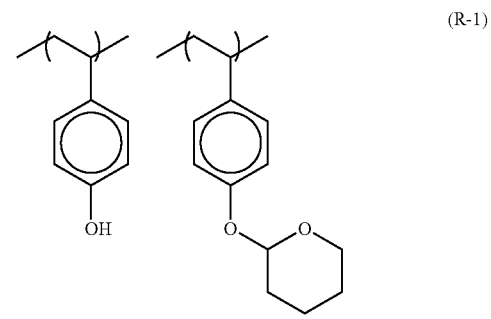

(R-1)

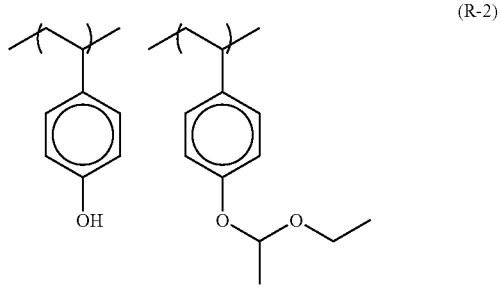

(R-2)

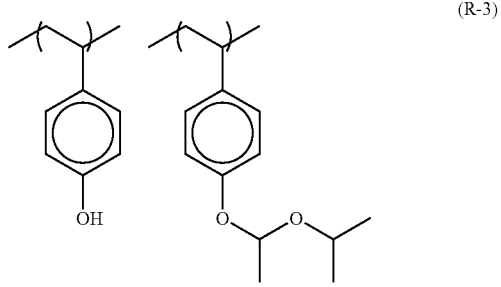

(R-3)

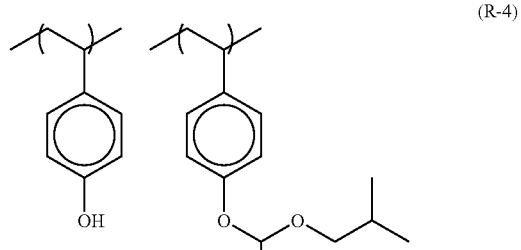

(R-4)

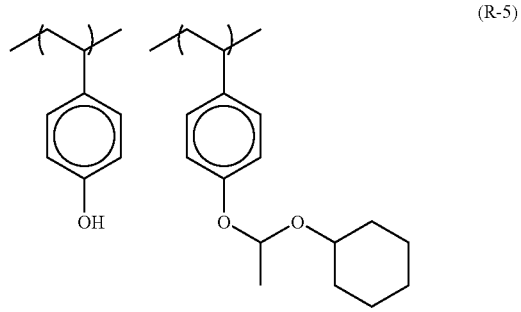

(R-5)

-continued
(R-6)
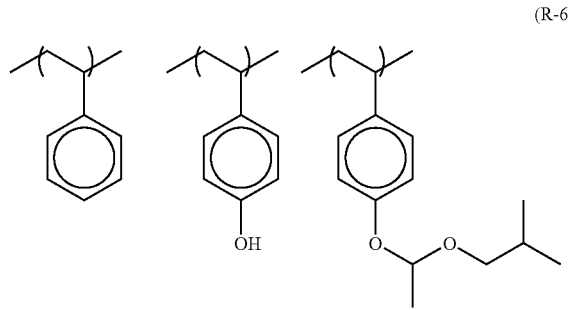
(R-7)
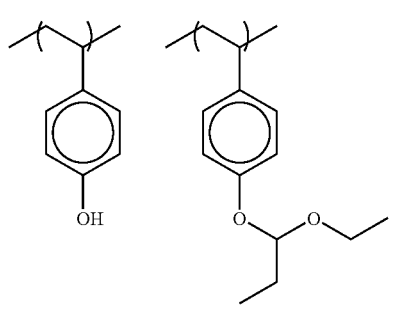
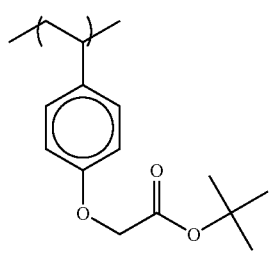
(R-8)
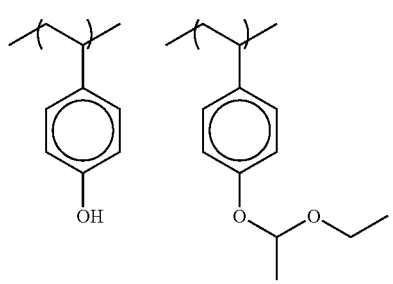
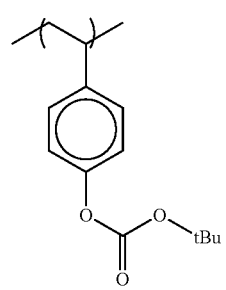
-continued
(R-9)
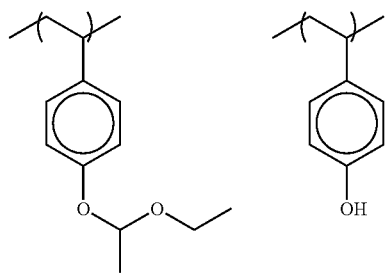
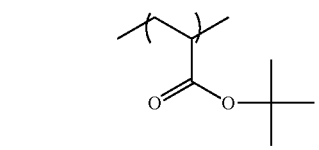
(R-10)
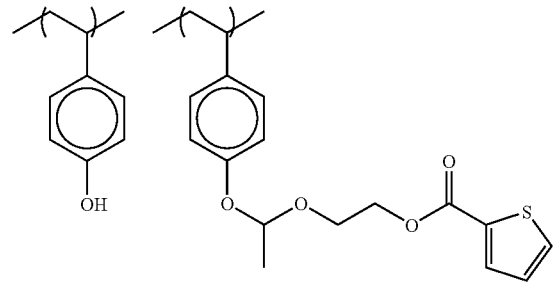
(R-11)
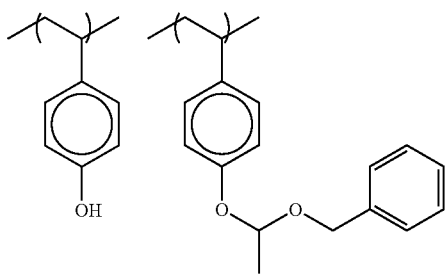
(R-12)
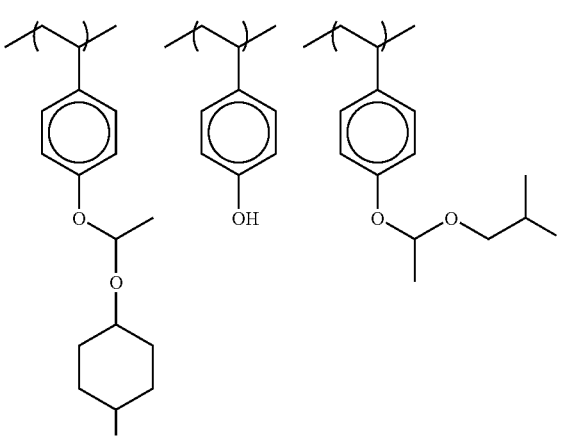

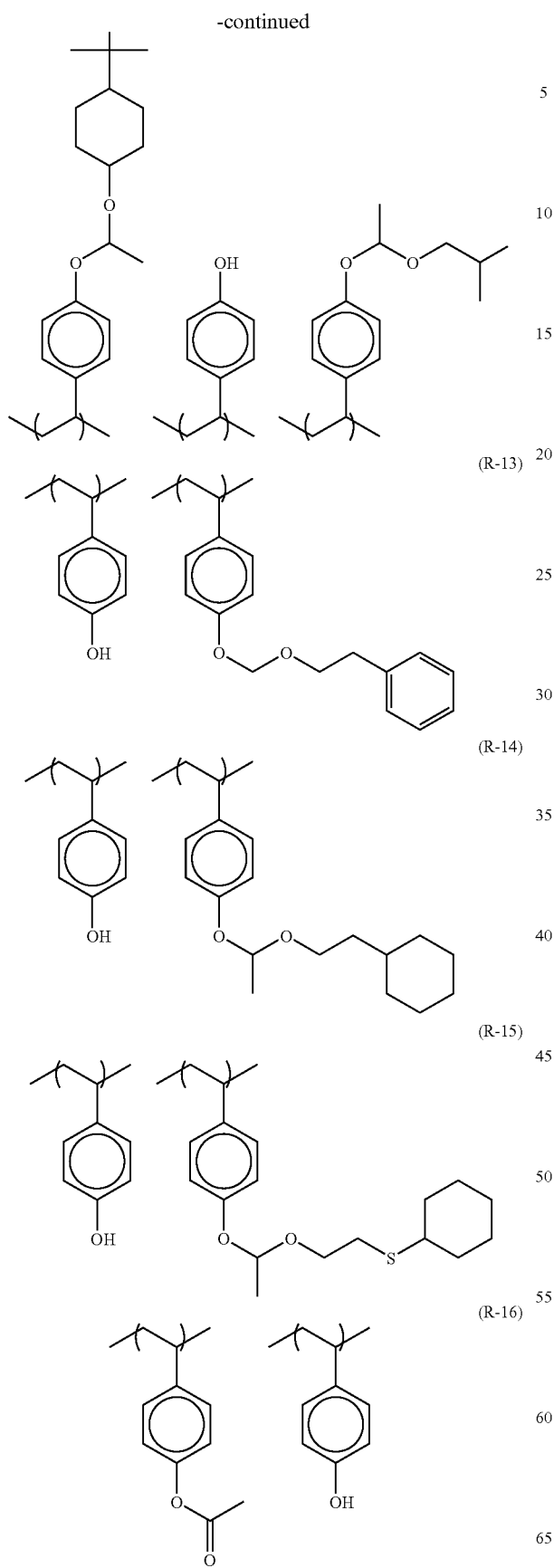
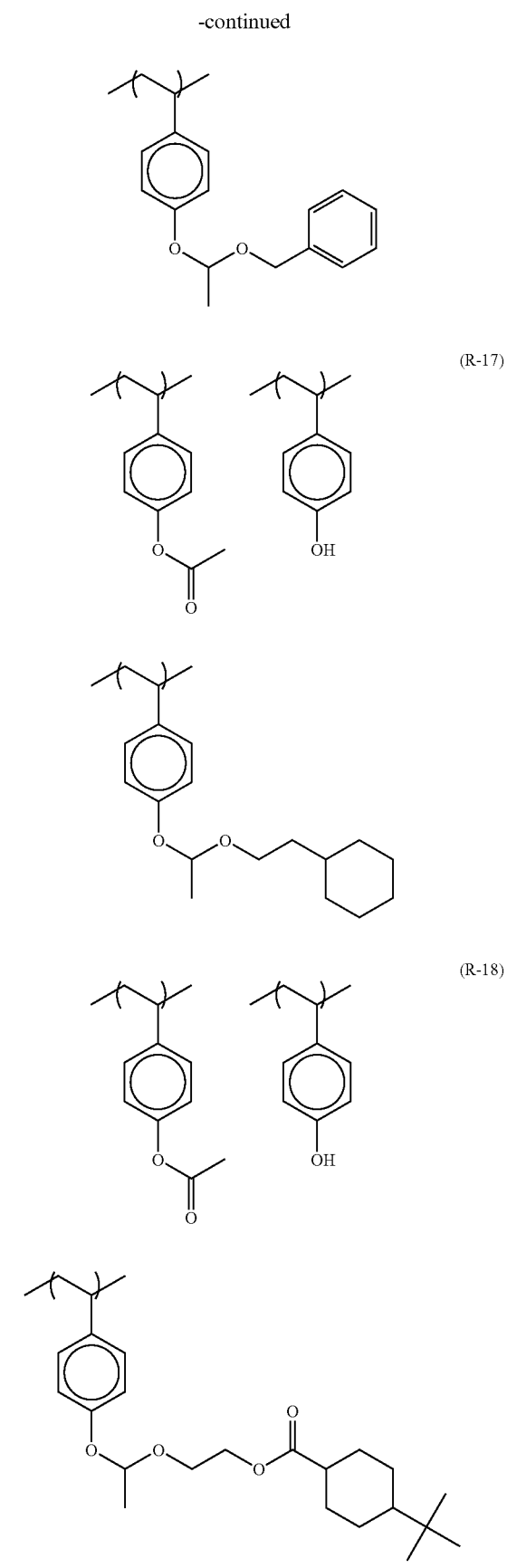

-continued
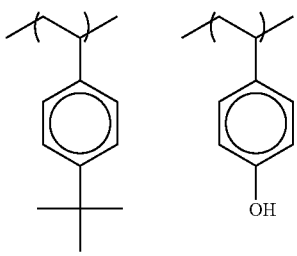 (R-19)
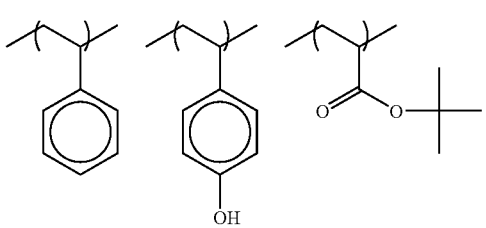 (R-23)
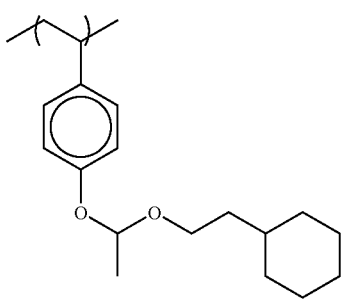
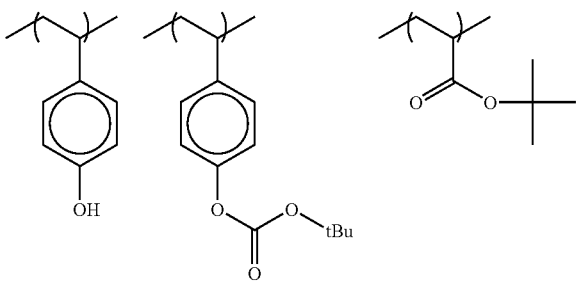 (R-24)
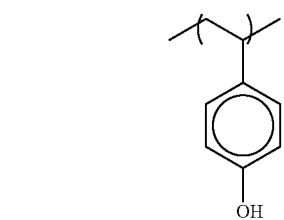 (R-20)
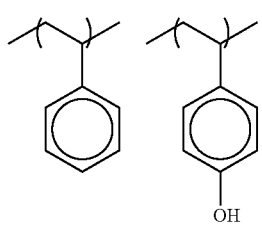 (R-25)
(R-21)
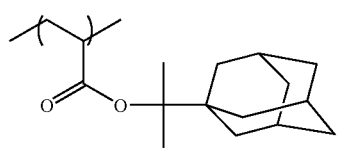
(R-22)
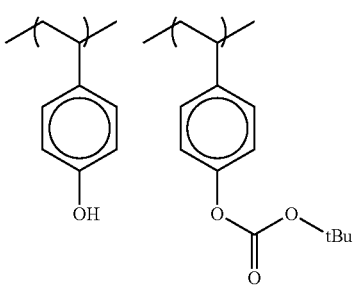 (R-26)

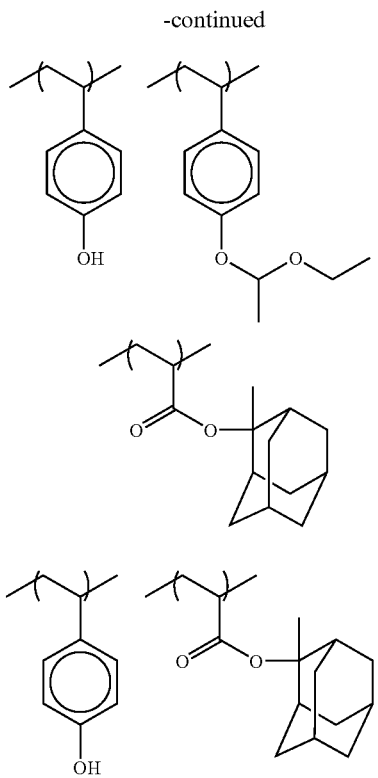

(R-27)

(R-28)

In the above specific examples, tBu means a t-butyl group.

The content of an acid-decomposable group is expressed by the equation of B/(B+S), taking the number of the acid-decomposable groups in a resin as (B), and the number of the alkali-soluble groups not protected with acid-eliminable groups as (S). The content is preferably from 0.01 to 0.7, more preferably from 0.05 to 0.50, and still more preferably from 0.05 to 0.40.

When the positive photosensitive composition in the invention is irradiated with ArF excimer laser beams, it is preferred that the resin of component (B) is a resin having a monocyclic or polycyclic alicyclic hydrocarbon structure and capable of decomposing by the action of an acid to thereby increase the solubility in an alkali developer.

As a resin having a monocyclic or polycyclic alicyclic hydrocarbon structure and capable of decomposing by the action of an acid to thereby increase the solubility in an alkali developer (hereinafter also referred to as "an alicyclic hydrocarbon-based acid-decomposable resin"), a resin containing at least one repeating unit selected from the group consisting of a repeating unit having a partial structure containing alicyclic hydrocarbon represented by any of the following formulae (pI) to (pVI), and a repeating unit represented by the following formula (II-AB) is preferred.

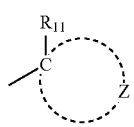

(pI)

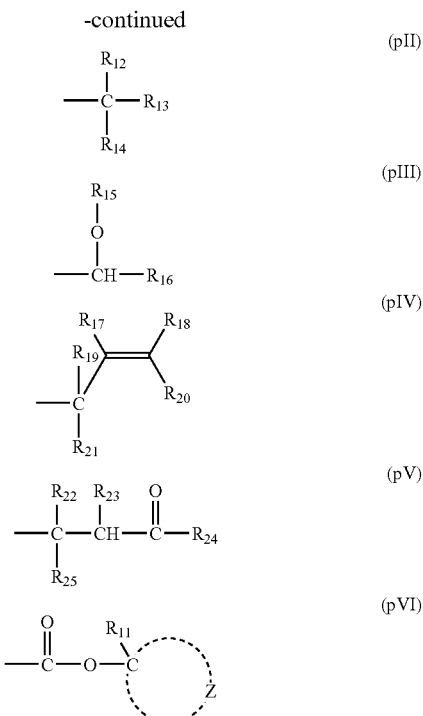

In formulae (pI) to (pVI), $R_{11}$ represents a methyl group, an ethyl group, an n-propyl group, an isopropyl group, an n-butyl group, an isobutyl group, or a sec-butyl group, and Z represents an atomic group necessary to form a cycloalkyl group together with carbon atoms.

$R_{12}$, $R_{13}$, $R_{14}$, $R_{15}$ and $R_{16}$ each represents a straight chain or branched alkyl group having from 1 to 4 carbon atoms, or a cycloalkyl group, provided that at least one of $R_{12}$ to $R_{14}$, or either $R_{14}$ or $R_{15}$ represents a cycloalkyl group.

$R_{17}$, $R_{18}$, $R_{19}$, $R_{20}$ and $R_{21}$ each represents a hydrogen atom, a straight chain or branched alkyl group having from 1 to 4 carbon atoms or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms or a cycloalkyl group.

$R_{22}$, $R_{23}$, $R_{24}$ and $R_{25}$ each represents a hydrogen atom, a straight chain or branched alkyl group having from 1 to 4 carbon atoms or a cycloalkyl group, provided that at least one of $R_{22}$ to $R_{25}$ represents a cycloalkyl group, and $R_{23}$ and $R_{24}$ may be bonded to each other to form a ring.

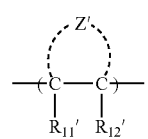

(II-AB)

In formula (II-AB), $R_{11}'$ and $R_{12}'$ each represents a hydrogen atom, a cyano group, a halogen atom or an alkyl group.

Z' contains bonded two carbon atoms (C—C) and represents an atomic group to form an alicyclic structure.

Formula (II-AB) is more preferably represented by the following formula (II-A) or (II-B).

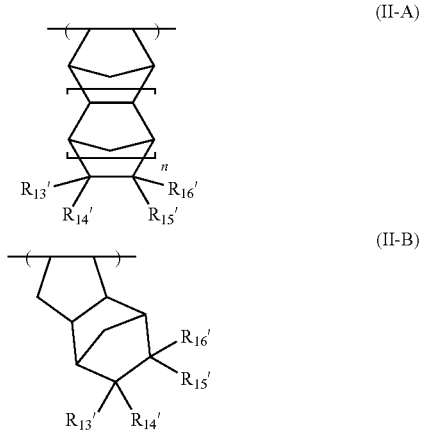

In formulae (II-A) and (II-B), $R_{13}'$, $R_{14}'$, $R_{15}'$ and $R_{16}'$ each represents a hydrogen atom, a halogen atom, a cyano group, —COOH, —COOR$_5$, a group decomposing by the action of an acid, —C(=O)—X-A'—R$_{17}'$, an alkyl group, or a cycloalkyl group.

$R_5$ represents an alkyl group, a cycloalkyl group, or —Y group shown below.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or —Y group shown below.

$R_6$ represents an alkyl group or a cycloalkyl group.

At least two of $R_{13}'$ to $R_{16}'$ may be bonded to form a ring; and n represents 0 or 1.

—Y group

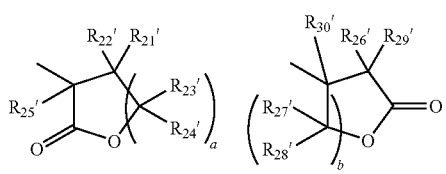

In —Y group, $R_{21}'$ to $R_{30}'$ each represents a hydrogen atom or an alkyl group; and a and b each represents 1 or 2.

In formulae (pI) to (pVI), the alkyl group represented by $R_{12}$ to $R_{25}$ is a straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of the substituents that the alkyl group may have, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The cycloalkyl groups represented by $R_{11}$ to $R_{25}$ or the cycloalkyl group formed by Z and carbon atoms may be monocyclic or polycyclic. Specifically, groups having a monocyclic, bicyclic, tricyclic or tetracyclic structure having 5 or more carbon atoms can be exemplified. The number of carbon atoms is preferably from 6 to 30, and particularly preferably from 7 to 25. These cycloalkyl groups may have a substituent.

As preferred cycloalkyl groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred cycloalkyl groups are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these cycloalkyl groups, an alkyl group, a halogen atom, a hydroxyl group, an alkoxyl group, a carboxyl group and an alkoxycarbonyl group can be exemplified. As the alkyl group, lower alkyl groups, e.g., a methyl group, an ethyl group, a propyl group, an isopropyl group and a butyl group are preferred, and more preferably a methyl group, an ethyl group, a propyl group and an isopropyl group. As the alkoxyl group, alkoxyl groups having from 1 to 4 carbon atoms, e.g., a methoxy group, an ethoxy group, a propoxy group and a butoxy group can be exemplified. As the substituents that these alkyl group, alkoxyl group and alkoxycarbonyl group may further have, a hydroxyl group, a halogen atom and an alkoxyl group can be exemplified.

The structures represented by formulae (pI) to (pVI) in the resin can be used for the protection of alkali-soluble groups. As the alkali-soluble groups, various groups well known in this technical field can be exemplified.

Specifically, as the alkali-soluble groups, a carboxylic acid group, a sulfonic acid group, a phenol group and a thiol group are exemplified, preferably a carboxylic acid group and a sulfonic acid group.

As the alkali-soluble groups protected with the structures represented by the above formulae (pI) to (pVI) in the above resins, the structures wherein the hydrogen atom of the carboxyl group is substituted with the structures represented by formulae (pI) to (pVI) are preferably exemplified.

As the repeating unit having the alkali-soluble group protected with the structure represented by any of the above formulae (pI) to (pVI), a repeating unit represented by the following formula (pA) is preferred.

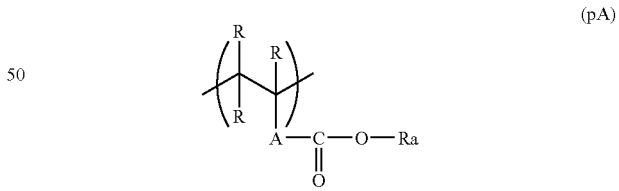

In formula (pA), R represents a hydrogen atom, a halogen atom or a straight chain or branched alkyl group having from 1 to 4 carbon atoms, and a plurality of R's may be the same or different.

A represents a single group or the combination of two or more groups selected from the group consisting of a single bond, an alkylene group, an ether group, a thioether group, a carbonyl group, an ester group, an amido group, a sulfonamido group, a urethane group and a urea group.

Ra represents a group represented by any of formulae (pI) to (pVI).

The repeating unit represented by (pA) is most preferably a repeating unit by 2-alkyl-2-adamantyl(meth)acrylate and dialkyl(1-adamantyl)methyl(meth)acrylate.
The specific examples of the repeating units represented by formula (pA) are shown below.
(In the formulae, Rx represents H, CH₃ or CF₃.)
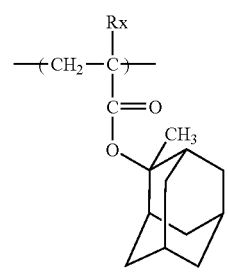
1
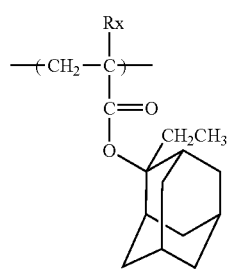
2
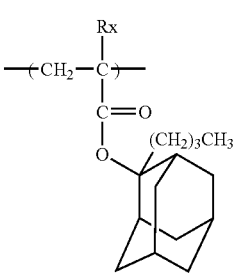
3
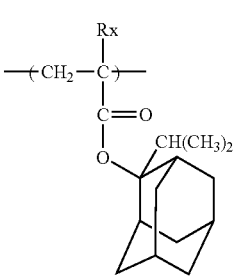
4
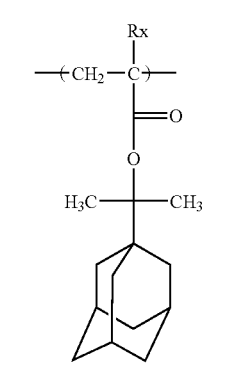
5
-continued
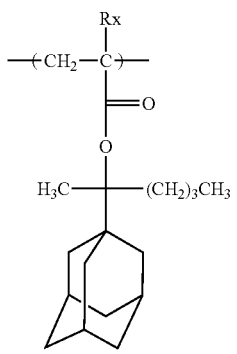
6
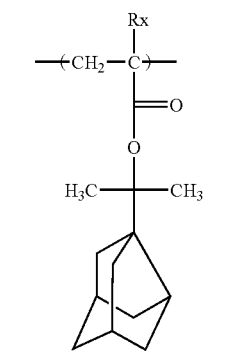
7
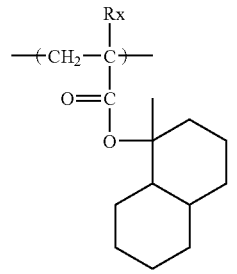
8
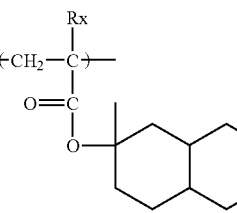
9
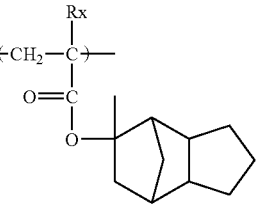
10
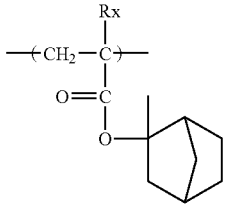
11

-continued

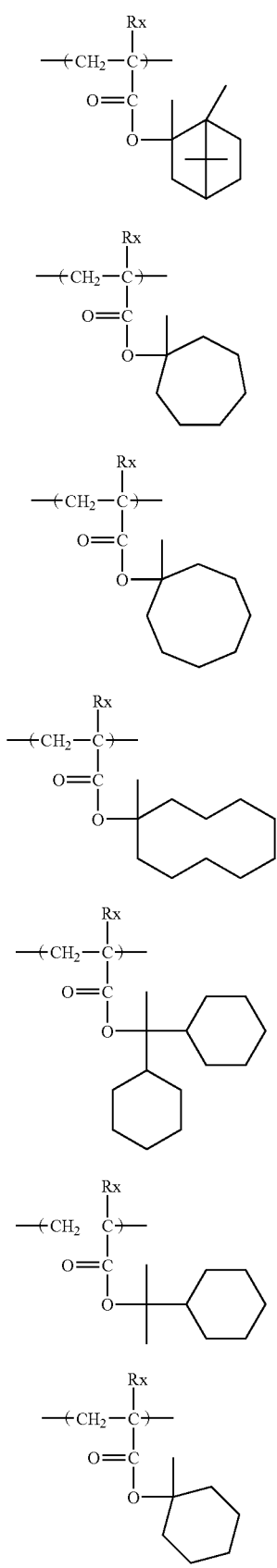

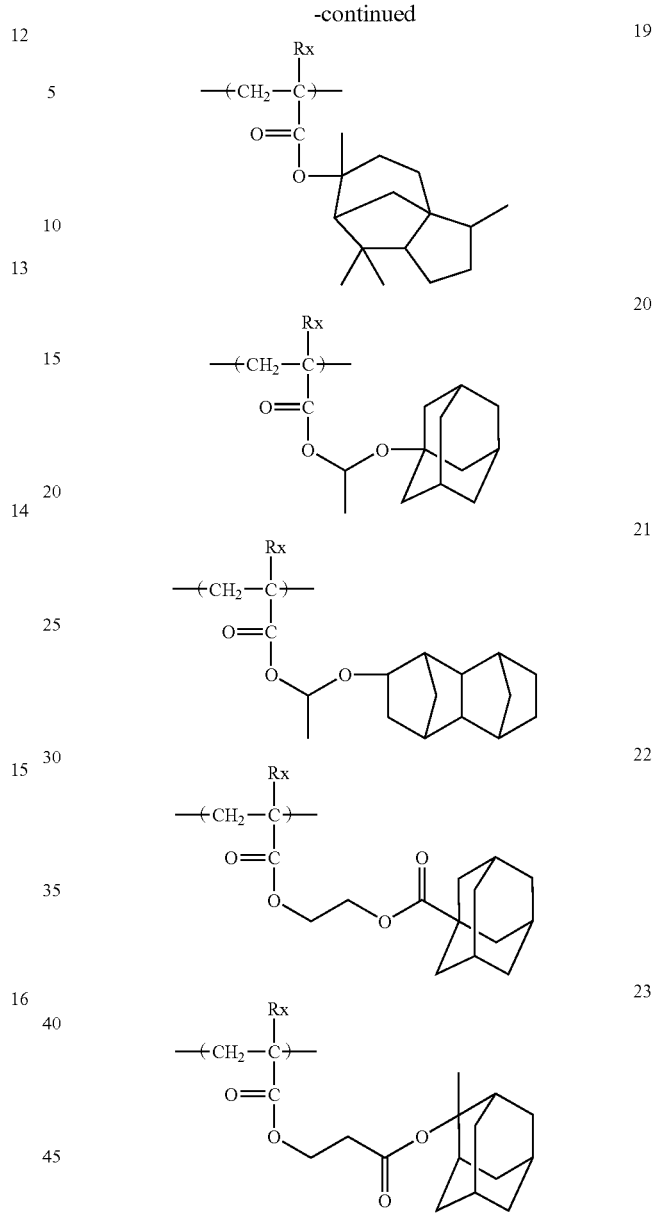

In formula (II-AB), $R_{11}'$ and $R_{12}'$ each represents a hydrogen atom, a cyano group, a halogen atom or an alkyl group.

$Z'$ contains bonded two carbon atoms (C—C) and represents an atomic group to form an alicyclic structure.

As the halogen atoms represented by $R_{11}'$ and $R_{12}'$, a chlorine atom, a bromine atom, a fluorine atom and an iodine atom are exemplified.

As the alkyl groups represented by $R_{11}'$, $R_{12}'$ and $R_{21}'$ to $R_{30}'$, straight chain or branched alkyl groups having from 1 to 10 carbon atoms are preferred, straight chain or branched alkyl groups having from 1 to 6 carbon atoms are more preferred, and a methyl group, an ethyl group, a propyl group, an isopropyl group, an n-butyl group, an isobutyl group, a sec-butyl group and a t-butyl group are still more preferred.

As further substituents of the alkoxyl group, a hydroxyl group, a halogen atom, a carboxyl group, an alkoxyl group, an acyl group, a cyano group and an acyloxy group can be exemplified. As the halogen atom, a chlorine atom, a bromine atom, a fluorine atom, an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The atomic group represented by Z' to form an alicyclic structure is an atomic group for forming a repeating unit of alicyclic hydrocarbon, which may have a substituent, in a resin, and an atomic group to form a crosslinking alicyclic structure to form a repeating unit having crosslinking alicyclic hydrocarbon is preferred above all.

As the skeleton of alicyclic hydrocarbon formed, the same cycloalkyl groups as represented by $R_{11}$ to $R_{25}$ in formulae (pI) to (pVI) are exemplified.

The skeleton of the alicyclic hydrocarbon may have a substituent, and as the substituents, the groups represented by $R_{13}'$ to $R_{16}'$ in formula (II-A) or (II-B) can be exemplified.

Of the repeating units having crosslinking alicyclic hydrocarbon, the repeating units represented by formula (II-A) or (II-B) are more preferred.

In the alicyclic hydrocarbon-based acid-decomposable resin in the invention, the acid-decomposable group may be contained in $—C(=O)—X—A'—R_{17}'$, or may be contained as the substituent of Z' in formula (II-AB).

The structure of the acid-decomposable group is represented by formula $—C(=O)—X_1—R_0$.

In the formula, $R_0$ represents a tertiary alkyl group, e.g., a t-butyl group or a t-amyl group, an isoboronyl group, a 1-alkoxyethyl group, e.g., a 1-ethoxyethyl group, a 1-butoxyethyl group, a 1-isobutoxyethyl group, or a 1-cyclohexyloxyethyl group, an alkoxymethyl group, e.g., a 1-methoxymethyl group or a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone residue. $X_1$ has the same meaning as X above.

As the halogen atoms represented by $R_{13}'$, $R_{14}'$, $R_{15}'$ and $R_{16}'$ in formulae (II-A) and (II-B), a chlorine atom, a bromine atom, a fluorine atom and an iodine atom can be exemplified.

The alkyl groups represented by $R_5$, $R_6$, $R_{13}'$ to $R_{16}'$, $R_{21}'$ to $R_{30}'$ are preferably straight chain or branched alkyl groups having from 1 to 10 carbon atoms, more preferably straight chain or branched alkyl groups having from 1 to 6 carbon atoms, and still more preferably a methyl group, an ethyl group, a propyl group, an isopropyl group, an n-butyl group, an isobutyl group, a sec-butyl group and t-butyl.

The cycloalkyl groups represented by $R_5$, $R_6$, $R_{13}'$ to $R_{16}'$ are, e.g., monocyclic cycloalkyl groups and crosslinked hydrocarbons, and, e.g., a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group, and a tetracyclododecanyl group can be exemplified.

As the rings formed by the bonding of at least two of $R_{13}'$ and $R_{16}'$, rings having from 5 to 12 carbon atoms, e.g., cyclopentene, cyclohexene, cycloheptane and cyclooctane can be exemplified.

As the alkoxyl group represented by $R_{17}'$, an alkoxyl group having from 1 to 4 carbon atoms, e.g., a methoxy group, an ethoxy group, a propoxy group or a butoxy group can be exemplified.

As further substituents of the alkyl, cycloalkyl and alkoxyl groups, a hydroxyl group, a halogen atom, a carboxyl group, an alkoxyl group, an acyl group, a cyano group, an acyloxy group, an alkyl group, and a cycloalkyl group can be exemplified. As the halogen atom, a chlorine atom, a bromine atom, a fluorine atom and an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The alkyl groups and cycloalkyl groups are the same as those described above.

As the divalent linking group represented by A', a single group or combinations comprising two or more groups selected from the group consisting of an alkylene group, an ether group, a thioether group, a carbonyl group, an ester group, an amido group, a sulfonamido group, a urethane group and a urea group.

In the alicyclic hydrocarbon-based acid-decomposable resin in the invention, a group capable of decomposing by the action of an acid can be contained in at least one repeating unit of a repeating unit having a partial structure containing alicyclic hydrocarbon represented by formula (pI), (pII), (pIII) or (pIV), a repeating unit represented by formula (II-AB), and a repeating unit of the later-described copolymer component.

Various substituents of $R_{13}'$ to $R_{16}'$ in formula (II-A) or (II-B) can also be used as the substituents of the atomic group to form an alicyclic structure in formula (II-AB), or atomic group Z to form a crosslinking alicyclic structure.

The specific examples of the repeating units represented by formula (II-A) or (II-B) are shown below, but the invention is not limited thereto.

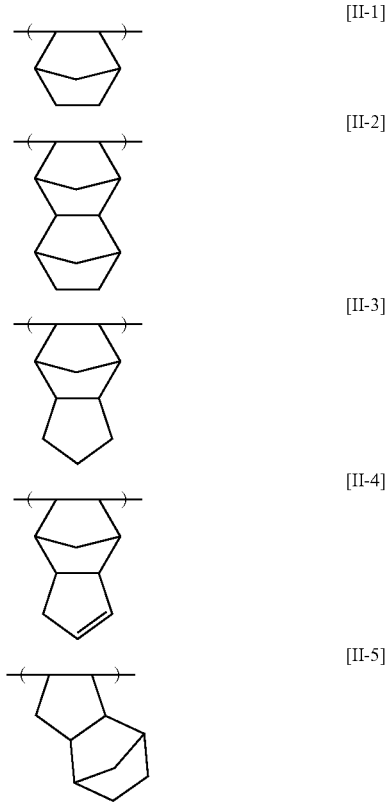

-continued
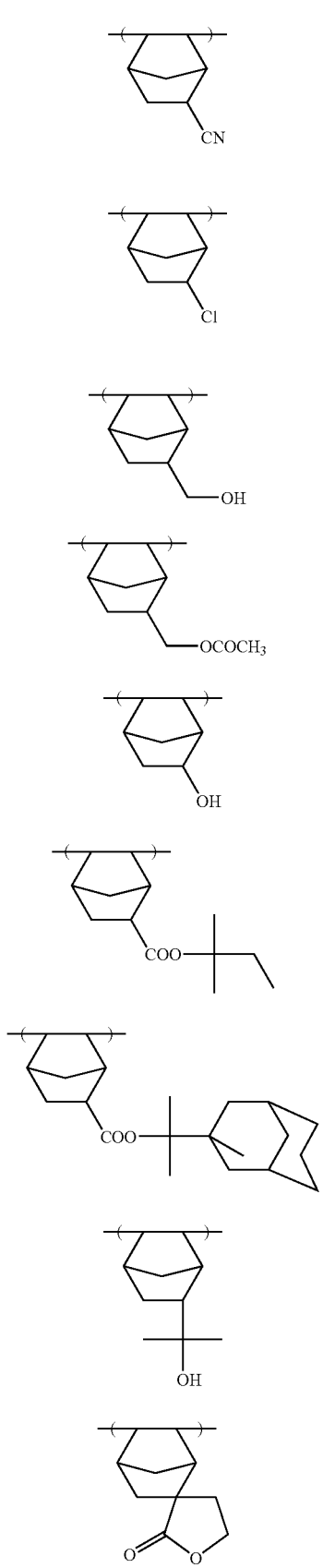
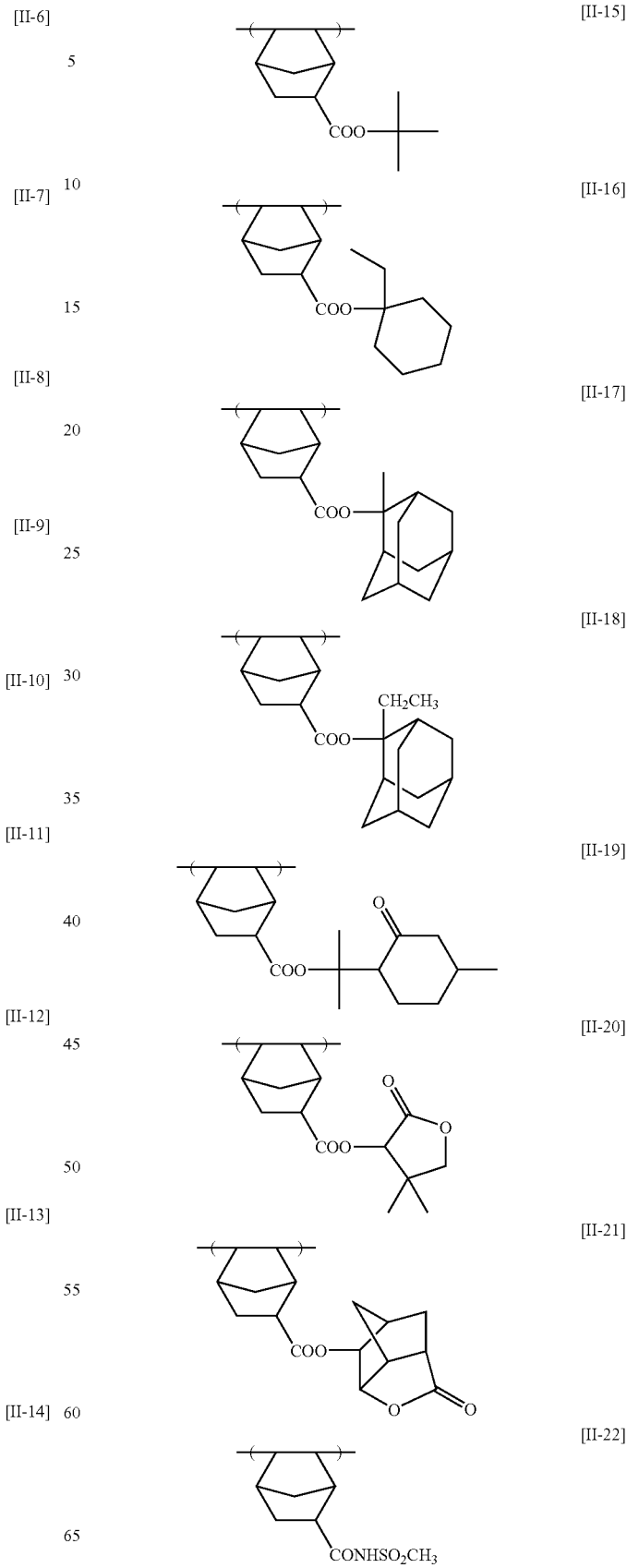

-continued
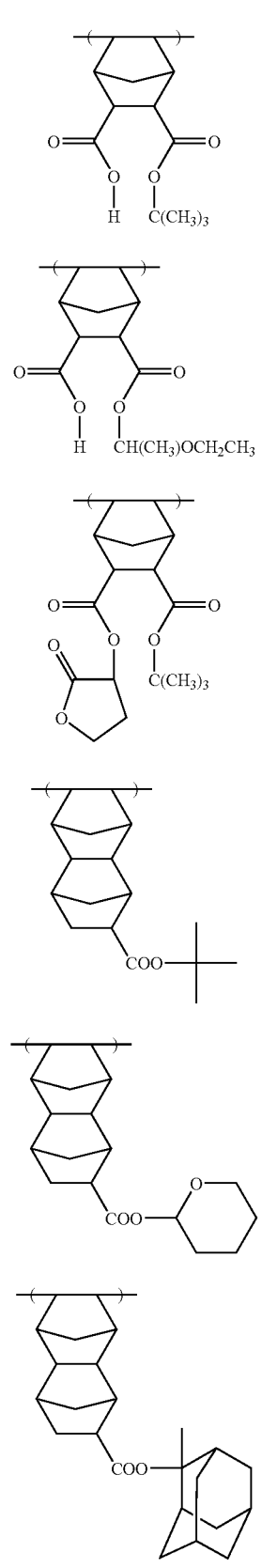
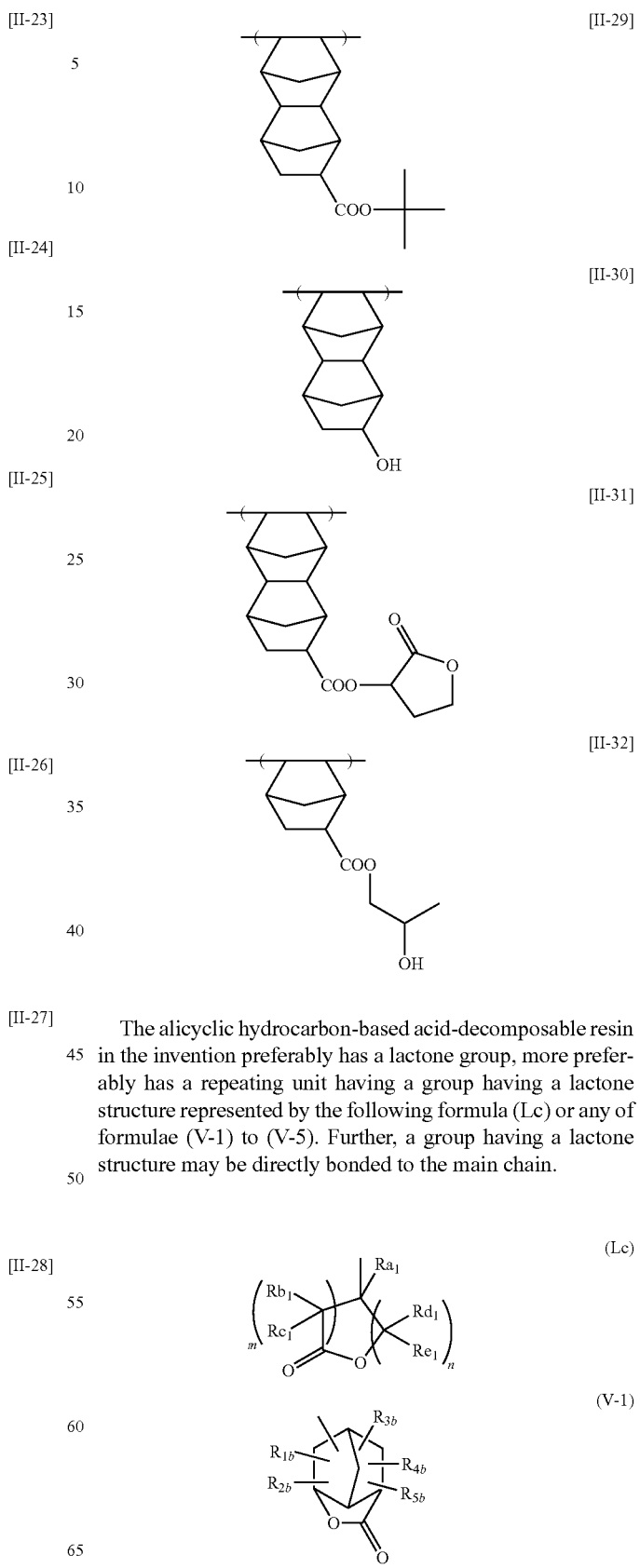
The alicyclic hydrocarbon-based acid-decomposable resin in the invention preferably has a lactone group, more preferably has a repeating unit having a group having a lactone structure represented by the following formula (Lc) or any of formulae (V-1) to (V-5). Further, a group having a lactone structure may be directly bonded to the main chain.

-continued

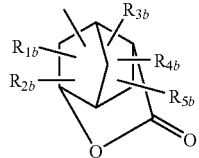
(V-2)

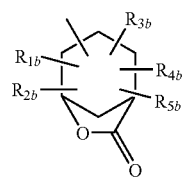
(V-3)

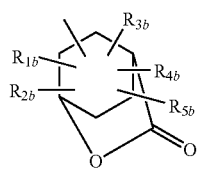
(V-4)

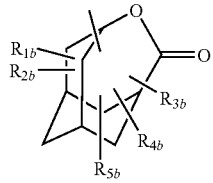
(V-5)

In formula (Lc), $Ra_1$, $Rb_1$, $Rc_1$, $Rd_1$ and $Re_1$ each represents a hydrogen atom or an alkyl group; m and n each represents an integer of from 0 to 3, and m+n is from 2 to 6.

In formulae (V-1) to (V-5), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkylsulfonyl-imino group or an alkenyl group. Two of $R_{1b}$ to $R_{5b}$ may be bonded to form a ring.

As the alkyl groups represented by $Ra_1$ to $Re_1$ in formula (Lc), and the alkyl groups in the alkyl groups, alkoxyl groups, alkoxycarbonyl groups and alkylsulfonylimino groups represented by $R_{1b}$ to $R_{5b}$ in formulae (V-1) to (V-5), straight chain or branched alkyl groups are exemplified, and these alkyl groups may have a substituent. As the preferred substituents, a hydroxyl group, a halogen atom, a carboxyl group, an alkoxyl group, an acyl group, a cyano group, an acyloxy group and a cycloalkyl group can be exemplified.

As the repeating units having a group having a lactone structure represented by formula (Lc) or any of formulae (V-1) to (V-5), a repeating unit in which at least one of $R_{13}'$ to $R_{16}'$ in formula (II-A) or (II-B) has a group represented by formula (Lc) or any of formulae (V-1) to (V-5) (for example, $R_5$ in —$COOR_5$ represents a group represented by formula (Lc) or any of formulae (V-1) to (V-5)), or a repeating unit represented by the following formula (AI) can be exemplified.

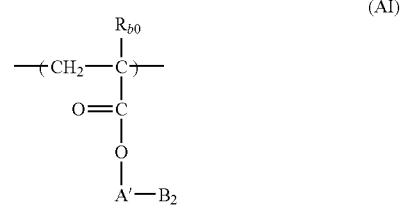
(AI)

In formula (AI), $R_{b0}$ represents a hydrogen atom, a halogen atom, or an alkyl group having from 1 to 4 carbon atoms. As the preferred substituents that the alkyl group represented by $R_{b0}$ may have, those described above as the preferred substituents that the alkyl group represented by $R_{1b}$ in formulae (V-1) to (V-5) may have can be exemplified.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group combining these groups.

$B_2$ represents a group represented by formula (Lc) or any of formulae (V-1) to (V-5).

The specific examples of repeating units having a group having a lactone structure are shown below, but the invention is not limited thereto.

(In the formulae, Rx represents H, $CH_3$ or $CF_3$.)

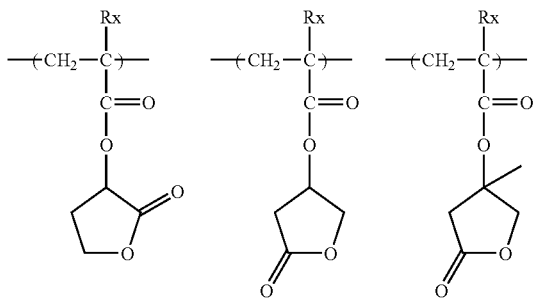

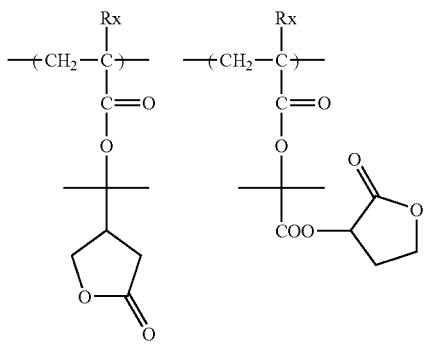

-continued
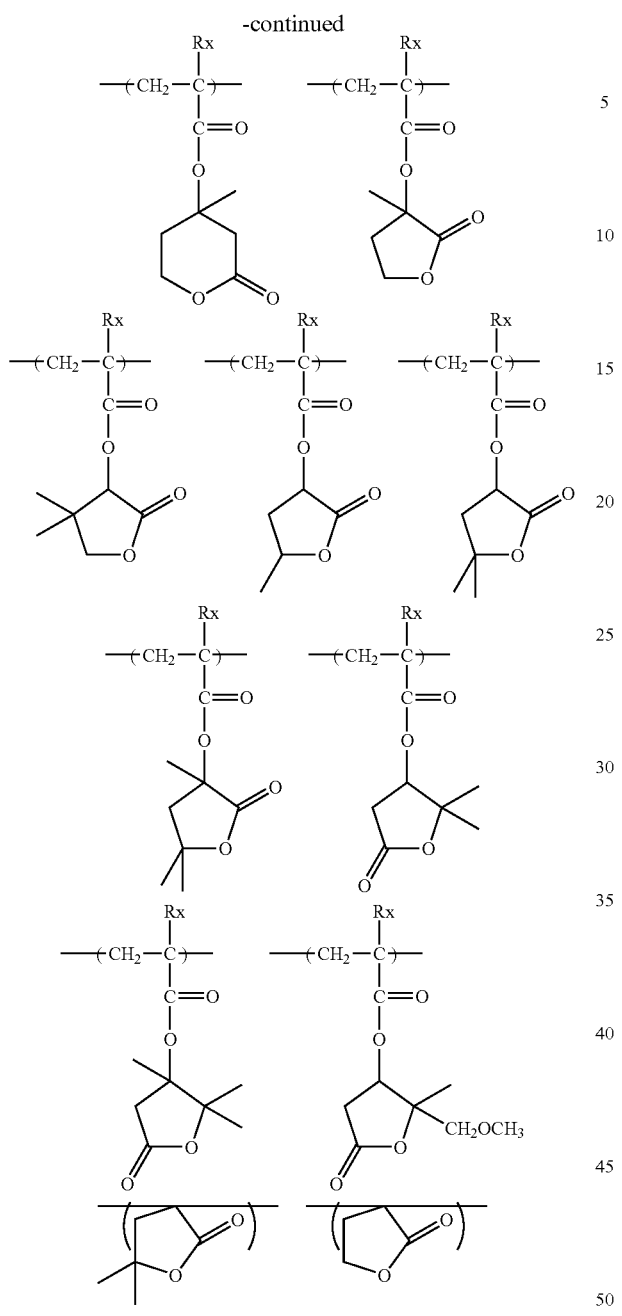
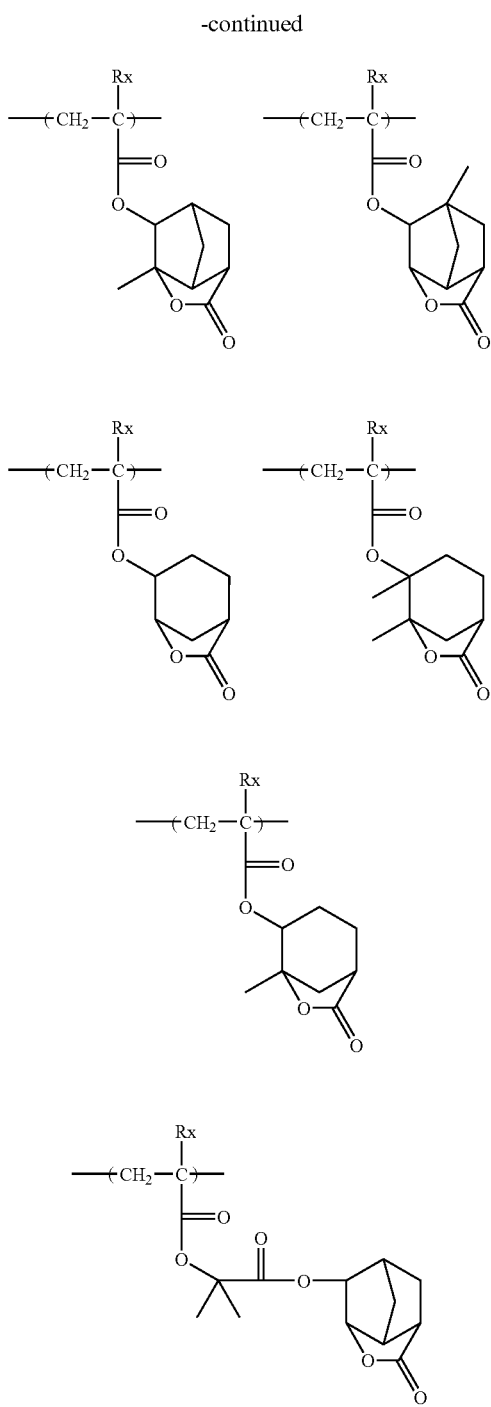
(In the formulae, Rx represents H, CH₃ or CF₃.)

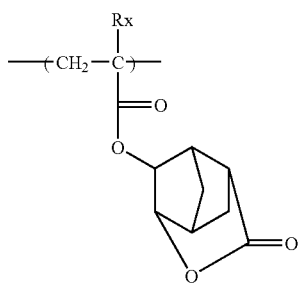
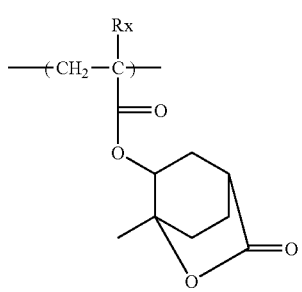
(In the formulae, Rx represents H, CH₃ or CF₃.)
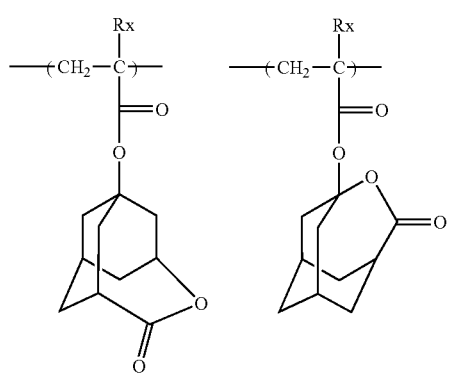
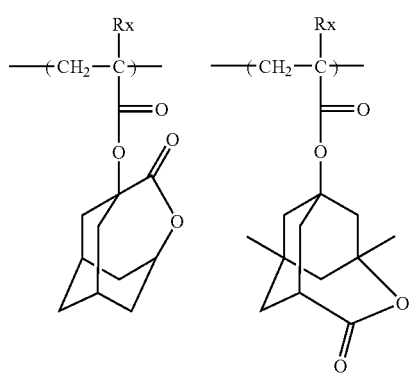
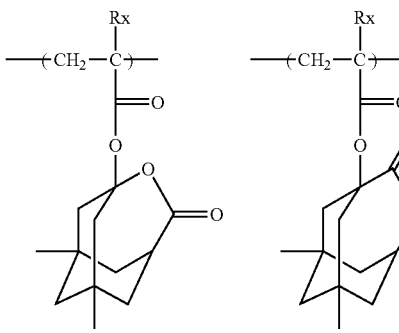
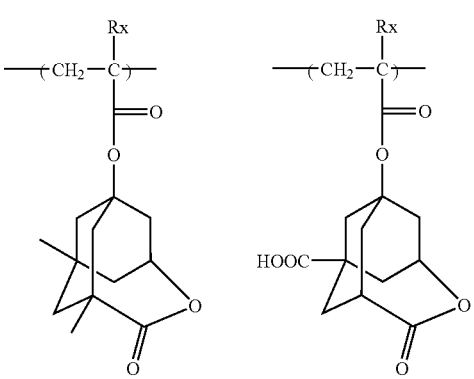
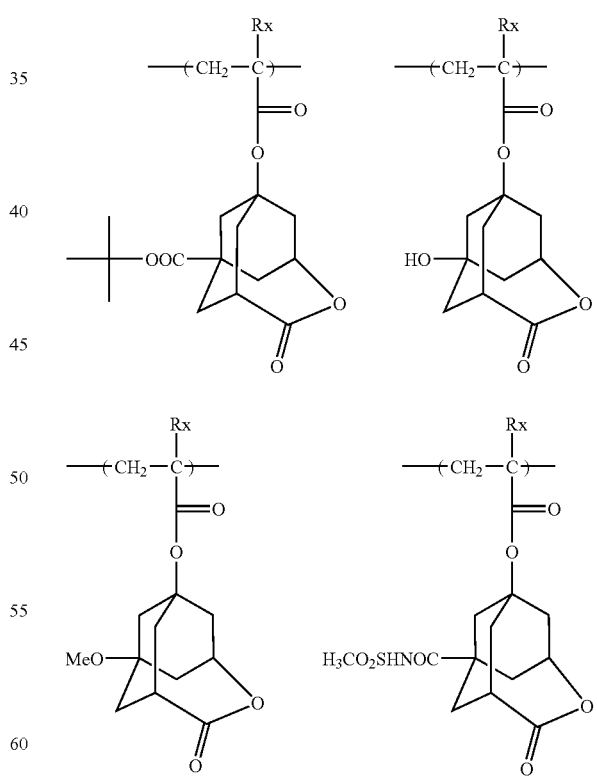
The alicyclic hydrocarbon-based acid-decomposable resin in the invention may contain a repeating unit having an adamantane skeleton having a group represented by the following formula (VII).

(VII)

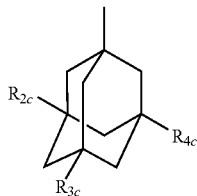

In formula (VII), $R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group.

The group represented by formula (VII) is preferably a dihydroxy body or a monohydroxy body, more preferably a dihydroxy body.

As the repeating unit having a group represented by formula (VII), a repeating unit in which at least one of $R_{13}'$ to $R_{16}'$ in formula (II-A) or (II-B) has a group represented by formula (VII) (for example, $R_5$ in —COOR$_5$ represents a group represented by formula (VII)), or a repeating unit represented by the following formula (AII) can be exemplified.

(AII)

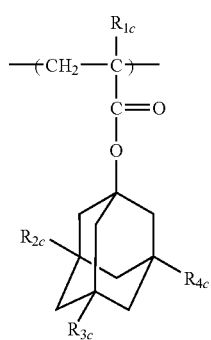

In formula (AII), $R_{1c}$ represents a hydrogen atom or a methyl group.

$R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not limited thereto.

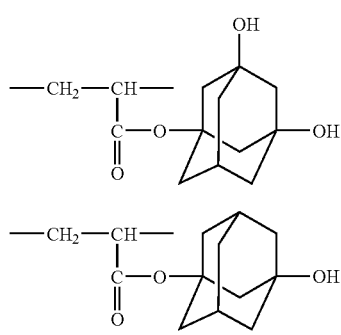

(1)

(2)

-continued

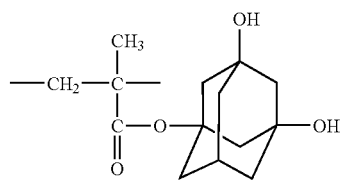

(3)

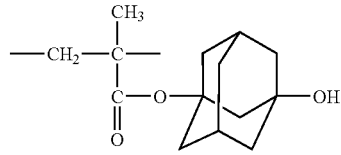

(4)

The alicyclic hydrocarbon-based acid-decomposable resin in the invention may contain a repeating unit represented by the following formula (VIII).

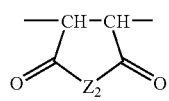

(VIII)

In formula (VIII), $Z_2$ represents —O— or —N(R$_{41}$)—; $R_{41}$ represents a hydrogen atom, a hydroxyl group, an alkyl group or —OSO$_2$—R$_{42}$; and $R_{42}$ represents an alkyl group, a cycloalkyl group, or a camphor residue. The alkyl group represented by $R_{41}$ and $R_{42}$ may be substituted with a halogen atom (preferably a fluorine atom), etc.

The specific examples of the repeating units represented by formula (VIII) are shown below, but the invention is not limited thereto.

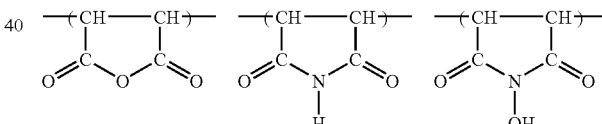

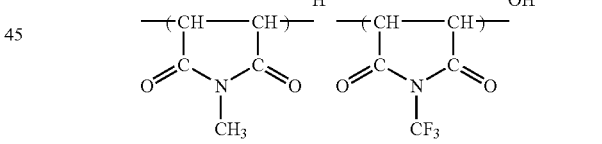

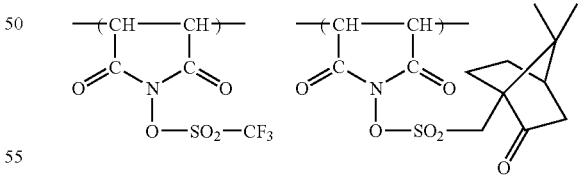

It is preferred for the alicyclic hydrocarbon-based acid-decomposable resin in the invention to have a repeating unit having an alkali-soluble group, and more preferred to have a repeating unit having a carboxyl group. By containing this repeating unit, the resolution in contact hole use increases. A repeating unit in which a carboxyl group is directly bonded to the main chain of a resin, such as a repeating unit by an acrylic acid or a methacrylic acid, and a repeating unit in which a carboxyl group is bonded to a main chain of a resin via a linking group are preferred as repeating units having a carboxyl group, and the linking group may have either a monocyclic or polycyclic hydrocarbon structure. A repeating unit by acrylic acid or methacrylic acid is most preferred.

The alicyclic hydrocarbon-based acid-decomposable resin in the invention may have various repeating structural units besides the above repeating units for the purpose of adjusting dry etching resistance, an aptitude for standard developers, adhesion to substrates, resist profile, and in addition to these, general requisite characteristics of resists, e.g., resolution, heat resistance and sensitivity.

As these repeating structural units, the repeating structural units corresponding to monomers shown below can be exemplified, but the invention is not limited thereto.

By containing various kinds of repeating structural units, fine adjustment of performances required of the alicyclic hydrocarbon-based acid-decomposable resins, in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacrylamides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the alicyclic hydrocarbon-based acid-decomposable resins, the molar ratio of the content of each repeating structural unit is arbitrarily selected to adjust dry etching resistance, an aptitude for a standard developer, adhesion to a substrate, and resist profile, in addition to these, to adjust general requisite characteristics of resists, e.g., resolution, heat resistance and sensitivity.

The preferred embodiments of the alicyclic hydrocarbon-based acid-decomposable resins in the invention include the following.

(1) Resins containing a repeating unit having a partial structure containing the alicyclic hydrocarbon represented by any of formulae (pI) to (pVI) (a side chain type).
(2) Resins containing a repeating unit represented by formula (II-AB) (a main chain type), and the following embodiment is further exemplified in (2).
(3) Resins containing a repeating unit represented by formula (II-AB), a maleic anhydride derivative and a (meth)acrylate structure (a hybrid type).

In the alicyclic hydrocarbon-based acid-decomposable resins, the content of a repeating unit having an acid decomposable group is preferably from 10 to 60 mol % in all the repeating structural units, more preferably from 20 to 50 mol %, and still more preferably from 25 to 40 mol %.

It is preferred that the alicyclic hydrocarbon series acid-decomposable resin contains at least one methacrylate repeating unit, and at least one acrylate repeating unit. The ratio of the acrylate repeating unit and the methacrylate repeating unit is generally from 10/90 to 90/10 in a molar ratio, preferably from 20/80 to 80/20, more preferably from 30/70 to 70/30, and most preferably from 40/60 to 60/40.

In the alicyclic hydrocarbon-based acid-decomposable resins, the content of a repeating unit having a partial structure containing alicyclic hydrocarbon represented by any of formulae (pI) to (pVI) is preferably from 30 to 70 mol % in all the repeating structural units, more preferably from 35 to 65 mol %, and still more preferably from 40 to 60 mol %.

In the alicyclic hydrocarbon-based acid-decomposable resins, the content of a repeating unit represented by formula (II-AB) is preferably from 10 to 60 mol % in all the repeating structural units, more preferably from 15 to 55 mol %, and still more preferably from 20 to 50 mol %.

The content of repeating structural units on the basis of the monomers of the further copolymer components in the resin can also be optionally set according to the desired resist performances, and the content is generally preferably 99 mol % or less based on the total mol number of a repeating structural unit having a partial structure containing alicyclic hydrocarbon represented by any of formulae (pI) to (pVI) and a repeating unit represented by formula (II-AB), more preferably 90 mol % or less, and still more preferably 80 mol % or less.

When the photosensitive composition according to the invention is a composition for ArF exposure, it is preferred that the resin should not contain an aromatic group from the point of the transparency to ArF light.

The alicyclic hydrocarbon-based acid-decomposable resins for use in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent such as ethers, e.g., tetrahydrofuran, 1,4-dioxane or diisopropyl ether, ketones, e.g., methyl ethyl ketone or methyl isobutyl ketone, an ester solvent, e.g., ethyl acetate, or the later-described solvents capable of dissolving the composition of the invention, e.g., propyelne glycol monomethyl ether acetate, to make the monomer homogeneous. The solution is then heated, if necessary, under the inert gas atmosphere such as nitrogen or argon, and polymerization is initiated with commercially available radical polymerization initiator (e.g., azo initiators, peroxide and the like). If necessary, the initiator is further added at a time or in parts, and after completion of the reaction, the reaction product is put in a solvent, and the desired polymer is recovered as powder or solid. The reaction concentration is 20 mass % or more, preferably 30 mass % or more, and more preferably 40 mass % or more. The reaction temperature is from 10 to 150° C., preferably from 30 to 120° C., and more preferably from 50 to 100° C.

When the photosensitive composition according to the invention is used in the upper layer resist of a multilayer resist, it is preferred that the resin of component (B) should have a silicon atom. As resins having a silicon atom and capable of decomposing by the action of an acid to thereby increase the solubility in an alkali developer, resins having a silicon atom at least on one side of the main chain and the side chain can be used. As resins having a siloxane structure on the side chain of resins, the copolymer of, e.g., an olefin monomer having a silicon atom on the side chain, and a (meth)acrylic acid monomer having maleic anhydride and an acid decomposable group on the side chain. As resins having a silicon atom, resins having a trialkylsilyl structure and a monocyclic or polycyclic siloxane structure are preferred, resins having repeating units having the structures represented by the following formulae (SS-1) to (SS-4) are more preferred, and (meth)acrylic ester series repeating units having the structures represented by formulae (SS-1) to (SS-4), vinyl series repeating units and allyl series repeating units are still more preferred.

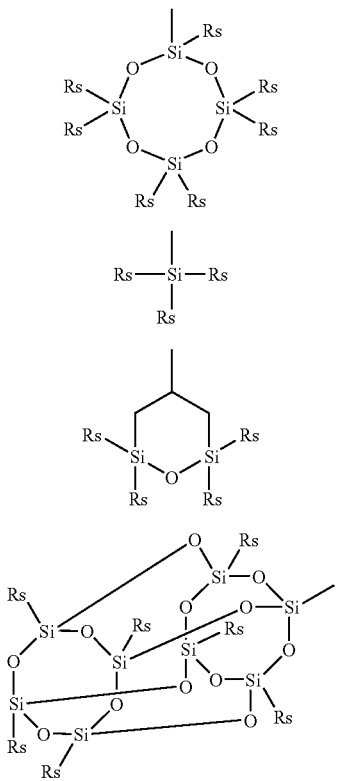

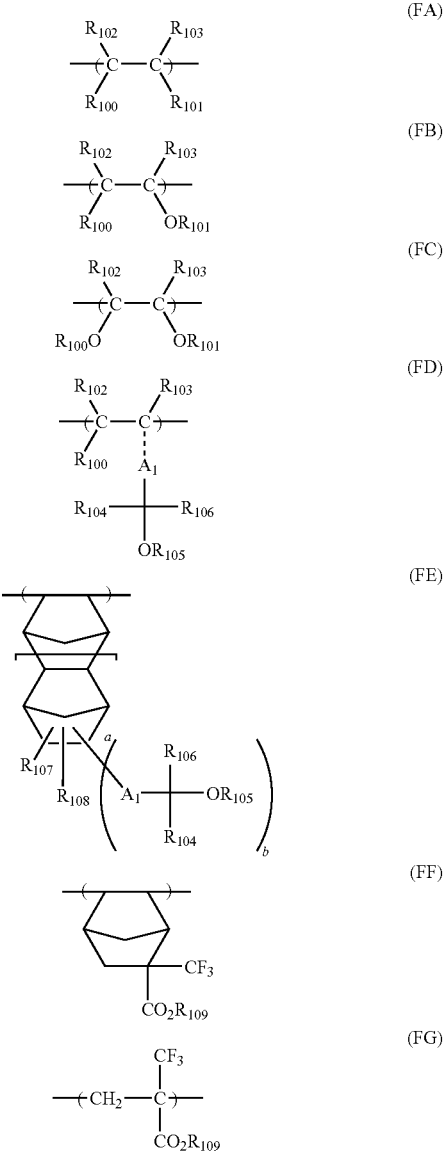

In formulae (SS-1) to (SS-4), Rs represents an alkyl group having from 1 to 5 carbon atoms, preferably a methyl group or an ethyl group.

It is preferred that resins having silicon atoms have two or more kinds of different repeating units having silicon atoms, resins having both (Sa) repeating unit having from 1 to 4 silicon atoms and (Sb) repeating unit having from 5 to 10 silicon atoms are more preferred, and resins having at least one repeating unit having a structure represented by any of formulae (SS-1) to (SS-3) and a repeating unit having a structure represented by formula (SS-4) are still more preferred.

When the positive photosensitive composition of the invention is irradiated with $F_2$ excimer laser rays, the resin of component (B) is preferably a resin having a structure wherein fluorine atoms are substituted on the main chain and/or the side chain of the polymer skeleton and capable of decomposing by the action of an acid to thereby increase the solubility in an alkali developer (hereinafter also referred to as "a fluorine group-containing resin), the resin is more preferably a resin containing a hydroxyl group the 1-position of which is substituted with a fluorine atom or a fluoroalkyl group, or containing a hydroxyl group the 1-position of which is substituted with a fluorine atom or a fluoroalkyl group that is protected with an acid-decomposable group. The most preferred resin is a resin having a hexafluoro-2-propanol structure, or a resin having a structure that the hydroxyl group of hexafluoro-2-propanol is protected with an acid-decomposable group. By the incorporation of fluorine atoms, the transparency to the far ultraviolet rays, in particular to $F_2$ ray (157 nm) can be improved.

As the fluorine group-containing resins in acid-decomposable resin (B), resins containing at least one repeating unit represented by any of the following formulae (FA) to (FG) are preferably exemplified.

In the above formulae, $R_{100}$, $R_{101}$, $R_{102}$ and $R_{103}$ each represents a hydrogen atom, a fluorine atom, an alkyl group or an aryl group.

$R_{104}$ and $R_{106}$ each represents a hydrogen atom, a fluorine atom or an alkyl group, and at least one of $R_{104}$ and $R_{106}$ represents a fluorine atom or a fluoroalkyl group. Preferably both $R_{104}$ and $R_{106}$ represent a trifluoromethyl group.

$R_{105}$ represents a hydrogen atom, an alkyl group, a cycloalkyl group, an acyl group, an alkoxycarbonyl group, or a group decomposable by the action of an acid.

$A_1$ represents a single bond, a divalent linking group, e.g., an alkylene group, a cycloalkylene group, an alkenylene group, an arylene group, —OCO—, —COO—, —CON($R_{24}$)—, or a linking group containing a plurality of these groups. $R_{24}$ represents a hydrogen atom or an alkyl group.

$R_{107}$ and $R_{108}$ each represents a hydrogen atom, a halogen atom, an alkyl group, an alkoxyl group, an alkoxycarbonyl group, or a group decomposable by the action of an acid.

$R_{109}$ represents a hydrogen atom, an alkyl group, a cycloalkyl group, or a group decomposable by the action of an acid.

a represents 0 or 1.

b represents 0, 1 or 2.

Further, $R_{100}$ and $R_{101}$ in formulae (FA) and (FC) may form a ring through an alkylene group (having from 1 to 5 carbon atoms) which may be substituted with a fluorine atom.

The repeating units represented by formulae (FA) to (FG) contain at least 1, preferably 3 or more, fluorine atoms per one repeating unit.

In formulae (FA) to (FG), the alkyl group is an alkyl group having from 1 to 8 carbon atoms, specifically, a methyl group, an ethyl group, a propyl group, an n-butyl group, a sec-butyl group, a hexyl group, a 2-ethylhexyl group, and an octyl group are preferably exemplified.

The cycloalkyl group may be monocyclic or polycyclic. As the monocyclic groups, preferably those having from 3 to 8 carbon atoms, e.g., a cyclopropyl group, a cyclopentyl group, a cyclohexyl group, a cycloheptyl group and a cyclooctyl group can be exemplified. As the polycyclic groups, preferably those having from 6 to 20 carbon atoms, e.g., an adamantyl group, a norbornyl group, an isoboronyl group, a camphanyl group, a dicyclopentyl group, an α-pinel group, a tricyclodecanyl group, a tetracyclododecyl group and an androstanyl group can be exemplified. However, the carbon atoms in the monocyclic or polycyclic cycloalkyl groups may be substituted with hetero atoms such as an oxygen atom, etc.

The fluoroalkyl group is preferably, e.g., a fluoroalkyl group having from 1 to 12 carbon atoms, specifically a trifluoromethyl group, a perfluoroethyl group, a perfluoro-propyl group, a perfluorobutyl group, a perfluorohexyl group, a perfluorooctyl group, a perfluorooctylethyl group, and a perfluorododecyl group can be preferably exemplified.

As the aryl group, an aryl group having from 6 to 15 carbon atoms, specifically a phenyl group, a tolyl group, a dimethylphenyl group, a 2,4,6-trimethylphenyl group, a naphthyl group, an anthryl group and a 9,10-dimethoxyanthryl group can be preferably exemplified.

As the alkoxyl group, e.g., an alkoxyl group having from 1 to 8 carbon atoms, specifically a methoxy group, an ethoxy group, an n-propoxy group, an isopropoxy group, a butoxy group, a pentoxy group, an allyloxy group and an octoxy group can be preferably exemplified.

As the acyl group, e.g., an acyl group having from 1 to 10 carbon atoms, specifically a formyl group, an acetyl group, a propanoyl group, a butanoyl group, a pivaloyl group, an octanoyl group and a benzoyl group can be preferably exemplified.

As the alkoxycarbonyl group, an i-propoxycarbonyl group, a t-butoxycarbonyl group, a t-amyloxycarbonyl group and a 1-methyl-1-cyclohexyloxycarbonyl group, preferably a secondary, and more preferably a tertiary, alkoxycarbonyl group can be exemplified.

As the halogen atom, e.g., a fluorine atom, a chlorine atom, a bromine atom and an iodine atom can be exemplified.

As the alkylene group, preferably an alkylene group having from 1 to 8 carbon atoms, e.g., a methylene group, an ethylene group, a propylene group, a butylene group, a hexylene group and an octylene group can be exemplified.

As the alkenylene group, preferably an alkenylene group having from 2 to 6 carbon atoms, e.g., an ethenylene group, a propenylene group and a butenylene group can be exemplified.

As the cycloalkylene group, preferably a cycloalkylene group having from 5 to 8 carbon atoms, e.g., a cyclopentylene group and a cyclohexylene group can be exemplified.

As the arylene group, an arylene group having from 6 to 15 carbon atoms, e.g., a phenylene group, a tolylene group and a naphthylene group can be exemplified.

These groups may have a substituent, and the examples of the substituents include groups having active hydrogen, e.g., an alkyl group, a cycloalkyl group, an aryl group, an amino group, an amido group, a ureido group, a urethane group, a hydroxyl group and a carboxyl group, a halogen atom (e.g., a fluorine atom, a chlorine atom, a bromine atom and an iodine atom), an alkoxyl group (e.g., a methoxy group, an ethoxy group, a propoxy group, a butoxy group), a thioether group, an acyl group (e.g., an acetyl group, a propanoyl group, a benzoyl group), an acyloxy group (e.g., an acetoxy group, a propanoyloxy group, a benzoyloxy group), an alkoxycarbonyl group (e.g., a methoxycarbonyl group, an ethoxycarbonyl group, a propoxycarbonyl group), a cyano group, and a nitro group can be exemplified.

Here, as the alkyl, cycloalkyl and aryl groups, those described above are exemplified, but the alkyl group may further be substituted with a fluorine atom or a cycloalkyl group.

As the groups contained in the fluorine group-containing resins in the invention and capable of decomposing by the action of an acid to thereby increase the solubility in an alkali developer, —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)(O$R_{39}$) can be exemplified.

$R_{36}$, $R_{37}$, $R_{38}$ and $R_{39}$ each represents an alkyl group, a cycloalkyl group, an aryl group, an aralkyl group or an alkenyl group; $R_{01}$ and $R_{02}$ each represents a hydrogen atom, an alkyl group, a cycloalkyl group, an alkenyl group (e.g., a vinyl group, an allyl group, a butenyl group, a cyclohexenyl group), an aralkyl group (e.g., a benzyl group, a phenethyl group, a naphthylmethyl group), or an aryl group.

The preferred specific examples of the groups include the ether groups or the ester groups of tertiary alkyl groups such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, acetal groups or acetal ester groups such as a 1-alkoxy-1-ethoxy group and a tetrahydropyranyl group, a t-alkylcarbonate group and a t-alkylcarbonylmethoxy group.

The specific examples of the repeating units represented by formulae (FA) to (FG) are shown below, but the invention is not limited thereto.

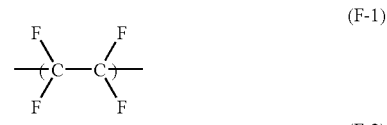

(F-1)

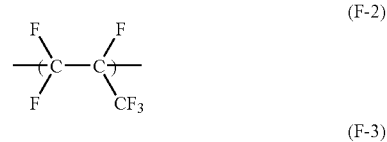

(F-2)

(F-3)

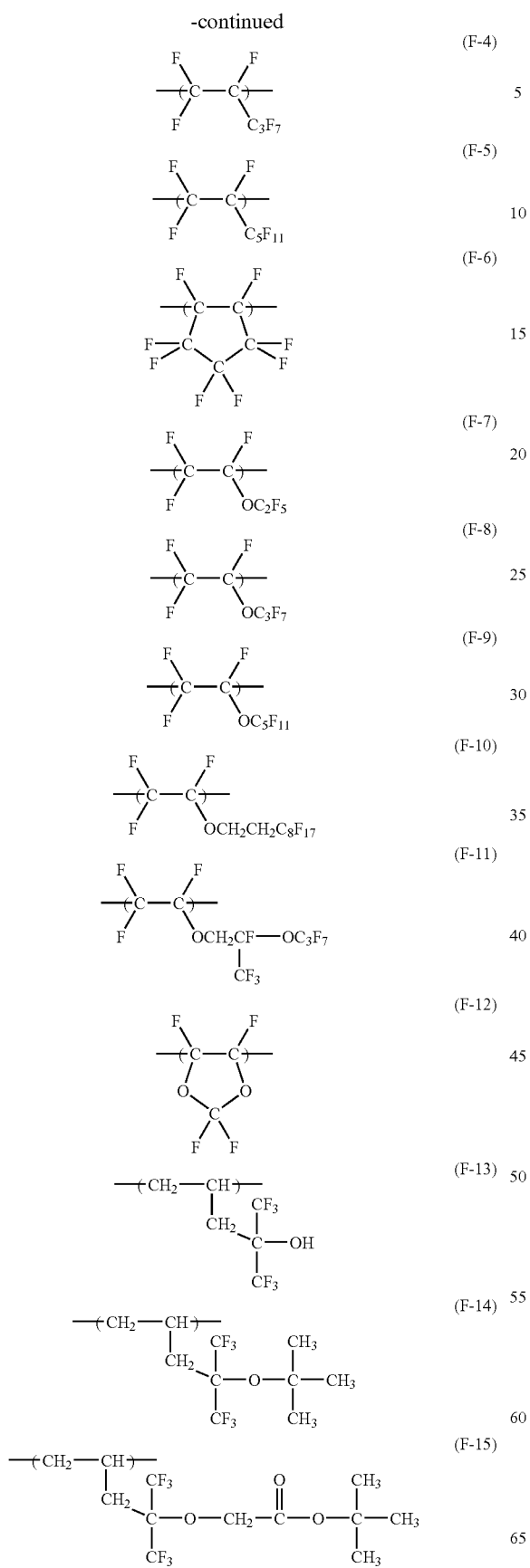
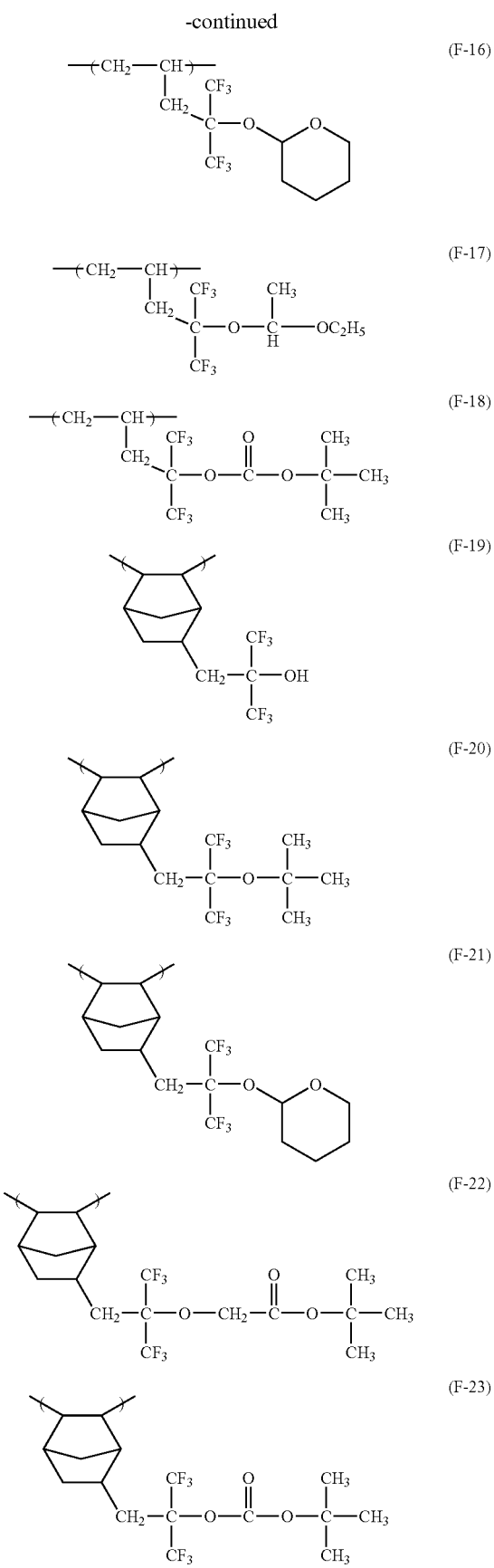

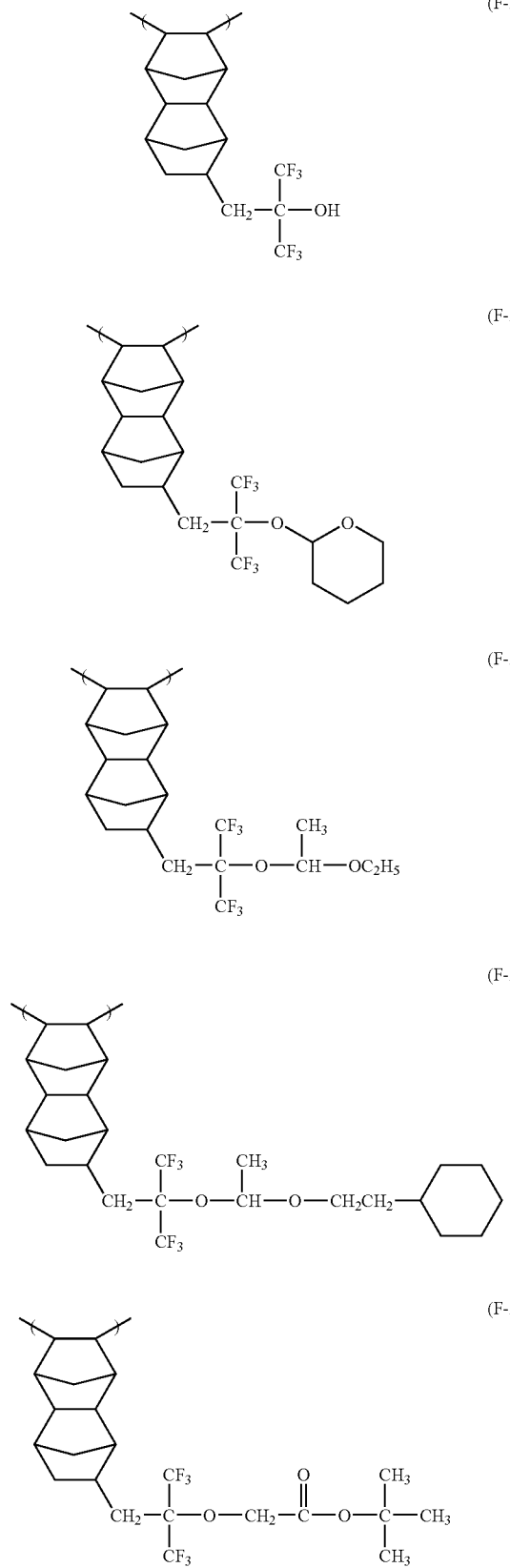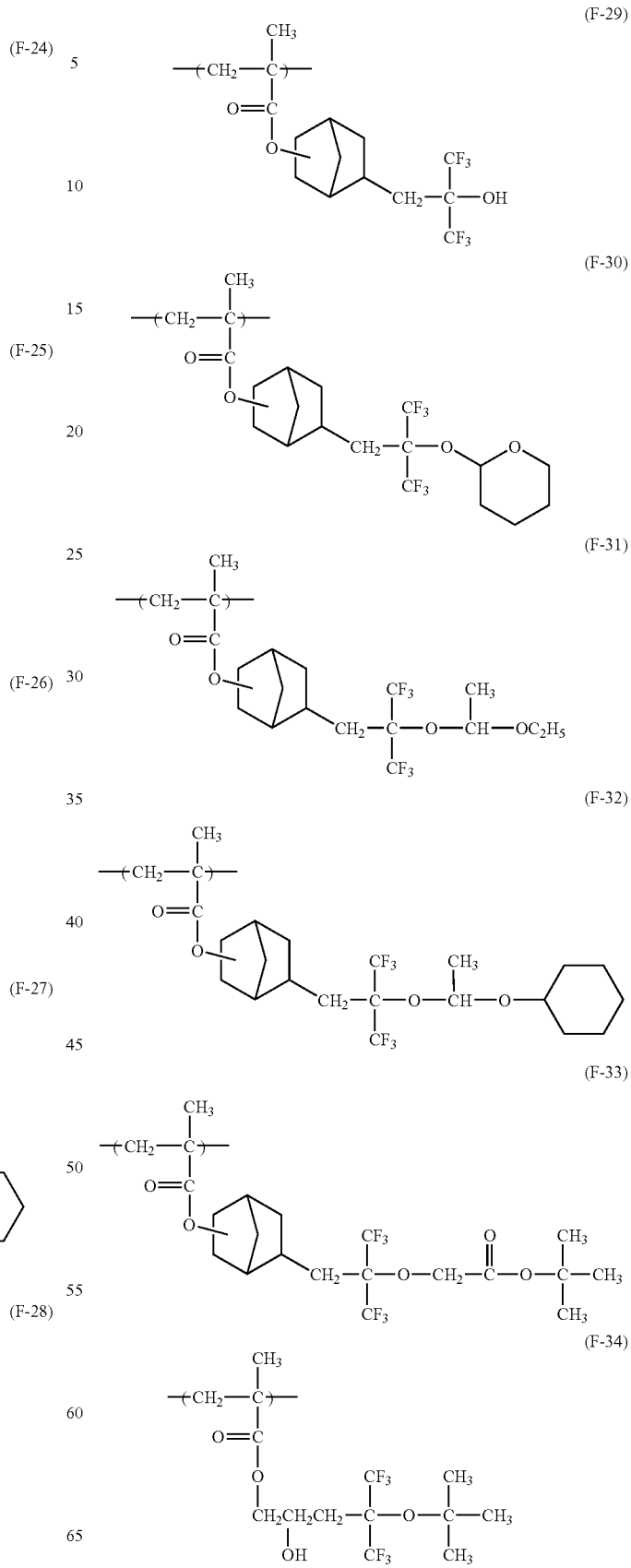

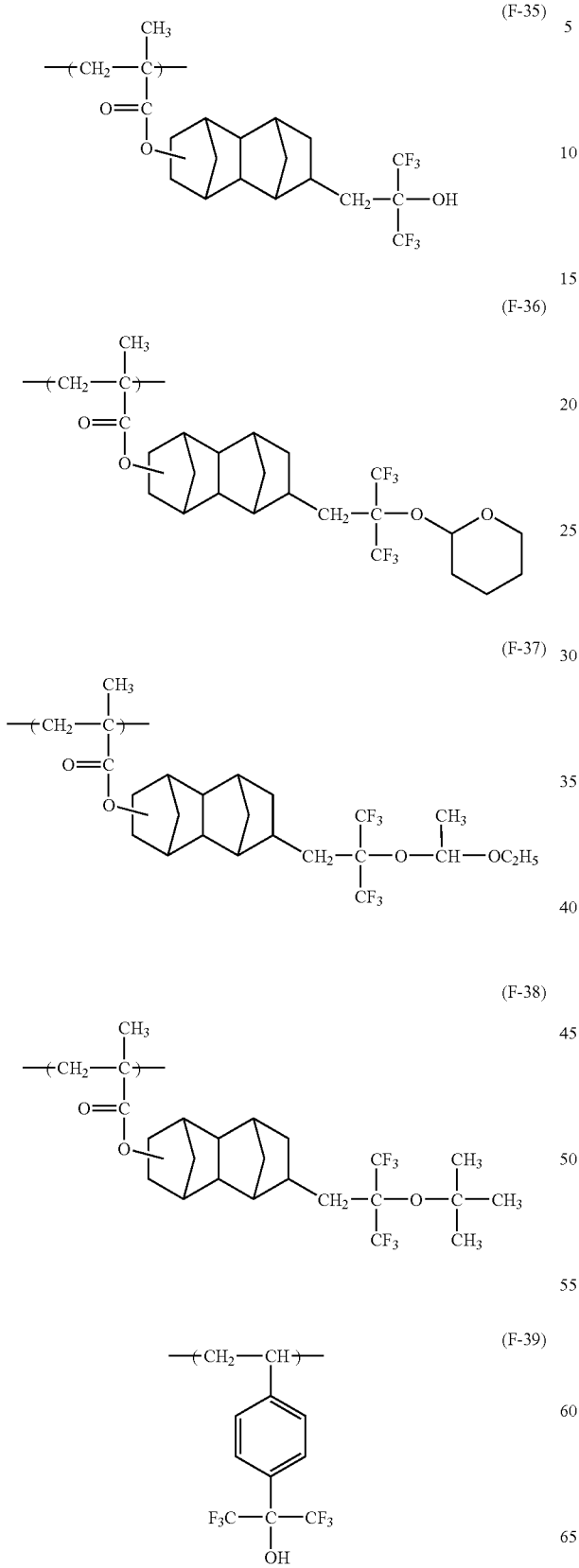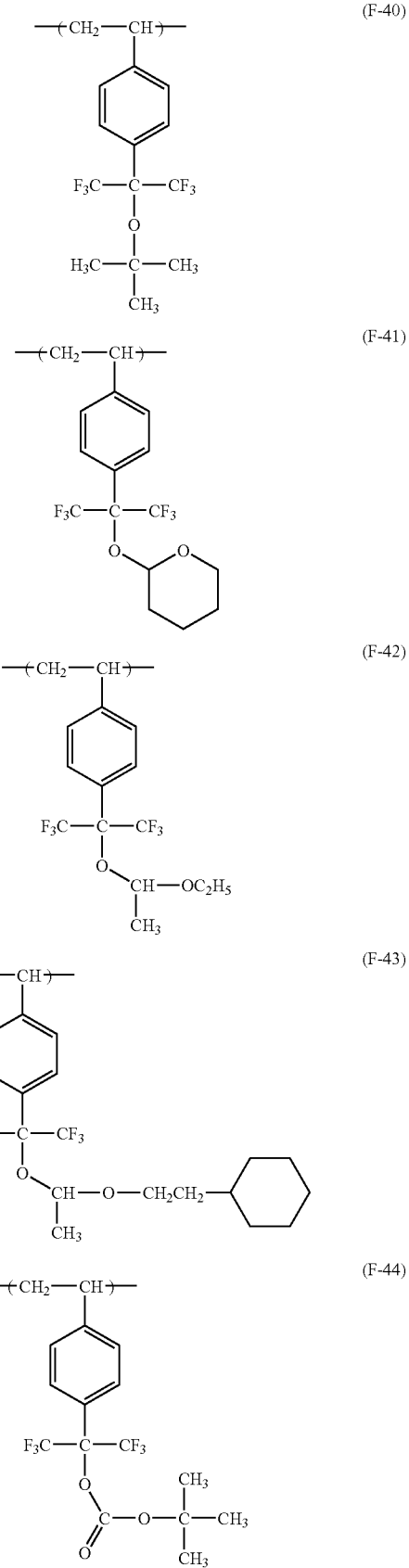

-continued
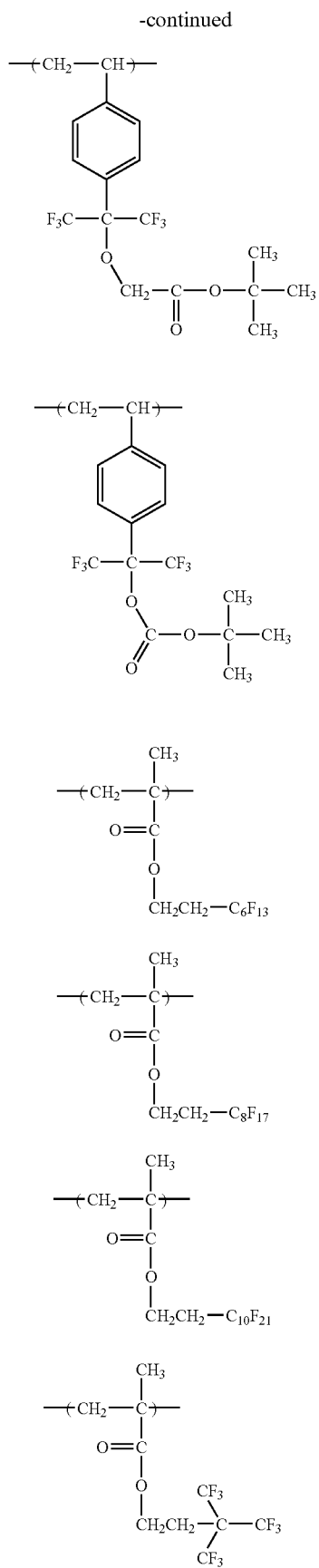
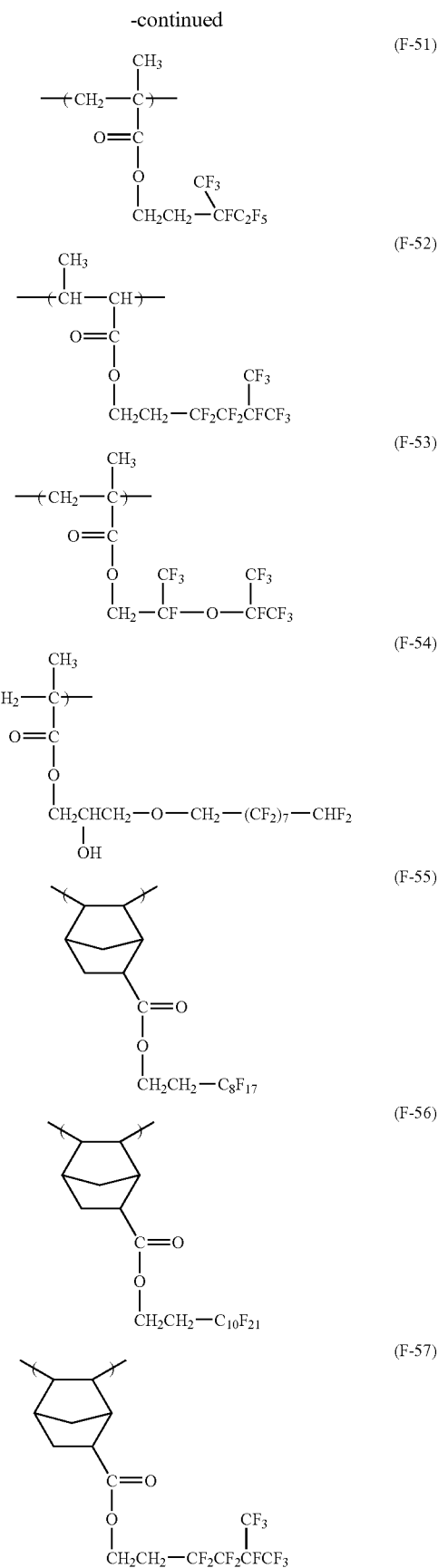

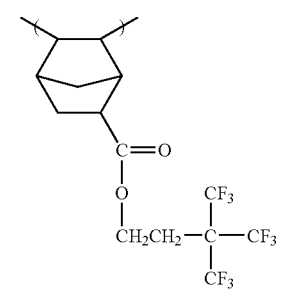
(F-58)

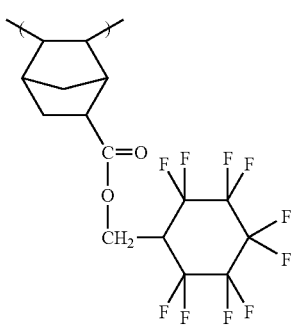
(F-59)

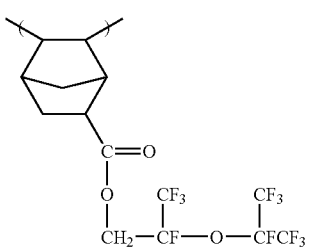
(F-60)

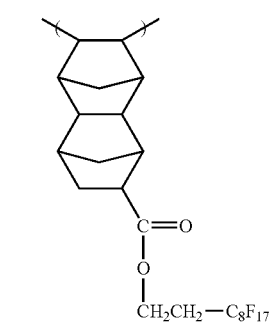
(F-61)

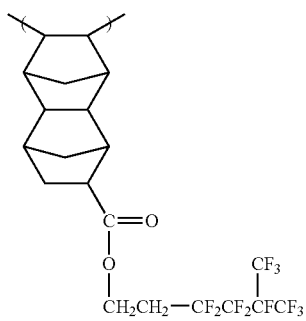
(F-62)

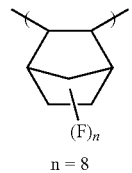
n = 8
(F-63)

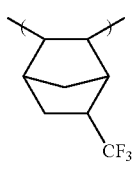
(F-64)

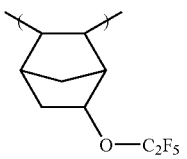
(F-65)

The total content of the repeating units represented by formulae (FA) to (FG) is generally from 10 to 80 mol % to all the repeating units constituting the resin, preferably from 30 to 70 mol %, and more preferably from 35 to 65 mol %.

For the purpose of further improving the performances of the resist of the invention, the above resins may further be copolymerized with other polymerizable monomers in addition to the above repeating structural units.

As the usable copolymerizable monomers, compounds having one addition polymerizable unsaturated bond selected from acrylic esters, acrylamides, methacrylic esters, methacryl-amides, allyl compounds, vinyl ethers, vinyl esters, styrens, and crotonic esters other than described above are exemplified.

It is preferred that these fluorine-containing resins contain other repeating units as the copolymerization components besides the above repeating units containing fluorine atoms from the points of improving dry etching resistance, adjusting alkali solubility, and improving adhesion with substrates. Preferred other repeating units are as follows.

1) The repeating units having an alicyclic hydrocarbon structure represented by formula (II-AB) and any of formulae (pI) to (pVI). Specifically repeating units 1 to 23 and repeating units [II-1] to [II-32] shown above. Preferably repeating units 1 to 23, wherein Rx represents $CF_3$.

2) The repeating units having a lactone structure represented by formula (Lc) and any of formulae (V-1) to (V-5). Specifically the above-exemplified repeating units, in particular, the above-exemplified repeating units represented by formula (Lc) and formulae (V-1) to (V-4).

3) The repeating units derived from the vinyl compounds having maleic anhydride, vinyl ether or a cyano group represented by the following formula (XV), (XVI) or (XVII). Specifically repeating units (C-1) to (C-15) shown below. These repeating units may or may not contain a fluorine atom.

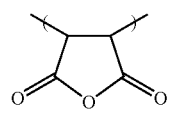
(XV)

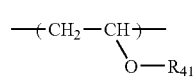 (XVI)

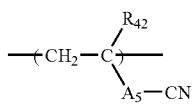 (XVII)

In each of the above formulae, $R_{41}$ represents an alkyl group, a cycloalkyl group, an aralkyl group or an aryl group, and the alkyl group represented by $R_{41}$ may be substituted with an aryl group.

$R_{42}$ represents a hydrogen atom, a halogen atom, a cyano group or an alkyl group.

$A_5$ represents a single bond, a divalent alkylene group, alkenylene group, cycloalkylene group or arylene group, or —O—CO—$R_{22}$—, —CO—O—$R_{23}$— or —CO—N($R_{24}$)—$R_{25}$—.

$R_{22}$, $R_{23}$ and $R_{25}$, which may be the same or different, each represents a single bond, or a divalent alkylene group, alkenylene group, cycloalkylene group or arylene group which may have an ether group, an ester group, an amido group, a urethane group or a ureido group.

$R_{24}$ represents a hydrogen atom, an alkyl group, a cycloalkyl group, an aralkyl group or an aryl group.

Here, the examples of the substituents are the same as the substituents in formulae (FA) to (FG).

The specific examples of the repeating structural units represented by formulae (XV) to (XVII) are shown below, but the invention is not limited thereto.

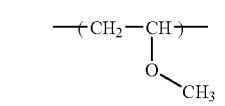 (C-1)

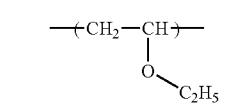 (C-2)

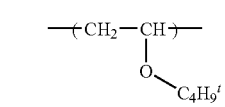 (C-3)

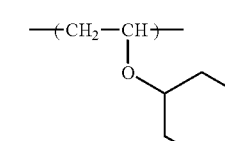 (C-4)

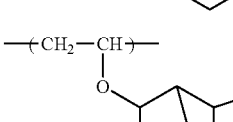 (C-5)

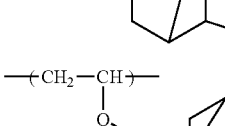 (C-6)

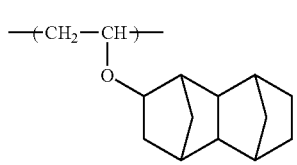 (C-7)

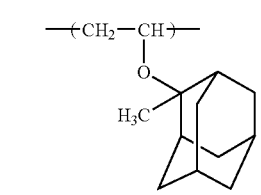 (C-8)

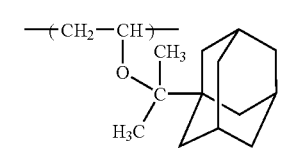 (C-9)

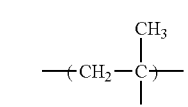 (C-10)

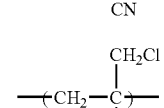 (C-11)

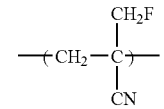 (C-12)

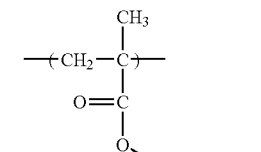 (C-13)

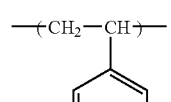 (C-14)

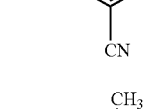 (C-15)

The total amount of the repeating units represented by formulae (XV) to (XVII) and other repeating units is generally from 0 to 70 mol % to the total repeating units constituting the resin, preferably from 10 to 60 mol %, and more preferably from 20 to 50 mol %.

A fluorine group-containing resin as the acid-decomposable resin may contain the acid-decomposable group in any repeating unit.

The proportion of a repeating unit having an acid decomposable group is preferably from 10 to 70 mol % to the total repeating units, more preferably from 20 to 60 mol %, and still more preferably from 30 to 60 mol %.

A fluorine group-containing resin can be synthesized by radical polymerization almost similar to the synthesis of alicyclic hydrocarbon-based acid-decomposable resin.

The weight average molecular weight of the fluorine-containing resin is preferably from 1,000 to 200,000 as the polystyrene equivalent by the GPC method. By making the weight average molecular weight 1,000 or more, heat resistance and dry etching resistance can be improved, and by making the weight average molecular weight 200,000 or less, developability can be improved, and film-forming property can be heightened, since the viscosity becomes extremely low.

In the positive photosensitive composition in the invention, the proportion of the resin of component (B) in all the composition is preferably from 40 to 99.99 mass % in the total solids content, more preferably from 50 to 99.97 mass %.

[3] (C) A dissolution-inhibiting compound having a molecular weight of 3,000 or less and capable of decomposing by the action of an acid to thereby increase the solubility in an alkali developer (hereinafter also referred to as "a dissolution-inhibiting compound):

As (C) the dissolution inhibiting compound having a molecular weight of 3,000 or less capable of decomposing by the action of an acid to thereby increase the solubility in an alkali developer, alicyclic or aliphatic compounds containing acid-decomposable groups, such as cholic acid derivatives containing acid-decomposable groups described in *Processing of SPIE*, 2724, 355 (1996) are preferred so as not to reduce the permeability of lights of 220 nm or less. As acid-decomposable groups and alicyclic structures, the same as those described above in the alicyclic hydrocarbon-based acid-decomposable resin are exemplified.

When the photosensitive composition according to the invention is exposed with a KrF excimer laser or irradiated with electron beams, it is preferred for the photosensitive composition to have a structure that the phenolic hydroxyl group of the phenolic compound is substituted with an acid-decomposable group. As the phenolic compounds, compounds having from 1 to 9 phenolic skeletons are preferred, and those having from 2 to 6 are more preferred.

The molecular weight of the dissolution-inhibiting compound in the invention is 3,000 or less, preferably from 300 to 3,000, and more preferably from 500 to 2,500.

The addition amount of the dissolution-inhibiting compound is preferably from 3 to 50 mass % based on the solids content of the photosensitive composition, and more preferably from 5 to 40 mass %.

The specific examples of the dissolution-inhibiting compounds are shown below, but the invention is not limited thereto.

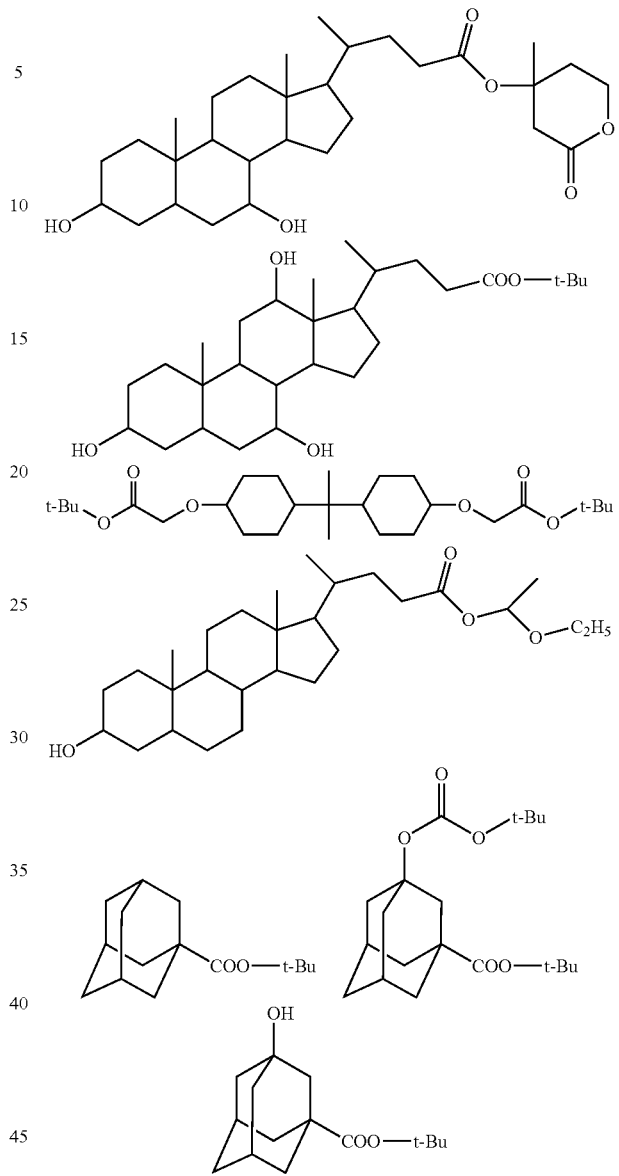

[4] (D) A resin soluble in an alkali developer (hereinafter also referred to as "component (D)" or "alkali-soluble resin"):

The alkali dissolution rate of alkali-soluble resins is preferably 20 Å/sec or more when measured using 0.261 N tetramethylammonium hydroxide (TMAH) at 23° C., particularly preferably 200 Å/sec or more.

As alkali-soluble resins for use in the invention, e.g., novolak resins, hydrogenated novolak resins, acetone-pyrogallol resins, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymers, o/p- and m/p-hydroxystyrene copolymers, partially O-alkylated products of the hydroxyl group of polyhydroxystyrene (e.g., from 5 to 30 mol % O-methylated, O-(1-methoxy)ethylated, O-(1-ethoxy)ethylated, O-2-tetrahydropyranylated, and O-(t-butoxycarbonyl)methylated products), or partially O-acylated products (e.g., from 5 to 30 mol % O-acetylated and O-(t-butoxy)carbonylated products), styrene-maleic anhydride copolymers, styrene-hydroxystyrene copolymers, α-methylstyrene-hydroxystyrene copolymers, carboxyl group-containing methacrylic resins and derivatives thereof, and polyvinyl alcohol derivatives can be exemplified, but the invention is not limited to these resins.

Particularly preferred alkali-soluble resins are novolak resins, o-polyhydroxystyrene, m-polyhydroxystyrene p-polyhydroxystyrene, copolymers of them, alkyl-substituted polyhydroxystyrene, partially O-alkylated or O-acylated products of polyhydroxystyrene, styrene-hydroxystyrene copolymers, and α-methylstyrene-hydroxystyrene copolymers.

The novolak resins can be obtained by addition condensation to aldehydes with the prescribed monomers as main components in the presence of acid catalysts.

The weight average molecular weight of alkali-soluble resins is 2,000 or more, preferably from 5,000 to 200,000, and more preferably from 5,000 to 100,000.

Here, the weight average molecular weight is defined as the polystyrene equivalent by gel permeation chromatography method.

Alkali-soluble resins (D) may be used in combination of two kinds or more in the invention.

The addition amount of alkali-soluble resins is from 40 to 97 mass %, preferably from 60 to 90 mass %, based on the total solids content of the photosensitive composition.

[5] (E) An acid crosslinking agent capable of crosslinking with the alkali-soluble resin by the action of an acid (hereinafter also referred to as "component (E)" or "crosslinking agent"):

Crosslinking agents are used in the negative photosensitive composition of the invention.

Any compound capable of crosslinking the resins soluble in an alkali developer by the action of an acid can be used as crosslinking agents, but the following (1) to (3) are preferably used.

(1) Hydroxymethyl body, alkoxymethyl body and acyloxymethyl body of phenol derivatives
(2) Compounds having an N-hydroxymethyl group, an N-alkoxy-methyl group or an N-acyloxymethyl group
(3) Compounds having an epoxy group As the alkoxymethyl groups, those having 6 or less carbon atoms, and as the acyloxymethyl groups, those having 6 or less carbon atoms are preferred.

Of these crosslinking agents, particularly preferred compounds are shown below.

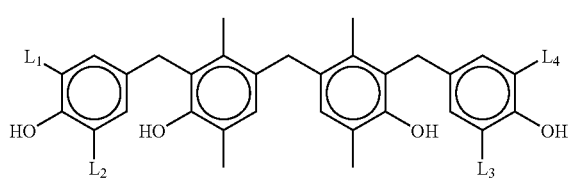

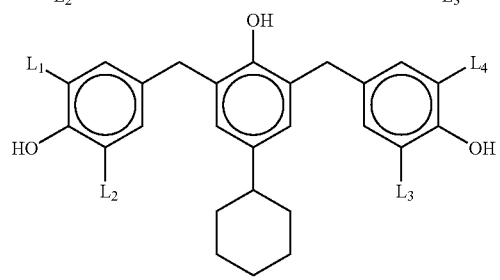

-continued

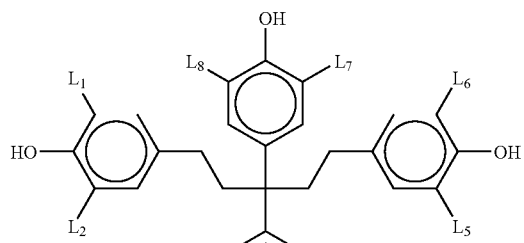

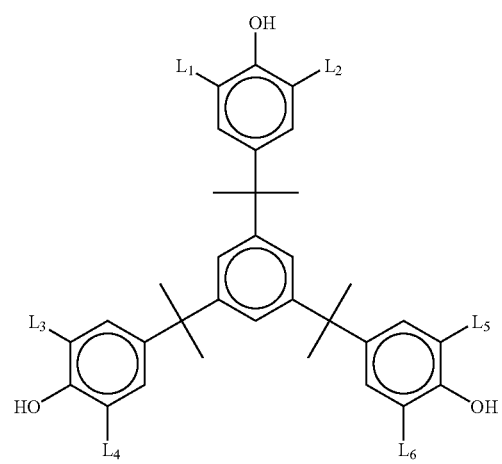

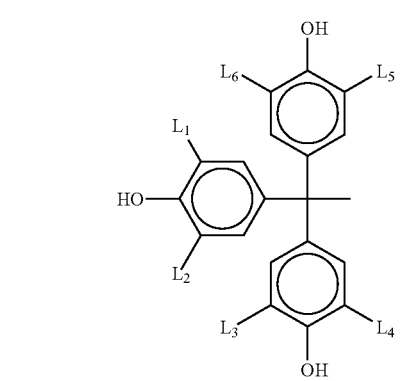

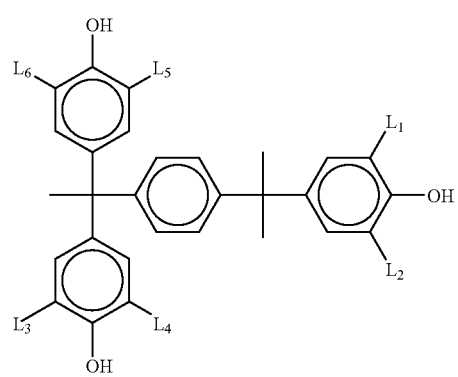

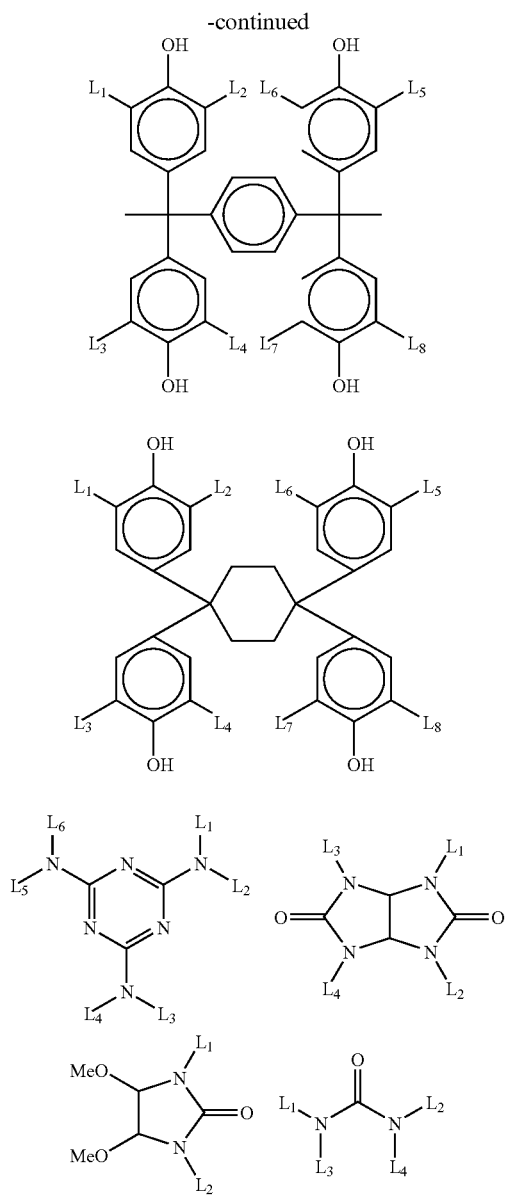

In the above formulae, $L_1$ to $L_8$, which may be the same or different, each represents a hydrogen atom, a hydroxymethyl group, a methoxymethyl group, an ethoxymethyl group, or an alkyl group having from 1 to 6 carbon atoms.

Crosslinking agents are used generally in proportion of from 3 to 70 mass % in the solids content of the photosensitive composition, preferably from 5 to 50 mass %.

Other Components:

(F) Basic Compounds:

For decreasing the fluctuation of performances during the period of time from exposure to baking, it is preferred for the photosensitive composition of the invention to contain (F) basic compounds.

As the preferred structures of basic compounds, the structures represented by the following formulae (A) to (E) can be exemplified.

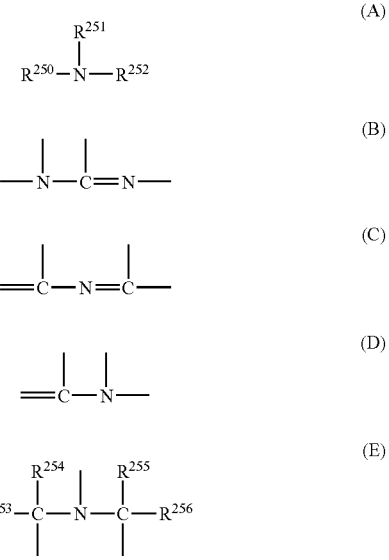

In formula (A), $R_{250}$, $R_{251}$ and $R_{252}$ each represents a hydrogen atom, an alkyl group having from 1 to 20 carbon atoms, a cycloalkyl group having from 3 to 20 carbon atoms, or an aryl group having from 6 to 20 carbon atoms, and $R_{250}$ and $R_{251}$ may be bonded to each other to form a ring. These groups may have a substituent, and as the alkyl group and the cycloalkyl group having a substituent, an aminoalkyl group having from 1 to 20 carbon atoms or an aminocycloalkyl group having from 3 to 20 carbon atoms, a hydroxyalkyl group having from 1 to 20 carbon atoms or a hydroxycycloalkyl group having from 3 to 20 carbon atoms are preferred.

These groups may contain an oxygen atom, a sulfur atom or a nitrogen atom in the alkyl chain.

In formula (E), $R_{253}$, $R_{254}$, $R_{255}$ and $R_{256}$ each represents an alkyl group having from 1 to 6 carbon atoms, or a cycloalkyl group having from 3 to 6 carbon atoms.

As preferred examples of basic compounds, guanidine, aminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxide structure, an onium carboxylate structure, a trialkylamine structure, an aniline structure and a pyridine structure, alkylamine derivatives having a hydroxyl group and/or an ether bond, and aniline derivatives having a hydroxyl group and/or an ether bond can be exemplified.

As compounds having an imidazole structure, imidazole, 2,4,5-triphenylimidazole and benzimidazole can be exemplified. As compounds having a diazabicyclo structure, 1,4-diaza-bicyclo[2,2,2]octane, 1,5-diazabicyclo[4,3,0]non-5-ene, and 1,8-diazabicyclo[5,4,0]undeca-7-ene can be exemplified. As compounds having an onium hydroxide structure, triaryl-sulfonium hydroxide, phenacylsulfonium hydroxide, sulfonium hydroxide having a 2-oxoalkyl group, specifically triphenyl-sulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. Compounds having an onium carboxylate structure are compounds having an onium hydroxide structure in which the anionic part is carboxylated, e.g., acetate, adamantane-1-carboxylate and perfluoroalkyl carboxylate are exemplified. As compounds having a trialkylamine structure, tri(n-butyl)-amine and tri(n-octyl)amine can be exemplified. As aniline compounds, 2,6-diisopropylaniline and N,N-dimethylaniline can be exemplified. As alkylamine derivatives having a hydroxyl group and/or an ether bond, ethanolamine, diethanol-amine, triethanolamine and tris(methoxyethoxyethyl)amine can be exemplified. As aniline derivatives having a hydroxyl group and/or an ether bond, N,N-bis(hydroxyethyl)aniline can be exemplified.

These basic compounds are used alone or in combination of two or more. The use amount of basic compounds is generally from 0.001 to 10 mass % based on the solids content of the photosensitive composition, and preferably from 0.01 to 5 mass %. For obtaining a sufficient addition effect, the addition amount is preferably 0.001 mass % or more, and in view of sensitivity and the developability of a non-exposed area, the addition amount is preferably 10 mass % or less.

[7] (G) Fluorine and/or Silicon Surfactants:

It is preferred for the photosensitive composition in the invention to further contain either one or two or more of fluorine and/or silicon surfactants (a fluorine surfactant and a silicon surfactant, a surfactant containing both a fluorine atom and a silicon atom).

By containing fluorine and/or silicon surfactants, it becomes possible for the photosensitive in the invention to provide a resist pattern excellent in sensitivity and resolution, and low in adhesion defect and development defect in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As commercially available fluorine and silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized according to the method disclosed in JP-A-2002-90991.

As polymers having fluoro-aliphatic groups, copolymers of monomers having fluoro-aliphatic groups and (poly(oxyalkylene))acrylate and/or (poly(oxyalkylene))methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene)acrylate (or methacrylate) may be not only bipolymers but also terpolymers or higher polymers obtained by copolymerization of monomers having different two or more kinds of fluoro-aliphatic groups and different two or more kinds of poly (oxyalkylene)acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate), and (poly-(oxypropylene))acrylate (or methacrylate), copolymers of acrylate (or methacrylate) having a $C_8F_{17}$ group and (poly-(oxyalkylene))acrylate (or methacrylate), and copolymers of acrylate (or methacrylate) having a $C_8F_{17}$ group, (poly(oxy-ethylene))acrylate (or methacrylate), and poly(oxypropylene)acrylate (or methacrylate) are exemplified.

The amount of fluorine and/or silicon surfactants is preferably from 0.0001 to 2 mass % to the total amount of the photosensitive composition (excluding solvents), more preferably from 0.001 to 1 mass %.

(H) Organic Solvent:

The above components of the photosensitive composition of the invention are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methylmethoxy propionate, ethylethoxy propionate, methyl pyruvate, ethyl pyruvate, propyl pyruvate, N,N-dimethylformamide, dimethyl sulfoxide, N-methylpyrrolidone, and tetrahydrofuran are exemplified.

Organic solvents may be used alone or as mixed solvents, but it is preferred in the invention to use a mixed solvent of a solvent containing a hydroxyl group in the structure and a solvent not containing a hydroxyl group, by which the generation of particles during the preservation of a resist solution can be reduced.

As solvents containing a hydroxyl group, e.g., ethylene glycol, ethylene glycol monomethyl ether, ethylene glycol monoethyl ether, propylene glycol, propylene glycol monomethyl ether, propylene glycol monoethyl ether and ethyl lactate are exemplified. Of these solvents, propylene glycol monomethyl ether and ethyl lactate are particularly preferred.

As solvents not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide are exemplified. Of these solvents, propylene glycol monomethyl ether acetate, ethylethoxy propionate, 2-heptanone, γ-butyrolactone, cyclohexanone and butyl acetate are particularly preferred, and propylene glycol monomethyl ether acetate, ethylethoxy propionate and 2-heptanone are most preferred.

The mixing ratio (by mass) of a solvent containing a hydroxyl group and a solvent not containing a hydroxyl group is from 1/99 to 99/1, preferably from 10/90 to 90/10, and more preferably from 20/80 to 60/40. A mixed solvent containing 50 mass % or more of a solvent not containing a hydroxyl group is particularly preferred in the point of coating uniformity.

Other Additives:

If necessary, dyes, plasticizers, surfactants other than the surfactants of component (G), photosensitizers, and compounds for expediting the dissolution of composition in a developer may be further added to the photosensitive composition in the present invention.

Compounds for expediting dissolution in a developer that can be used in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 mass % based on the addition amount of the resin of component (B) or the resin of component (D), more preferably from 5 to 30 mass %. The amount is preferably 50 mass % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is not limited to these compounds.

Surfactants other than fluorine and/or silicon surfactants of component (G) can be used in the invention. As the specific examples of other surfactants, nonionic surfactants, e.g., polyoxyethylene alkyl ethers, polyoxy-ethylene alkylaryl ethers, polyoxyethylene-polyoxypropylene block copolymers, sorbitan aliphatic acid esters, and polyoxyethylene sorbitan aliphatic acid esters can be exemplified.

These surfactants may be used alone or in combination of two or more.

Pattern Forming Method:

The photosensitive composition in the invention is used by dissolving each of the above components in a prescribed organic solvent, preferably dissolving in a mixed solvent as described above, and coating the solution on a prescribed support as follows.

For example, the photosensitive composition is coated on a substrate such as the one used in the manufacture of precision integrated circuit element (e.g., silicon/silicon dioxide coating) by an appropriate coating method with a spinner or a coater, and dried, to thereby form a resist film.

The resist film is then irradiated with an actinic ray or radiation through a prescribed mask, the exposed resist film is preferably subjected to baking (heating) and development, whereby a good pattern can be obtained.

As actinic rays or radiation, infrared rays, visible rays, ultraviolet rays, far ultraviolet rays, X-rays and electron beams can be exemplified, preferably far ultraviolet rays of the wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and ArF excimer lasers, $F_2$ excimer lasers, EUV (13 nm), and electron beams are preferably used.

In a development process, an alkali developer is used as follows. As the alkali developer of the resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

The alkali concentration of alkali developers is generally from 0.1 to 20 mass %.

The pH of alkali developers is generally from 10.0 to 15.0.

EXAMPLE

The invention will be described in further detail with reference to Examples, but the invention is not limited thereto.

Synthesis Example

Synthesis of Compound (I-21)

To 36 g of 2,6-xylenol and 60 g of dibenzothiophene sulfoxide was added 300 ml of a solution of diphosphorus pentoxide/methanesulfonic acid in proportion of 1/10. The mixture was allowed to react at 40° C. for 4 hours, and then the reaction solution was poured into ice. The aqueous solution was washed with ethyl acetate, and an aqueous solution obtained by dissolving 200 g of potassium iodide with water was added to the aqueous phase. The precipitated powder was filtered and washed with acetone. Chloroform (300 ml) was added thereto, and 20.0 g of triethylamine was further added. To the solution was dropwise added 60 g of nonafluorobutanesulfonic acid anhydride over 30 minutes while cooling with ice. The solution was allowed to react at room temperature for 1 hour, and then water was added to the reaction solution. The organic phase was washed with a 5% NaOH aqueous solution, subsequently with water, and concentrated to thereby obtain a crude product. The product was recrystallized with ethyl acetate/diisopropyl ether, thus 30.0 g of Compound (I-21) was obtained.

Other acid generators in the invention were synthesized in the same method as above.

Resin (B):

The structures and molecular weights of resins (B) for use in the invention are shown below.

| | Molecular Weight |
|---|---|
| (1) 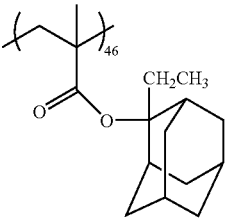 | 10700 |
| (2) 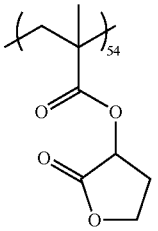 | 9400 |
| (4) 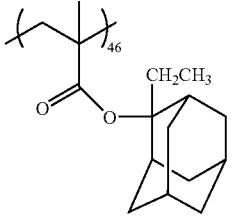 | 10300 |
| (6) 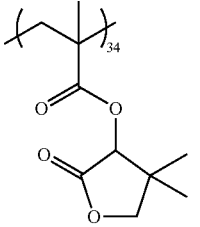 | 11300 |
| (7) 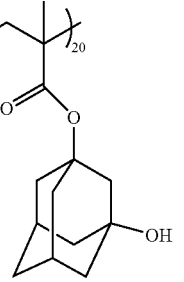 | 8900 |

-continued
| | Molecular Weight |
|---|---|
| (11) 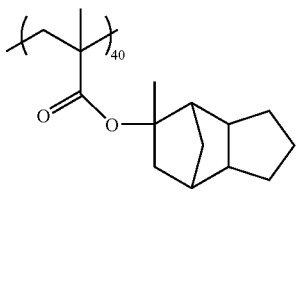 | 13400 |
| (15) 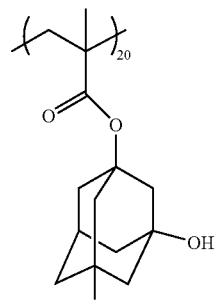 | 9600 |
| (16) 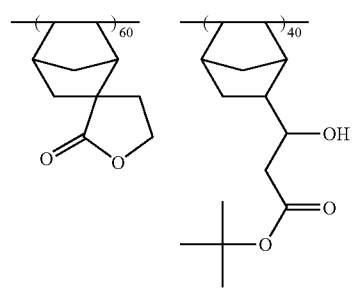 | 5800 |
| (17)  | 4700 |
| (20) 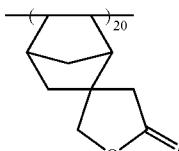 | 12100 |
| (24) 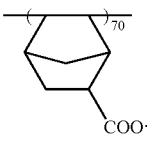 | 10800 |

-continued

| | Molecular Weight |
|---|---|
| (25) | 9300 |
| (28) | 7300 |
| (29) | 7600 |
| (30) | 8400 |

-continued

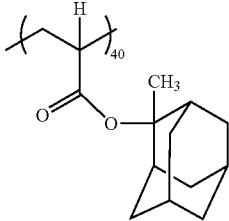

| | Molecular Weight |
|---|---|
| (31) | 6500 |

Examples Ar 1 to Ar 22 and Comparative Examples ar 1 to ar 3

Preparation of resist: The components shown in Table 1 below were dissolved in a mixed solvent comprising 100 g of propylene glycol monomethyl ether acetate and 40 g of propylene glycol monomethyl ether to prepare a solution having solids concentration of 12 mass %, and the solution was filtered through a polytetrafluoro-ethylene filter or a polyethylene filter having a pore diameter of 0.1 μm, whereby a positive resist solution was prepared. Each of the prepared positive resist solutions was evaluated by the following method. The results of evaluation are shown in Table 1.

Evaluation of resist: Antireflection film DUV-42 (manufactured by Brewer Science) was uniformly coated in a thickness of 600 Å with a spin coater on a silicone substrate treated with hexamethyl-disilazane, dried on a hot plate at 100° C. for 90 seconds, and then dried with heating at 190° C. for 240 seconds. After that, each positive resist solution was coated thereon with a spin coater and dried at 120° C. for 90 seconds to form a resist film having a thickness of 0.30 μm. The resist film was subjected to exposure through a mask with an ArF excimer laser stepper (manufactured by ISI Co., NA=0.6), and the exposed resist film was heated on a hot plate at 120° C. for 90 seconds immediately after exposure. Further, the resist film was subjected to development with a 2.38 mass % tetramethylammonium hydroxide aqueous solution at 23° C. for 60 seconds, rinsing with pure water for 30 seconds, and then drying, whereby a line pattern was obtained.

Sensitivity:
The exposure amount required to reproduce a mask pattern of line and space of 1/1 of a line width 130 nm was observed.

Defocus Latitude (DOF):
The width of the depth of focus to reproduce a line width of 130 nm±10% at an optimal exposure amount was observed. The greater the value, the greater is the latitude of deviation of focus and preferred.

TABLE 1

| | Composition | | | | | Evaluation | |
|---|---|---|---|---|---|---|---|
| | Acid Generator (A) (g) | Acid Generator Used in Combination (g) | Resin (B) | Basic Compound (g) | Surfactant (g) | Sensitivity (mJ/cm$^2$) | DOF (nm) |
| Example | | | | | | | |
| Ar 1 | I-21 (0.5) | — | (1) 10 g | DIA (0.03) | W-4 (0.01) | 35 | 0.4 |
| Ar 2 | I-11 (0.4) | z43 (0.4) | (4) 10 g | TPA (0.03) | W-2 (0.02) | 38 | 0.4 |
| Ar 3 | I-4 (0.5) | z6 (0.2) | (6) 10 g | HAP (0.02) | W-1 (0.01) | 35 | 0.4 |
| Ar 4 | I-18 (0.5) | z8 (0.1) | (6) 10 g | DIA (0.03) | W-4 (0.01) | 39 | 0.4 |
| Ar 5 | I-14 (0.4) | z12 (0.05) | (7) 10 g | PEA (0.01) | W-4 (0.01) | 38 | 0.5 |
| Ar 6 | I-21 (0.1) I-25 (0.2) | z36 (0.1) | (7) 10 g | DIA (0.02) PEA (0.02) | W-4 (0.01) | 42 | 0.4 |
| Ar 7 | I-14 (0.3) | z40 (0.1) | (15) 10 g | TMEA (0.03) | W-3 (0.03) | 38 | 0.4 |
| Ar 8 | I-14 (0.3) | z41 (0.3) | (16) 10 g | TBAH (0.04) | W-1 (0.005) | 45 | 0.5 |
| Ar 9 | I-13 (0.5) | z42 (0.3) | (17) 10 g | HEP (0.03) | W-3 (0.02) | 38 | 0.5 |
| Ar 10 | I-1 (0.3) | z14 (0.1) | (24) 10 g | TPSA (0.05) | W-3 (0.01) | 35 | 0.4 |
| Ar 11 | I-16 (0.2) | z25 (0.4) | (25) 10 g | DCMA (0.03) | W-4 (0.01) | 45 | 0.5 |
| Ar 12 | I-16 (0.2) | z55 (0.2) | (28) 10 g | DIA (0.03) | W-4 (0.01) | 42 | 0.5 |
| Ar 13 | I-13 (0.5) | z58 (0.1) | (29) 10 g | PEA (0.04) | W-2 (0.02) | 37 | 0.4 |
| Ar 14 | I-12 (0.4) | z57 (0.1) | (30) 10 g | PEA (0.04) | W-4 (0.01) | 40 | 0.5 |
| Ar 15 | I-99 (0.1) | z14 (0.3) | (31) 10 g | DIA (0.03) | W-2 (0.02) | 39 | 0.5 |
| Ar 16 | I-11 (0.2) | z14 (0.2) | (6) 10 g | DIA (0.03) | W-2 (0.01) | 38 | 0.5 |
| Ar 17 | I-92 (0.15) | z50 (0.2) | (7) 10 g | DIA (0.02) | W-4 (0.01) | 38 | 0.5 |
| Ar 18 | I-3 (0.4) | z4 (0.02) | (28) 10 g | PEA (0.02) | W-4 (0.01) | 41 | 0.4 |
| Ar 19 | I-23 (0.3) | z6 (0.1) z1 (0.1) | (28) 5 g (20) 5 g | DIA (0.02) DCMA (0.02) | W-4 (0.01) | 42 | 0.5 |

TABLE 1-continued

| | Composition | | | | | Evaluation | |
|---|---|---|---|---|---|---|---|
| | Acid Generator (A) (g) | Acid Generator Used in Combination (g) | Resin (B) | Basic Compound (g) | Surfactant (g) | Sensitivity (mJ/cm$^2$) | DOF (nm) |
| Ar 20 | I-37 (0.5) I-6 (0.1) | z14 (0.2) | (4) 5 g (7) 5 g | TPA (0.02) PEA (0.02) | W-4 (0.01) | 39 | 0.5 |
| Ar 21 | I-1 (0.2) | z5 (0.1) z6 (0.1) | (28) 5 g (11) 5 g | DIA (0.02) TMEA (0.02) | W-4 (0.01) | 36 | 0.4 |
| Ar 22 | I-21 (0.2) | z38 (0.1) z44 (0.1) | (28) 5 g (2) 5 g | TPSA (0.02) PEA (0.02) | W-4 (0.01) | 38 | 0.4 |
| Comparative Example | | | | | | | |
| ar 1 | PAG-A (0.3) | — | (1) 10 g | DIA (0.03) | W-4 (0.01) | 58 | 0.2 |
| ar 2 | PAG-B (0.3) | — | (1) 10 g | DIA (0.03) | W-4 (0.01) | 36 | 0.2 |
| ar 3 | PAG-C (0.3) | — | (1) 10 g | DIA (0.03) | W-4 (0.01) | 62 | 0.2 |

The abbreviations common to Table 1 and the following tables are shown together.

Acid Generators:

Acid generators are corresponding to those shown above, but PAG-A, PAG-B and PAG-C are as follows.

PAG-A: Triphenylsulfonium nonafluorobutanesulfonate

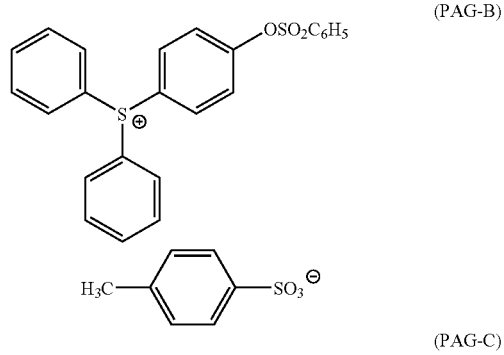

(PAG-B)

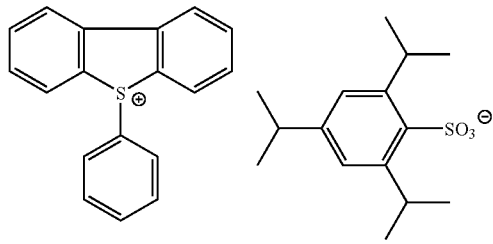

(PAG-C)

Basic Compounds:
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
HAP: Hydroxyantipyrine
TBAH: Tetrabutylammonium hydroxide
TMEA: Tris(methoxyethoxyethyl)amine
PEA: N-Phenyldiethanolamine Surfactants:
W-1: Megafac F176 (fluorine, manufactured by Dainippon Ink and Chemicals Inc.)
W-2: Megafac R08 (fluorine and silicon, manufactured by Dainippon Ink and Chemicals Inc.)
W-3: Polysiloxane polymer KP-341 (silicon, manufactured by Shin-Etsu Chemical Co., Ltd.)
W-4: Troy Sol S-366 (manufactured by Troy Chemical Co., Ltd.)

Solvents:
A1: Propylene glycol methyl ether acetate
A2: 2-Heptanone
A3: Cyclohexanone
A4: γ-Butyrolactone
B1: Propylene glycol methyl ether
B2: Ethyl lactate It can be seen from the results shown in Table 1 that the photosensitive compositions in the invention are excellent in resolution and DOF in ArF exposure.

Examples Si 1 to Si 5 and Comparative Examples si 1 to si 3

(1) Formation of Lower Resist Layer:

FHi-028DD resist (a resist for i-ray exposure, a product of Fuji Photo Film Olin Co., Ltd.) was coated on a 6 inch silicone wafer with Spin Coater Mark 8 (a product of Tokyo Electron Limited) and baked at 90° C. for 90 seconds, whereby a uniform film having a thickness of 0.55 μm was obtained.

The obtained film was further heated at 200° C. for 3 minutes to form a lower resist layer having a thickness of 0.40 μm.

(2) Formation of Upper Resist Layer:

The components shown in Table 2 below were dissolved in a solvent to prepare a solution having solids concentration of 11 mass %. The solution was precisely filtered through a membrane filter having a pore diameter of 0.1 μm to thereby prepare an upper layer resist composition.

The upper layer resist composition was coated on the lower resist layer in the same manner as the lower layer coating, heated at 130° C. for 90 seconds, whereby an upper resist layer having a thickness of 0.20 μm was formed.

Resins (SI-1) to (SI-5) in Table 2 are as follows.

(3) Evaluation of Resist:

The thus-obtained wafer was subjected to exposure with ArF Excimer Stepper 9300 (manufactured by ISI Co.) attached with a resolution mask with varying exposure amount.

After heating at 120° C. for 90 seconds, the wafer was developed with a tetrahydroammonium hydroxide developing solution (2.38 mass %) for 60 seconds, rinsed with distilled water and dried to obtain an upper layer pattern.

Each resist was evaluated for critical resolution and DOF in the same manner as in Examples Ar 1 to Ar 22 and Comparative Examples ar 1 to ar 3. The results obtained are shown in Table 2 below.

TABLE 2

| | Composition | | | | | | Evaluation | |
|---|---|---|---|---|---|---|---|---|
| | Acid Generator (A) (g) | Acid Generator Used in Combination (g) | Resin (10 g) | Basic Compound (g) | Surfactant (g) | Solvent (mass ratio) | Sensitivity (mJ/cm$^2$) | DOF (μm) |
| Ex. | | | | | | | | |
| Si 1 | I-20 (0.6) | — | SI-1 | DIA (0.03) | W-4 (0.01) | A1 (100) | 42 | 0.4 |
| Si 2 | I-6 (0.4) | z14 (0.2) | SI-2 | TPA (0.03) | W-2 (0.02) | A1/A3 (40/60) | 50 | 0.4 |
| Si 3 | I-11 (0.2) | Z6 (0.2) | SI-3 | HAP (0.02) | W-1 (0.01) | A1/B1 (100) | 45 | 0.5 |
| Si 4 | I-30 (0.6) | Z8 (0.1) | SI-4 | DIA (0.03) | W-4 (0.01) | A1/B1 (60/40) | 45 | 0.5 |
| Si 5 | I-21 (0.6) | z12 (0.05) | SI-5 | PEA (0.01) | W-4 (0.01) | A1/A3 (60/40) | 48 | 0.5 |
| Comp. Ex. | | | | | | | | |
| si 1 | PAG-A (0.6) | — | SI-1 | DIA (0.03) | W-4 (0.01) | A1 (100) | 65 | 0.2 |
| si 2 | PAG-B (0.6) | — | SI-1 | DIA (0.03) | W-4 (0.01) | A1 (100) | 46 | 0.2 |
| si 3 | PAG-C (0.6) | — | SI-1 | DIA (0.03) | W-4 (0.01) | A1 (100) | 60 | 0.2 |

It can be seen from the results shown in Table 2 that the photosensitive compositions in the invention are also excellent in resolution and DOF even when used as a two-layer resist.

Examples KrP-1 to KrP-10 & Comparative Examples krp-1 to krp-3

Preparation of Resist:

The components shown in Table 4 below were dissolved in a solvent and filtered through a polytetrafluoroethylene filter having a pore diameter of 0.1 μm to prepare a positive resist solution having solids concentration of 14 mass %.

Each of the prepared positive resist solutions was evaluated in the following manner. The results of evaluation are shown in Table 4.

The molar ratios and the weight average molecular weights of Resins (R-2) to (R-27) in Table 4 are shown in Table 3 below. The constitutions of repeating units of Resins (R-2) to (R-27) are the same as described above.

TABLE 3

| Resin | Repeating Unit in Molar ratio (corresponding from the left in the order) | Weight Average Molecular Weight |
|---|---|---|
| R-2 | 60/40 | 12,000 |
| R-7 | 60/30/10 | 18,000 |
| R-8 | 60/20/20 | 12,000 |
| R-9 | 10/50/40 | 13,000 |
| R-14 | 75/25 | 12,000 |
| R-17 | 10/70/20 | 15,000 |
| R-19 | 10/70/20 | 11,000 |
| R-22 | 70/30 | 12,000 |
| R-23 | 10/60/30 | 8,000 |
| R-24 | 50/20/30 | 16,000 |
| R-25 | 10/70/20 | 13,000 |
| R-27 | 70/10/20 | 12,000 |

Evaluation of Resist:

The prepared positive resist solution was uniformly coated with a spin coater on a silicone substrate treated with hexamethyldisilazane, and then dried on a hot plate at 120° C. for 90 seconds to form a resist film having a thickness of 0.4 μm.

The resist film was subjected to pattern exposure through a mask for line and space with a KrF excimer laser stepper (NA=0.63), and the exposed resist film was heated on a hot plate at 110° C. for 90 seconds immediately after exposure. Further, the resist film was subjected to development with a 2.38 mass % tetramethylammonium hydroxide aqueous solution at 23° C. for 60 seconds, rinsing with pure water for 30 seconds, and then drying, whereby a line and space pattern was obtained.

Sensitivity:

The exposure amount required to reproduce a mask pattern of line and space of 1/1 of a line width 150 nm was observed.

Defocus Latitude (DOF):

The width of the depth of focus to reproduce a line width of 150 nm±10% at an optimal exposure amount was observed.

TABLE 4

| | Composition | | | | | | Evaluation | |
|---|---|---|---|---|---|---|---|---|
| | Acid Generator (A) (g) | Acid Generator Used in Combination (g) | Resin (B) (g) | Basic Compound (g) | Surfactant (g) | Solvent (mass ratio) | Sensitivity (mJ/cm$^2$) | DOF (μm) |
| Ex. 1 | | | | | | | | |
| Krp-1 | I-21 (0.3) | — | R-7 (10) | TPI (0.03) | W-4 (0.01) | A-1/B-1 (70/30) | 45 | 0.5 |
| Krp-2 | I-11 (0.4) | z31 (0.4) | R-8 (10) | TPA (0.03) | W-2 (0.02) | A-1/A-3 (40/60) | 46 | 0.5 |
| Krp-3 | I-4 (0.2) | z60 (0.2) | R-9 (10) | HAP (0.02) | W-1 (0.01) | A-1/B-1 (50/50) | 47 | 0.5 |
| Krp-4 | I-8 (0.3) | z57 (0.1) | R-14 (10) | DCMA (0.03) | W-4 (0.01) | A-1/B-1 (60/40) | 52 | 0.5 |
| Krp-5 | I-1 (0.4) | z12 (0.05) | R-17 (10) | PEA (0.01) | W-4 (0.01) | A-1/B-1 (60/40) | 47 | 0.5 |
| Krp-6 | I-1 (0.1) I-26 (0.2) | z4 (0.1) | R-19 (5) R-27 (5) | DIA (0.02) PEA (0.02) | W-4 (0.01) | A-1/A-3 (60/40) | 50 | 0.6 |
| Krp-7 | I-42 (0.3) | z40 (0.1) | R-23 (10) | TMEA (0.03) | W-3 (0.03) | A-1/B-2 (80/20) | 45 | 0.5 |
| Krp-8 | I-42 (0.3) | z31 (0.3) | R-24 (10) | TBAH (0.04) | W-1 (0.01) | A-2/B-1 (80/20) | 40 | 0.5 |
| Krp-9 | I-30 (0.5) | z32 (0.3) | R-25 (5) R-2 (5) | HEP (0.03) | W-3 (0.02) | A-3/B-1 (70/30) | 47 | 0.6 |
| Krp-10 | I-1 (0.3) | z55 (0.1) | R-27 (5) R-22 (5) | TPSA (0.05) | W-3 (0.01) | A-1/A-3 (60/40) | 42 | 0.6 |
| Comp. Ex. | | | | | | | | |
| krp-1 | PAG-A (0.3) | — | R-7 (10) | TPI (0.03) | W-4 (0.01) | A-1/B-1 (70/30) | 71 | 0.3 |
| krp-2 | PAG-B (0.3) | — | R-7 (10) | TPI (0.03) | W-4 (0.01) | A-1/B-1 (70/30) | 49 | 0.3 |
| krp-3 | PAG-C (0.3) | — | R-7 (10) | TPI (0.03) | W-4 (0.01) | A-1/B-1 (70/30) | 68 | 0.3 |

It can be seen from the results shown in Table 4 that the photosensitive compositions in the invention are also excellent in resolution and DOF even as the positive resist compositions in KrF excimer laser exposure.

Examples KrN-1 to KrN-10 and Comparative Example krn-1

Preparation of Resist:

The components shown in Table 5 below were dissolved in a solvent and filtered through a polytetrafluoroethylene filter having a pore diameter of 0.1 μm to prepare a negative resist solution having solids concentration of 14 mass %.

Each of the negative resist solutions was evaluated in the same manner as in Examples KrP-1 to KrP-10 and Comparative Examples krp-1 to krp-3. The results obtained are shown in Table 5.

The structures, the molecular weights and the molecular weight distributions of the alkali-soluble resins in Table 5 are shown below.

| | | Mw | Mw/Mn |
|---|---|---|---|
| P-1 | (structure shown) | 17000 | 2.15 |
| P-2 | (structure shown) | 16000 | 2.30 |
| P-3 | (structure shown) | 19000 | 2.2 |
| P-4 | (structure shown) | 12000 | 1.2 |
| P-5 | (structure shown) | 21000 | 2.1 |

-continued
| | Mw | Mw/Mn |
|---|---|---|
| P-6 | 6000 | 1.2 |
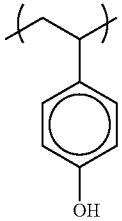
VP-5000 manufactured by Nippon Soda Co., Ltd.
The structures of crosslinking agents in Table 5 are shown below.
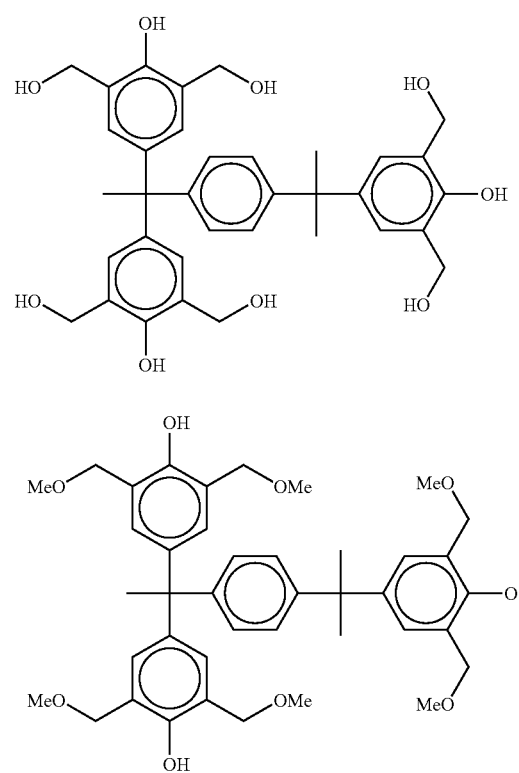
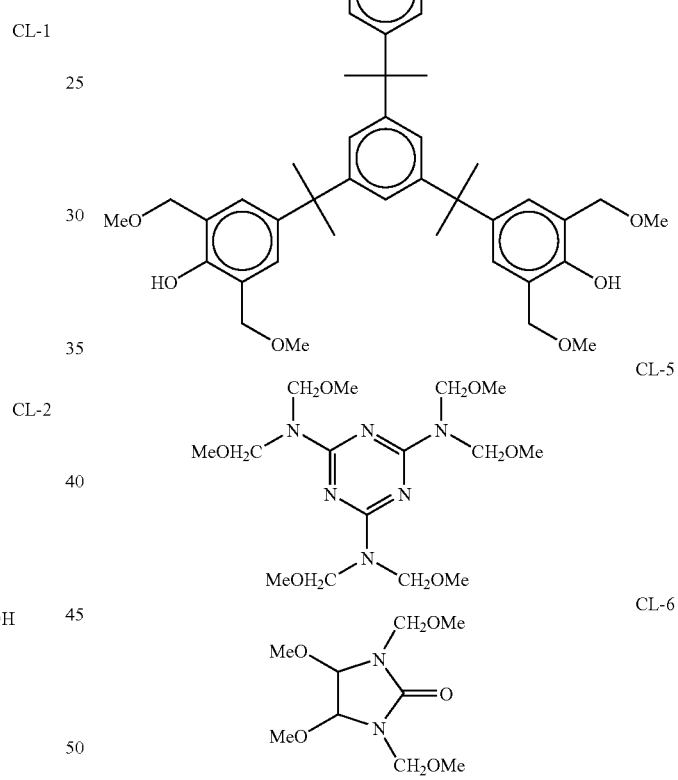
TABLE 5
| | Composition | | | | | | | Evaluation | |
|---|---|---|---|---|---|---|---|---|---|
| | Acid Generator | | | | | | | | |
| | Acid Generator (A) (g) | Used in Combination (g) | Resin (10 g) | Crosslinking Agent (g) | Basic Compound (g) | Surfactant (g) | Solvent (mass ratio) | Resolution (nm) | DOF (μm) |
| Ex. | | | | | | | | | |
| KrN-1 | I-1 (0.3) | — | P-1 | CL-1 (2) | TPI (0.03) | W-4 (0.01) | A-1/B-1 (70/30) | 125 | 0.6 |
| KrN-2 | I-1 (0.4) | z31 (0.4) | P-2 | CL-2 (3) | TPA (0.03) | W-2 (0.02) | A-1/A-3 (40/60) | 125 | 0.5 |

TABLE 5-continued

| | Composition | | | | | | | Evaluation | |
|---|---|---|---|---|---|---|---|---|---|
| | Acid Generator | | | | | | | | |
| | Acid Generator (A) (g) | Used in Combination (g) | Resin (10 g) | Crosslinking Agent (g) | Basic Compound (g) | Surfactant (g) | Solvent (mass ratio) | Resolution (nm) | DOF (μm) |
| KrN-3 | I-4 (0.2) | z6 (0.2) | P-3 | CL-3 (5) | HAP (0.02) | W-1 (0.01) | A-1/B-1 (50/50) | 120 | 0.6 |
| KrN-4 | I-8 (0.3) | z57 (0.1) | P-4 | CL-4 (3) | DCMA (0.03) | W-4 (0.01) | A-1/B-1 (60/40) | 125 | 0.5 |
| KrN-5 | I-1 (0.4) | z12 (0.05) | P-5 | CL-4 (5) | PEA (0.01) | W-4 (0.01) | A-1/B-1 (60/40) | 125 | 0.5 |
| KrN-6 | I-1 (0.01) I-26 (0.2) | z4 (0.1) | P-2 (5 g) P-6 (5 g) | CL-1 (2) CL-5 (2) | DIA (0.02) PEA (0.02) | W-4 (0.01) | A-1/A-3 (60/40) | 120 | 0.5 |
| KrN-7 | I-42 (0.3) | z40 (0.1) | P-1 | CL-6 (3) | TMEA (0.03) | W-3 (0.03) | A-1/B-2 (80/20) | 125 | 0.6 |
| KrN-8 | I-95 (0.3) | z31 (0.3) | P-6 | CL-1 (3) | TBAH (0.04) | W-1 (0.005) | A-2/B-1 (80/20) | 120 | 0.5 |
| KrN-9 | I-30 (0.5) | z32 (0.3) | P-3 | CL-2 (3) | HEP (0.03) | W-3 (0.02) | A-3/B-1 (70/30) | 120 | 0.6 |
| KrN-10 | I-11 (0.3) | z55 (0.1) | P-4 | CL-4 (2) | TPSA (0.05) | W-3 (0.01) | A-1/A-3 (60/40) | 125 | 0.6 |
| Comp. Ex. | | | | | | | | | |
| krn-1 | PAG-A (0.3) | — | P-1 | CL-1 (2) | TPI (0.03) | W-4 (0.01) | A-1/B-1 (70/30) | 130 | 0.3 |

It can be seen from the results shown in Table 5 that the photosensitive compositions in the invention are also excellent in resolution and DOF even as the negative resist compositions in KrF excimer laser exposure.

Examples EBP-1 to EBP-10 & Comparative Examples ebp-1 to ebp-3

Preparation of Resist:

The components shown in Table 4 were dissolved in a solvent and filtered through a polytetrafluoroethylene filter having a pore diameter of 0.1 μm to prepare a positive resist solution having solids concentration of 12 mass %.

Each of the positive resist solutions was evaluated in the following method. The results obtained are shown in Table 6 below.

Evaluation of Resist:

The prepared positive resist solution was uniformly coated with a spin coater on a silicone substrate treated with hexamethyldisilazane, and then dried on a hot plate at 120° C. for 60 seconds to form a resist film having a thickness of 0.3 μm.

The resist film was irradiated with an electron beam projection lithography apparatus (accelerating voltage: 100 KeV, manufactured by Nikon Corporation), and the exposed resist film was heated on a hot plate at 110° C. for 90 seconds immediately after irradiation. Further, the resist film was subjected to development with a 2.38 mass % tetramethylammonium hydroxide aqueous solution at 23° C. for 60 seconds, rinsing with pure water for 30 seconds, and then drying, whereby a contact hole pattern was obtained.

Resolution:

With the exposure amount to reproduce a mask pattern of line and space of 1/1 of line width 100 nm being an optimal exposure amount, the critical resolution at the optimal exposure amount was measured.

TABLE 6

| Example | Sensitivity (μC/cm²) | Outgas (decrease in thickness) |
|---|---|---|
| EBP-1 | 12 | 99 |
| EBP-2 | 15 | 98 |
| EBP-3 | 13 | 98 |
| EBP-4 | 12 | 99 |
| EBP-5 | 12 | 98 |
| EBP-6 | 13 | 98 |
| EBP-7 | 12 | 98 |
| EBP-8 | 13 | 99 |
| EBP-9 | 15 | 98 |
| EBP-10 | 16 | 98 |
| Comparative Example 1 ebp-1 | 24 | 95 |
| Comparative Example 2 ebp-2 | 31 | 94 |
| Comparative Example 3 ebp-3 | 30 | 94 |

It can be seen from the results shown in Table 6 that the photosensitive compositions in the invention are excellent in sensitivity and low outgas as positive resist compositions in electron beam irradiation.

Examples EBN-1 to EBN-10 & Comparative Examples ebn-1 to ebn-3

Preparation of Resist:

The components shown in Table 5 were dissolved in a solvent and filtered through a polytetrafluoroethylene filter having a pore diameter of 0.1 μm to prepare a negative resist solution having solids concentration of 12 mass %.

Each of the negative resist solutions was evaluated in the following method. The results obtained are shown in Table 7 below.

Evaluation of Resist:

The prepared negative resist solution was uniformly coated with a spin coater on a silicone substrate treated with hexamethyldisilazane, and then dried on a hot plate at 120° C. for 60 seconds to form a resist film having a thickness of 0.3 μm.

The resist film was irradiated with an electron beam projection lithography apparatus (accelerating voltage: 100 KeV, manufactured by Nikon Corporation), and the exposed resist film was heated on a hot plate at 110° C. for 90 seconds immediately after irradiation. Further, the resist film was subjected to development with a 2.38 mass % tetramethylammonium hydroxide aqueous solution at 23° C. for 60 seconds, rinsing with pure water for 30 seconds, and then drying, whereby a line and space pattern was obtained.

Resolution:

With the exposure amount to reproduce a mask pattern of line and space of 1/1 of line width 100 nm being an optimal exposure amount, the critical resolution at the optimal exposure amount was measured.

TABLE 7

| Example | Sensitivity ($\mu C/cm^2$) | Outgas (decrease in thickness) |
|---|---|---|
| EBN-1 | 13 | 98 |
| EBN-2 | 16 | 97 |
| EBN-3 | 12 | 98 |
| EBN-4 | 13 | 97 |
| EBN-5 | 15 | 98 |
| EBN-6 | 13 | 97 |
| EBN-7 | 15 | 98 |
| EBN-8 | 13 | 98 |
| EBN-9 | 15 | 98 |
| EBN-10 | 16 | 98 |
| Comparative Example 1 ebn-1 | 26 | 94 |
| Comparative Example 2 ebn-2 | 18 | 93 |
| Comparative Example 3 ebn-3 | 25 | 94 |

It can be seen from the results shown in Table 7 that the photosensitive compositions in the invention are also excellent in sensitivity and low outgas as negative resist compositions in electron beam irradiation.

Evaluation by EUV Exposure:

Examples 21 and 22 and Comparative Example 2

Each resist film was obtained in the same manner as in Example 1 using each resist composition in Examples 1 and 2 and Comparative Example 1, except for changing each resist thickness to 0.25 μm. The obtained resist film was subjected to areal exposure with EUV ray (wavelength: 13 nm) with varying exposure amount 0.5 by 0.5 mJ within the range of exposure amount of from 0 to 5.0 mJ, and the resist film was further baked at 110° C. for 90 seconds. After that, a dissolving rate at each exposure amount was measured with a 2.38% tetramethyl-ammonium hydroxide (TMAH) aqueous solution, and a sensitivity curve was obtained. In the sensitivity curve, the exposure amount at the time when the dissolving rate of the resist was saturated was taken as sensitivity, and dissolving contrast (γ value) was computed from the gradient of the straight line part of the sensitivity curve. The greater the γ value, the better is the dissolving contrast.

The results obtained are shown in Table 8 below.

TABLE 8

| Example No. | Sensitivity ($mJ/cm^2$) | γ Value |
|---|---|---|
| Example 21 | 2.0 | 10.0 |
| Example 22 | 2.0 | 10.5 |
| Comparative Example 2 | 2.5 | 8.0 |

It can be seen from the results shown in Table 8 that the positive resist compositions in the invention are high sensitivity and high contrast in the characteristic evaluation by EUV ray irradiation, so that excellent as compared with the composition in Comparative Example.

Evaluation by EUV Exposure:

Examples 21 and 22 and Comparative Example 2

Each resist film was obtained in the same manner as in Example 1 using each resist composition in Examples 1 and 2 and Comparative Example 1, except for changing each resist thickness to 0.25 μm. The obtained resist film was subjected to areal exposure with EUV ray (wavelength: 13 nm) with varying exposure amount by 0.5 by 0.5 mJ within the range of exposure amount of from 0 to 5.0 mJ, and the resist film was further baked at 110° C. for 90 seconds. After that, a dissolving rate at each exposure amount was measured with a 2.38% tetramethyl-ammonium hydroxide (TMAH) aqueous solution, and a sensitivity curve was obtained. In the sensitivity curve, the exposure amount at the time when the dissolving rate of the resist was saturated was taken as sensitivity, and dissolving contrast (γ value) was computed from the gradient of the straight line part of the sensitivity curve. The greater the γ value, the better is the dissolving contrast.

The results obtained are shown in Table 9 below.

TABLE 9

| Example No. | Sensitivity ($mJ/cm^2$) | γ Value |
|---|---|---|
| Example 21 | 2.0 | 10.0 |
| Example 22 | 2.0 | 10.5 |
| Comparative Example 2 | 2.5 | 8.0 |

It can be seen from the results shown in Table 9 that the positive resist compositions in the invention are high sensitivity and high contrast in the characteristic evaluation by EUV ray irradiation, so that excellent as compared with the composition in Comparative Example.

This application is based on Japanese patent application JP 2005-075494, filed on Mar. 16, 2005, the entire content of which is hereby incorporated by reference, the same as if set forth at length.

What is claimed is:

1. A photosensitive composition comprising:
(A) a compound represented by the following formula (I):

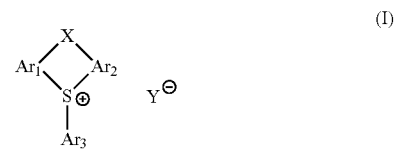

wherein
Ar$_1$ and Ar$_2$ each independently represents a benzene ring, and
Ar$_3$ is an optionally substituted benzene ring, wherein the substituent is selected from the group consisting of a straight chain, branched or cyclic alkyl group having from 1 to 6 carbon atoms, an alkoxy group having from 1 to 6 carbon atoms, an acyl group having from 1 to 6 carbon atoms, a cyano group, a nitro group, a halogen group, a -Q-SO$_2$Ra group and a -Q-CORb group, and wherein at least one of Ar$_1$ to Ar$_3$ has a -Q-SO$_2$Ra group or a -Q-CORb group as a substituent; Ra and Rb each independently represents an alkyl group or an aryl group; Q represents an oxygen atom or —N(Ry)-; Ry represents a hydrogen atom, an alkyl group, or a cycloalkyl group; X represents a single bond or a divalent linking group; and Y represents a sulfonate anion, a bis(alkylsulfonyl)-amide anion, or a tris(alkylsulfonyl) methide anion; and, (B) a resin capable of decomposing by the action of an acid to increase the solubility in an alkali developer.

2. A photosensitive composition as claimed in claim 1, wherein Ar$_3$ in formula (I) represents a benzene ring having at least one of a -Q-SO$_2$Ra group and a -Q-CORb group as a substituent.

3. The photosensitive composition as claimed in claim 1, wherein the resin (B) has a hydroxystyrene structural unit.

4. The photosensitive composition as claimed in claim 1, wherein the resin (B) contains a repeating unit having a monocyclic or polycyclic hydrocarbon structure.

5. The photosensitive composition as claimed in claim 1, wherein the resin (B) contains a repeating unit having an alcoholic hydroxyl group.

6. The photosensitive composition as claimed in claim 5, wherein the repeating unit having an alcoholic hydroxyl group is a repeating unit having at least one structure selected from the group consisting of a monohydroxy-adamantane structure, a dihydroxyadamantane structure, and a trihydroxyadamantane structure.

7. The photosensitive composition as claimed in claim 1, wherein the resin (B) contains a repeating unit having a lactone structure.

8. The photosensitive composition as claimed in claim 1, wherein the resin (B) contains at least one methacrylate repeating unit and at least one acrylate repeating unit.

9. The photosensitive composition as claimed in claim 1, which further comprises at least one of (F) a basic compound and (G) a surfactant, wherein (G) is a fluorine surfactant or a silicon surfactant.

10. The photosensitive composition as claimed in claim 1, wherein the resin (B) contains: at least one repeating unit selected from 2-alkyl-2-adamantyl(meth)acrylate and dialkyl (1-adamantyl)methyl(meth)acrylate, wherein the alkyl group is a straight chain or branched alkyl group having from 1 to 4 carbon atoms; at least one repeating unit having a lactone structure; and at least one repeating unit having two or more hydroxyl groups.

11. The photosensitive composition as claimed in claim 10, wherein the resin (B) further contains a repeating unit having a carboxyl group.

12. The photosensitive composition as claimed in claim 1, wherein the resin (B) contains: at least one repeating unit selected from 2-alkyl-2-adamantyl(meth)acrylate and dialkyl (1-adamantyl)methyl (meth)acrylate; and at least one repeating unit having a hydroxystyrene structure.

13. A pattern-forming method comprising: forming a photosensitive film with the photosensitive composition as claimed in claim 1; and exposing and developing the photosensitive film.

14. A photosensitive composition comprising:
(A) a compound represented by the following formula (I):

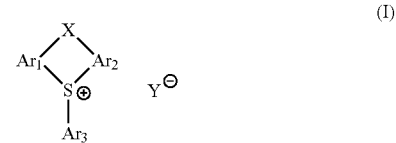

wherein
Ar$_1$ and Ar$_2$ each independently represents an aromatic ring having from 6 to 20 carbon atoms, and
Ar$_3$ is an optionally substituted benzene ring, wherein the substituent is selected from the group consisting of a straight chain, branched or cyclic alkyl group having from 1 to 6 carbon atoms, an alkoxy group having from 1 to 6 carbon atoms, an acyl group having from 1 to 6 carbon atoms, a cyano group, a nitro group, a halogen group, a -Q-SO$_2$Ra group and a -Q-CORb group, and
wherein at least one of Ar$_1$ to Ar$_3$ has a -Q-SO$_2$Ra group or a -Q-CORb group as a substituent; Ra and Rb each independently represents an alkyl group or an aryl group; Q represents an oxygen atom or —N(Ry)-; Ry represents a hydrogen atom, an alkyl group, or a cycloalkyl group; X represents a single bond or a divalent linking group; and Y represents a sulfonate anion, a carboxylate anion, a bis(alkylsulfonyl)-amide anion, or a tris(alkylsulfonyl) methide anion;
(D) a resin soluble in an alkali developer; and
(E) an acid crosslinking agent capable of crosslinking with the resin soluble in an alkali developer by the action of an acid.

15. The photosensitive composition as claimed in claim 14, which further comprises at least one of (F) a basic compound and (G) a surfactant, wherein (G) is a fluorine surfactant or a silicon surfactant.

* * * * *